US011328996B2

(12) United States Patent
Strong et al.

(10) Patent No.: US 11,328,996 B2
(45) Date of Patent: May 10, 2022

(54) ZERO-MISALIGNMENT TWO-VIA STRUCTURES USING PHOTOIMAGEABLE DIELECTRIC FILM BUILDUP FILM, AND TRANSPARENT SUBSTRATE WITH ELECTROLESS PLATING

(71) Applicant: Intel Corporation, Santa Clara, CA (US)

(72) Inventors: Veronica Strong, Chandler, AZ (US); Aleksandar Aleksov, Chandler, AZ (US); Brandon Rawlings, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/648,640

(22) PCT Filed: Dec. 30, 2017

(86) PCT No.: PCT/US2017/069155
§ 371 (c)(1),
(2) Date: Mar. 18, 2020

(87) PCT Pub. No.: WO2019/133017
PCT Pub. Date: Jul. 4, 2019

(65) Prior Publication Data
US 2020/0219814 A1      Jul. 9, 2020

(51) Int. Cl.
*H01L 23/538*   (2006.01)
*H01L 23/522*   (2006.01)
*H01L 23/00*    (2006.01)

(52) U.S. Cl.
CPC ...... *H01L 23/5384* (2013.01); *H01L 23/5226* (2013.01); *H01L 23/5383* (2013.01); *H01L 23/5386* (2013.01); *H01L 24/14* (2013.01)

(58) Field of Classification Search
CPC ............. H01L 23/5384; H01L 23/5226; H01L 23/5283; H01L 23/5386; H01L 23/552;
(Continued)

(56) References Cited

U.S. PATENT DOCUMENTS 6,455,408 B1 * 9/2002 Hwang .................. H01L 24/11
438/613
7,727,888 B2 * 6/2010 Yang .................. H01L 21/76855
438/665
(Continued)

FOREIGN PATENT DOCUMENTS

EP          1871153         12/2007

OTHER PUBLICATIONS

International Search Report and Written Opinion for International Patent Application No. PCT/US2017/069155, dated Jul. 9, 2020, 11 pgs.

(Continued)

*Primary Examiner* — Dao H Nguyen
(74) *Attorney, Agent, or Firm* — Schwabe, Williamson & Wyatt, P.C.

(57) ABSTRACT

A device package and method of forming the device package are described. The device package includes a dielectric on a conductive pad, a first via on a top surface of conductive pad, where the first via extends through dielectric, and a conductive trace on dielectric. The device package has a second via on dielectric, where the conductive trace connects to first and second vias, and the second via connects to an edge of conductive trace opposite from first via. The device package may have a seed on dielectric, where the seed electrically couples to conductive trace, a first seed on the top surface of conductive pad, where the first via is on first seed, and a second seed on a top surface of first via, the second seed on surfaces of second via, where the conductive (Continued)

trace is on second seed disposed on both first and second vias.

22 Claims, 24 Drawing Sheets

(58) Field of Classification Search
CPC .............. H01L 24/14; H01L 2224/1403; H01L 2224/16225; H01L 21/4857; H01L 21/6835
USPC .......... 257/774, 737, 738, 773, 781, E23.01, 257/E23.012, E23.019, E23.02, E23.021, 257/E23.145, E21.506, E21.508, E21.575, 257/E21.582, E21.585; 438/613, 619, 438/598, 612, 614, 627
See application file for complete search history.

(56) References Cited

U.S. PATENT DOCUMENTS

| | | | |
|---|---|---|---|
| 8,324,738 B2* | 12/2012 | Liu | H01L 23/53238 257/781 |
| 8,377,816 B2* | 2/2013 | Liu | H01L 23/3171 438/613 |
| 9,576,921 B2* | 2/2017 | Yajima | H01L 24/03 |
| 10,541,199 B2* | 1/2020 | Yang | H01L 21/7684 |
| 10,777,452 B2* | 9/2020 | Ho | H01L 21/76831 |
| 10,867,923 B2* | 12/2020 | Ahn | H01L 23/5329 |
| 2003/0032276 A1 | 2/2003 | Kim | |
| 2003/0160331 A1* | 8/2003 | Fujisawa | H01L 21/76868 257/774 |
| 2006/0214293 A1* | 9/2006 | Park | H01L 23/3114 257/737 |
| 2008/0044999 A1* | 2/2008 | Dubin | H01L 21/7682 438/619 |
| 2008/0099928 A1 | 5/2008 | Lee et al. | |
| 2010/0210103 A1* | 8/2010 | Sameshima | H01L 23/525 438/637 |
| 2010/0258545 A1 | 10/2010 | Oh et al. | |
| 2012/0235278 A1* | 9/2012 | Shigihara | H01L 24/05 257/532 |
| 2016/0118335 A1* | 4/2016 | Lee | H01L 21/76831 257/774 |
| 2017/0278722 A1 | 9/2017 | Akiba et al. | |
| 2017/0280568 A1 | 9/2017 | Rawlings et al. | |

OTHER PUBLICATIONS

International Search Report and Written Opinion for International Patent Application No. PCT/US2017/069155 dated Sep. 28, 2018, 14 pgs.
Search Report and Written Opinion for European Patent Application No. 17936723.0, dated Jul. 15, 2021, 11 pgs.
Conaghan B F et al: "The history of permanent photoimageable materials in electronic packaging", CIRCUITREE, CIRCUITREE Pub., Santa Clara, CA, US, vol. 10, No. 3, Feb. 28, 1997 (Feb. 28, 1997), pp. 140-146, XP009523924, ISSN: 1059-843X.

* cited by examiner

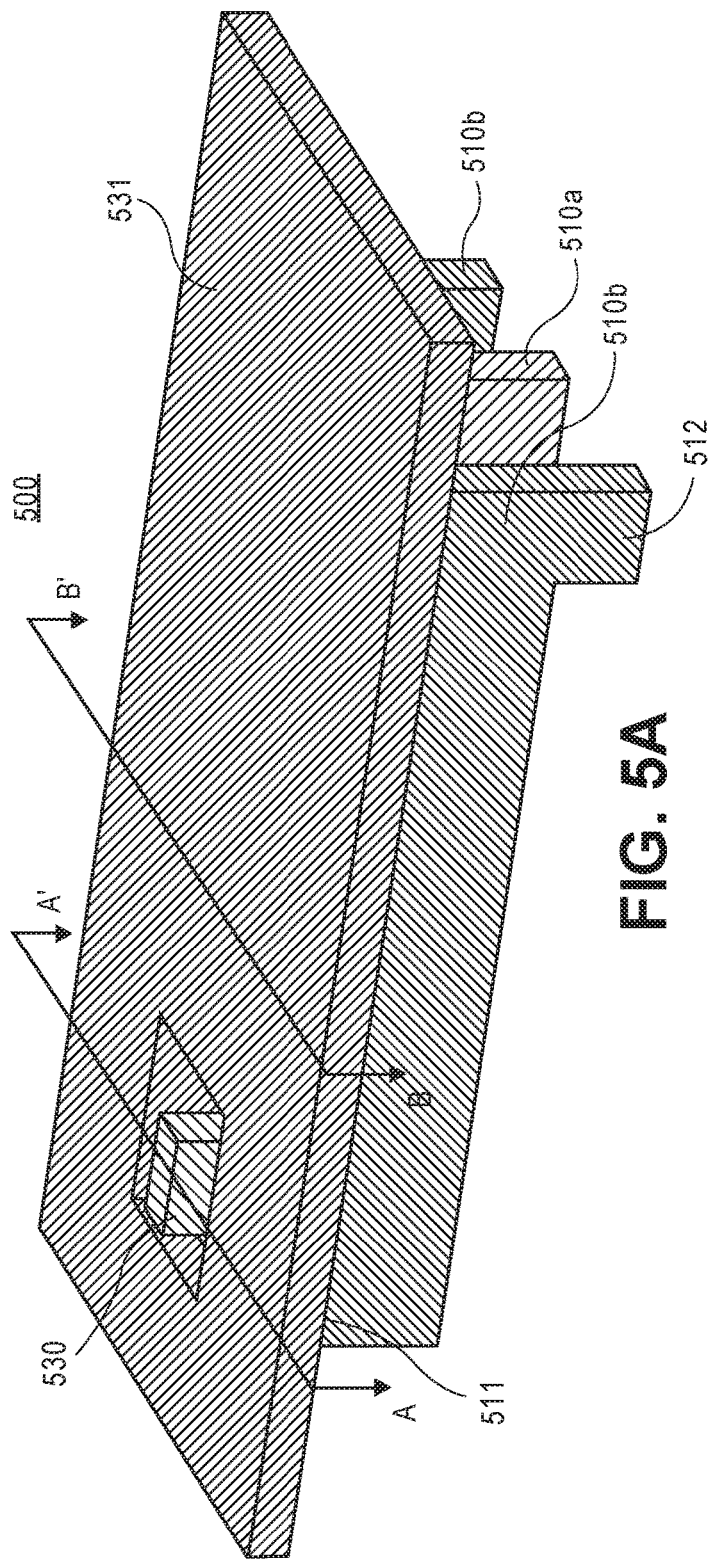
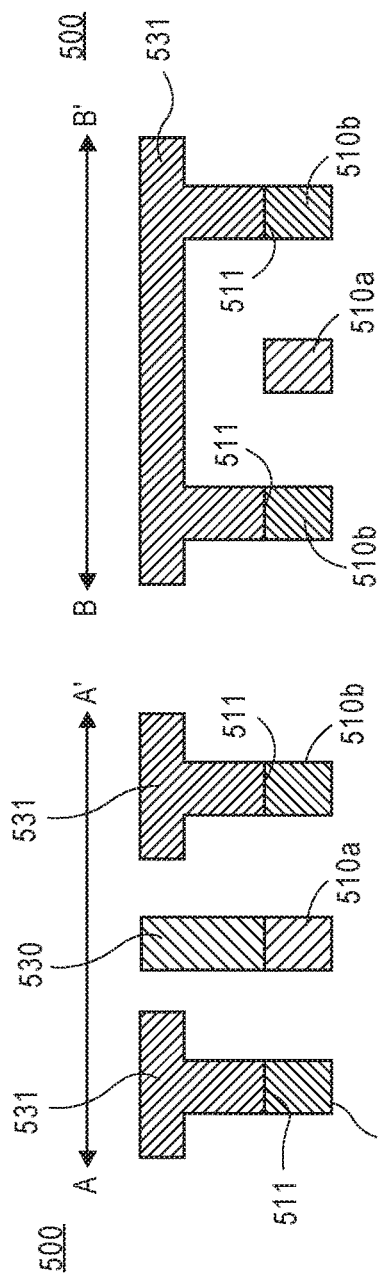
FIG. 5A
FIG. 5B
FIG. 5C

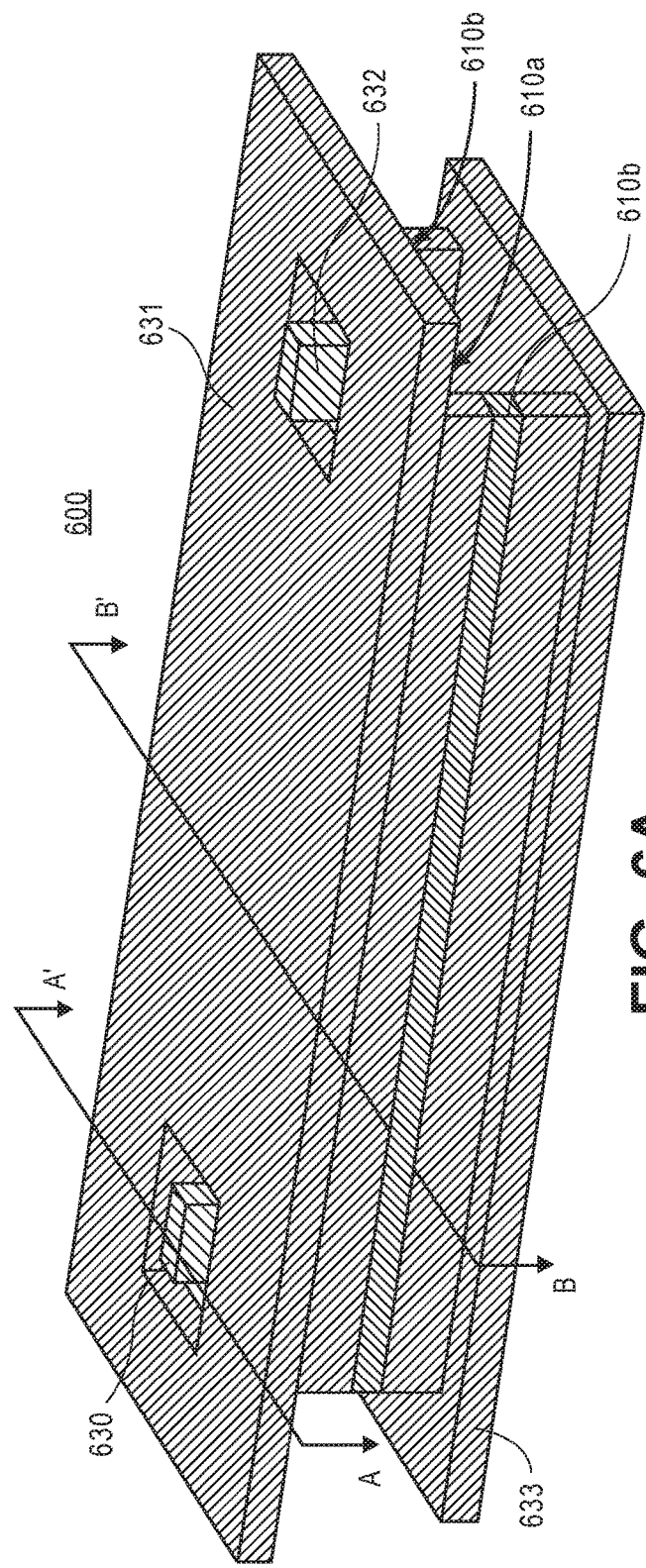
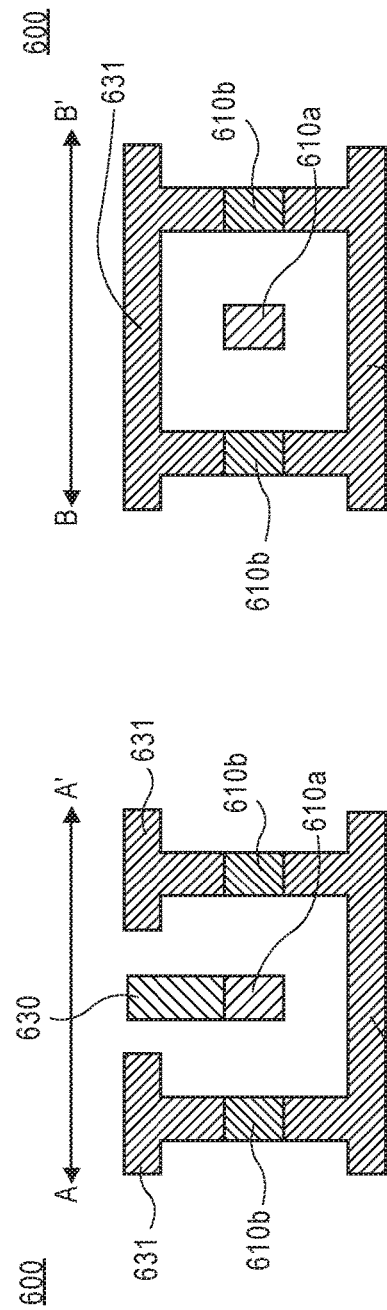
FIG. 6A
FIG. 6B
FIG. 6C

ZERO-MISALIGNMENT TWO-VIA STRUCTURES USING PHOTOIMAGEABLE DIELECTRIC FILM BUILDUP FILM, AND TRANSPARENT SUBSTRATE WITH ELECTROLESS PLATING

CROSS-REFERENCE TO RELATED APPLICATION

This patent application is a U.S. National Phase Application under 35 U.S.C. § 371 of International Application No. PCT/US2017/069155, filed Dec. 30, 2017, entitled "ZERO-MISALIGNMENT TWO-VIA STRUCTURES USING PHOTOIMAGEABLE DIELECTRIC FILM BUILDUP FILM, AND TRANSPARENT SUBSTRATE WITH ELECTROLESS PLATING," which designates the United States of America, the entire disclosure of which is hereby incorporated by reference in its entirety and for all purposes.

FIELD

Embodiments relate to semiconductor devices. More particularly, the embodiments relate to packaging semiconductor devices with that include zero-misalignment two via structures.

BACKGROUND

One of the main drivers for packaging semiconductor devices and package design rules is the maximum 1D linear number density of routing traces per mm per layer. Limitations to routing traces/mm/layer are derived from process limitations during substrate manufacturing, and typically vary by process. As such, a key set of process limitations directly stem from the ability to align the features in a given layer to the vertical interconnects, which connect that layer to the layers above and below it.

Package layers and the vertical interconnects coupled with them are fabricated on a substrate in a serial fashion, with common sets of fiducials included within the layers. Fiducials are used to measure overlay and misalignment between process steps. Errors in fiducial fabrication translate to misalignment, as do errors in reading fiducials. Even when fiducials are fabricated and read precisely, inherent tool overlay errors results in additional misalignment. Finally, deformation of the substrate introduces locally variable misalignment and global distortion that cannot be corrected. This distortion and misalignment varies with substrate materials and with process parameters such as applied stress and temperature-gradient induced stress. These factors add up to limit the misalignment of routing lines to the vertical interconnects that intersect them.

For example, in order to allow for misalignment between layers and vertical interconnects that connect them, critical dimensions must be enlarged in the routing layer to allow for misalignment error. Unfortunately, enlarging critical dimension will significantly limit the design rules for package design. Since so many of the misalignment drivers are process specific, design rules must be either overly conservative to allow for process variation or else require more design resources to optimize around variable design rules.

Recently, there have been three main solutions which have attempted to overcome these limitations and problems—only to have their own drawbacks. First, improvements have been made to lithography (litho) and laser patterning overlay capability. Many of these solutions result in increased capital equipment costs or reduced throughput. For instance, locally aligned lithography exposures come with an inherently lower throughput, mainly due to the time needed to align to more fiducials and to move between fields. Second, interposers and bridge are fabricated and assembled to the substrate, but these are not always cost-effective due to the cost of fabricating and testing the interposers or bridges and due to the additional assembly costs. Thirdly, routing layers are fabricated on silicon or glass carriers such that the substrate is stabilized dimensionally. This is cost-effective only for a subset of package sizes.

One of the packaging solutions is lithographically defined vias on a pad. In this case, the line density may be significantly reduced by the presence of a pad that must accommodate a via as well as account for the misalignment associated with via lithography on the pad. Another packaging solution is typically referred to as self-aligned via (SAV) technology. The SAV approach is generally applied when lithography capability limits the minimum space between traces to values that are at or slightly above twice the misalignment capability of the exposure tool. Lastly, there is also a misalignment-via approach (or a zero-misalignment via (ZMV)) that schematically resembles SAV, but due to a different manufacturing process, the space between traces is only limited by the exposure tool resolution capability.

The misalignment-via approach maximizes trace density in all cases for any exposure tool, while SAV can get close to the maximum for specific cases and design rules. These solutions, however, have their own problems and drawback. For example, with the misalignment-via and SAV approaches, the main problems is that a trace can be connected to self-aligned or zero-misaligned vias only in one direction (either above or below the trace). However, this leads to a major problem in package design rules, which may require a connection to both a top layer and bottom layer without reducing the trace density (i.e., this is referred to as a two-via structure). In these cases, the misalignment-via and SAV approaches cannot help and end up as the vias on the pad approach that is fully or in part dependent on the design.

BRIEF DESCRIPTION OF THE DRAWINGS

Embodiments described herein are illustrated by way of example and not limitation in the figures of the accompanying drawings, in which like references indicate similar features. Furthermore, some conventional details have been omitted so as not to obscure from the inventive concepts described herein.

FIG. 5A is a perspective view of one or more conductive traces with zero-misaligned vias, according to one embodiment. FIGS. 5B and 5C are corresponding cross-sectional views of one or more conductive traces with zero-misaligned vias, according to some embodiments.

FIG. 6A is a perspective view of one or more conductive traces with zero-misaligned vias, according to one embodiment. FIGS. 6B and 6C are corresponding cross-sectional views of one or more conductive traces with zero-misaligned vias, according to some embodiments.

DETAILED DESCRIPTION

Figure 1:
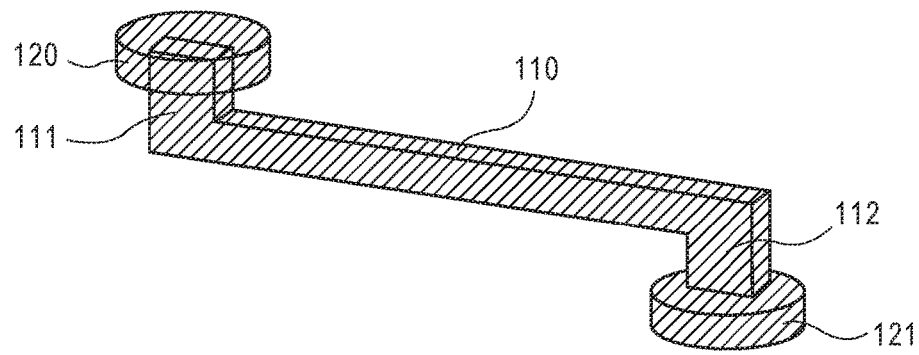
FIG. 1 is a perspective view of a conductive trace with zero-misaligned vias, according to one embodiment.

Described herein are systems that include zero-misalignment two-via stack (ZM2VS) for various signal routing application. In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

One of the main drivers for package design rules is the input/output (I/O) linear number density per mm per layer (IO/mm/layer). The I/O density may be limited by process limitations during substrate manufacturing, for example, directly stemming from the ability to align the features in a given layer to the vertical interconnects, which connect that layer to a top layer and a bottom layer. As described above, ZMV maximizes trace density in all cases for any exposure tool, while SAV can get close to the maximum for specific cases and design rules. However, the drawback with ZMV and SAV approaches is that a trace can be connected to self-aligned or zero-misaligned vias only in one direction (either above or below the trace), hindering the connection to both layers on the top and bottom without reducing the trace density.

Accordingly, embodiments described herein improve and address the above limitations by designing, utilizing, and fabricating one or more processes that form a zero-misalignment two-via stack (hereinafter referred to as ZM2VS, with the processes referred to as ZM2VS processes). These embodiments not only address the above limitations encountered by ZMV and SAV approaches, but also enable multiple applications that maximize line densities for one or more given set of design rules. In addition, embodiments of the ZM2VS enable that the top and bottom zero-misaligned vias to the conductive trace (also referred to as conductive line) in the middle do not have to be co-located along the line and thus the vias may be referred to as "trench" vias (e.g., trench via 511 of FIGS. 5A-5C) if needed. For example, the ZM2VS may include one or more "trench" vias and, as used herein, the "trench" vias may be conductive ZM2VS vias having a length that is at least twice the width of the via. The trench vias may form electrical connections to one or more terminals of a discrete device embedded within the semiconductor package. These trench vias can be exposed to the top surface of the package, or they can be buried within the package and electrically connected to the top or other surface of the package using ZM2VS vias that contact the trench vias.

Furthermore, the use of ZM2VS processes to form the zero-misaligned vias allows for an increased IO/mm/layer on multiple interconnected layers as well as increased line-density in combination with power-delivery or multi-layer signaling schemes. For example, whereas as a ZMV and SAV may be limited to a trace that can be connected to the ZMV/SAV vias only in one direction, the embodiments set forth below may include pre-aligning a routing layer to vias extending above and below by designing an enhanced photomask. For some embodiments, this enhanced photomask may simultaneously define both the dimensions and placement of the routing layer along with vias extending above and below the routing layer.

In some embodiments, the processes used to fabricate an enhanced photomask (e.g., by fabricating multiple grayscale layers on one mask) are amenable to much more precise alignment, and thus the achievable misalignment is much less. Moreover, since the alignment is only done one time (i.e., during mask fabrication), these embodiments help to replace the alignment costs (e.g., due to reduced throughput) with the marginally increased cost of fabricating the photomask, which is used multiple times over, and may therefore displace the overall cost and maintain cost-efficiency. A corresponding set of processes has been designed to fabricate the resultant structures using a single lithographic exposure step along with several development and plating steps.

According to some embodiments, FIGS. 1-7 illustrate zero-misalignment two-via stacks using a photoimageable dielectric (PID) stack and electrolytic plating. As used herein, a "zero-misalignment two-via stack" (ZM2VS) refers to a routing layer or a conductive trace having zero-misalignment vias (also referred to as ZM2VS vias) that are pre-aligned and extend in both directions to a top layer and a bottom layer—without reducing the trace density. For example, the ZM2VS described herein may be fabricated using a single exposure step to define a zero-misalignment two via stack that simplifies the litho processing for any number of packaging needs, including but not limited to I/O density, routing density improvement, increase in packaging designs, etc. For some embodiments, the zero-misalignment vias as set forth below (e.g., in FIGS. 1-11) may include (or may be formed with), but is not limited to, electroless copper (Cu), sputtered Cu-bearing titanium alloy (Ti/Cu), tantalum/copper (Ta/Cu) seed layer (s) under the line, traces of thin palladium (Pd) layers in one or more specific/defined places around the via structures, and/or buildup film material surrounding the entire via and line structure. In addition, for some embodiments, the ZM2VS is formed using at least one of a PID material and a buildup film as the dielectric.

Referring now to FIG. 1, a perspective view of a conductive trace 110 with zero-misaligned vias 111-112 is illustrated, according to one embodiment. For one embodiment, the conductive trace 110 may be used as a package routing signal line (or trace) that is connected to a top pad 120 on one end and to a bottom pad (or layer) 121 on the other end (note that the line may eventually be routed all the way to the second-level interconnect (SLI)). For one embodiment, the top pad 120 may be a first level interconnect (FLI) pad connecting a substrate to a die, while the bottom pad may be a SLI pad (note that the SLI pad may be a second/subsequent layer or a bottommost layer/plane of the package/substrate).

According to one embodiment, the conductive trace 110 enables connectivity to both pads 120-121 with a maximal number density of connections for one or more given design rules (e.g., a given design rule prescribing a minimum trace width and space width). In addition, as shown in FIG. 1, the zero-misaligned via 111 is connected to the conductive trace 110 at one end (e.g., shown as a perpendicular junction from a zero-misaligned via to a trace) and at the other end the conductive trace 110 is connected to the zero-misaligned via 112 (e.g., shown as a perpendicular junction from a trace to a zero-misaligned via). Note that the conductive trace 110 with the zero-misaligned vias 111-112 may be formed with one or more different process flows as described in further detail below (e.g., FIGS. 7-10).

Figure 2A:
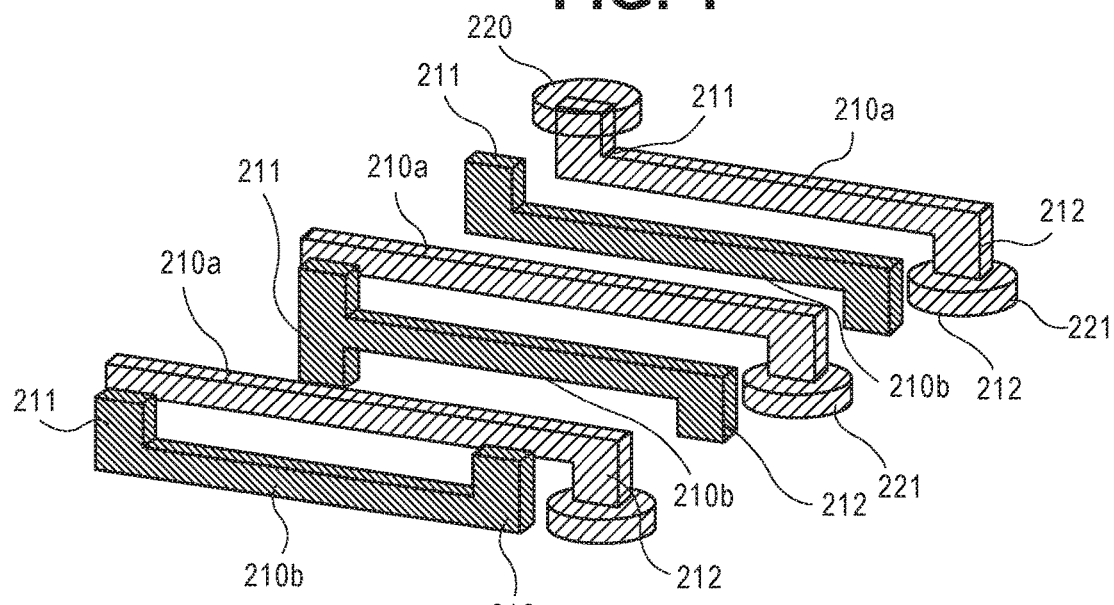
FIG. 2A is a perspective view of one or more conductive traces with zero-misaligned vias, according to one embodiment.

In addition, for some embodiments, the formation of the zero-misaligned vias 111-112 to the conductive trace 110 may allow for one or more pads to be parallel (e.g., as shown in FIG. 2A) without interfering with a pad at least on one end (i.e., as would be the case if using only ZMVs or SAVs). These embodiments thus enable a semiconductor package to have two or more parallel conductive traces (such as conductive trace 110) in a dense routing configuration without requiring a further increase in I/O congestion in a region around a pad. Accordingly, the conductive trace 110 with the zero-misaligned vias 111-112 allows for shorter and more efficient routing, which can lead to better signaling characteristics and to a reduced package form-factor. Note that the ZM2VS trace/vias may include fewer or additional packaging components based on the desired packaging design.

FIG. 2A is a perspective view of one or more conductive traces 210a-b with zero-misaligned vias 211-212, according to one embodiment. Note that the conductive traces 210a-b are similar to the conductive trace 110 of FIG. 1, however the one or more conductive trace 210a-b are shown parallel to illustrate a routing and signaling improvement based on the ZM2VS process described herein. Also note that FIG. 2A may be omitting one or more components (e.g., as shown below in the corresponding FIG. 2B) to simplify and not obscure the illustrative implementations.

Referring now to FIG. 2A, the conductive trace 210a-b may be formed as straight lines, but the conductive trace 210a-b can have one or more different shapes (e.g., curved, zig-zag, etc.). For one embodiment, the one or more conductive trace 210a are signal traces and the one or more conductive trace 210b are ground traces. For one embodiment, the collective one-dimensional (1D) number density of the conductive traces 210a-b may be the same/equal to that of the zero-misaligned vias 211-212 (or the conductive traces 210a-b have a collective 1D number density that is substantially equal to a 1D number density of the first via 211 and a 1D number density of the second via 212).

Figure 2B:
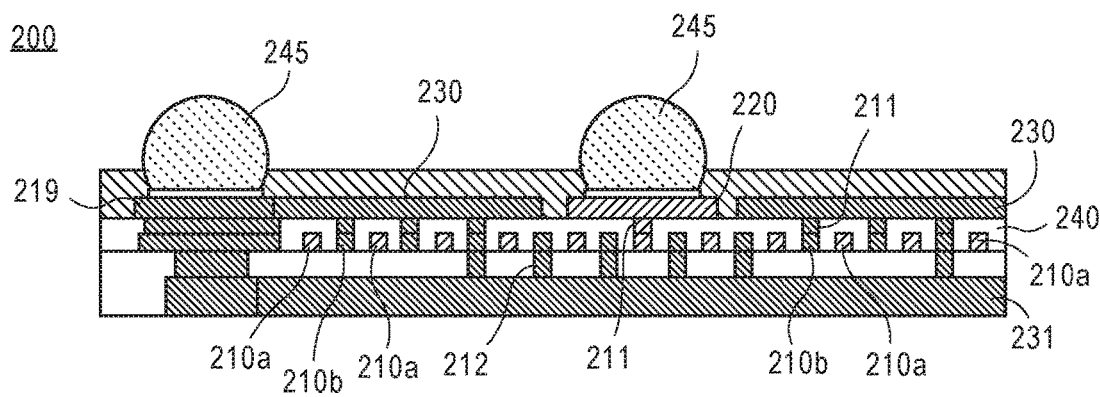
FIG. 2B is a projection view of a portion of the one or more conductive traces with zero-misaligned vias in a semiconductor package, according to one embodiment.

For one embodiment, the one or more conductive traces 210a-b in a parallel-configuration enable an improved ground shielding for high-speed signals and a high ground-to-signal ratios (e.g., up to 1:1). For example, a conductive trace 210a may be used as a signal trace to connect a FLI layer to a subsequent layer in a substrate (as shown in FIG. 2B). For cross-talk minimization, for example, the conductive trace 210a (a signal trace) is surrounded by a conductive trace 210b (a ground trace), where a ground reference plane(s) may be located either below the traces or both on top and below the traces.

For some embodiments, each of the conductive traces 210a-b is formed with one or more zero-misaligned vias 211-212 on at least one end of the conductive trace 210a-b. The zero-misaligned vias 211-212 may be coupled with a top pad 220 and/or a bottom pad 221. For one embodiment, the zero-misaligned vias 211-212 may be formed to extend both upward to a top layer and downward to a bottom layer (e.g., shown as a "T" junction where a top zero-misaligned via and a bottom zero-misaligned via have a "T" perpendicular junction from the zero-misaligned vias to a trace). Meanwhile, one or more of the conductive traces 210a-b may have one or zero-misaligned vias 211 and/or 212 on one end and have no vias formed on the other end.

Note that the conductive traces 210a-b with the zero-misaligned vias 211-212 may be formed with one or more different process flows as described in further detail below (e.g., FIGS. 7-10).

FIG. 2B is a corresponding projection view of a semiconductor package 200 having the one or more conductive traces 210a-b with zero-misaligned vias 211-212, according to one embodiment.

For one embodiment, the semiconductor package 200 has a dielectric layer 240 that includes the one or more conductive traces 210a-b (e.g., as shown in FIG. 2A). The one or more conductive traces 210a are signal lines and the one or more conductive traces 210b are ground lines. For some embodiments, the one or more conductive traces 210a-b are in parallel to enable an improved ground shielding for high-speed signals and a high ground-to-signal ratios (e.g., up to 1:1) in the semiconductor package 200. For example, as shown in the transmission layer 240 of the semiconductor package 200, each of the signal conductive trace 210a is surrounded with at least one or more ground conductive trace 210b, where ground reference plane 230 and 231 are respectively deposited above the lines 210a-b and/or above and below the lines 210a-b.

For example, a ground conductive trace 210b has a zero-misaligned via 211 coupled to the top ground plane 230, whereas another ground conductive trace 210b has a zero-misaligned via 212 coupled to the bottom ground plane 231. For one embodiment, the signal conductive trace 210a has a zero-misaligned via 211 coupled to a top pad 220 (e.g., a signal FLI pad), where a solder ball (or bump) 245 is deposited on the top pad 220 of the semiconductor package 200. In addition, one or more of the top ground planes 230 and the bottom ground plane(s) 231 may be coupled to a top pad 219 (e.g., a ground FLI pad), where a solder ball (or bump) 245 is deposited on the top pad 219 of the semiconductor package 200. In some embodiments, the layer 240 has one or more conductive trace 210a that may be used as signal traces to connect a FLI layer to a subsequent layer with the zero-misaligned vias 211 and/or 212 in the semiconductor package 200.

For some embodiments, each of the ground conductive trace 210b may be coupled to at least one of the ground planes 230-231. For one embodiment, each of the ground conductive trace 210b is coupled to both ground planes 230-231, where at least one of the ground conductive trace 210b is coupled to both ground planes 230-231 without misalignment using the zero-misaligned vias 211-212. Note that the conductive trace 210a-b directionality is not restricted to one-specified direction as such the conductive trace 210a-b can follow any directions, according to some embodiments.

Figure 3A:
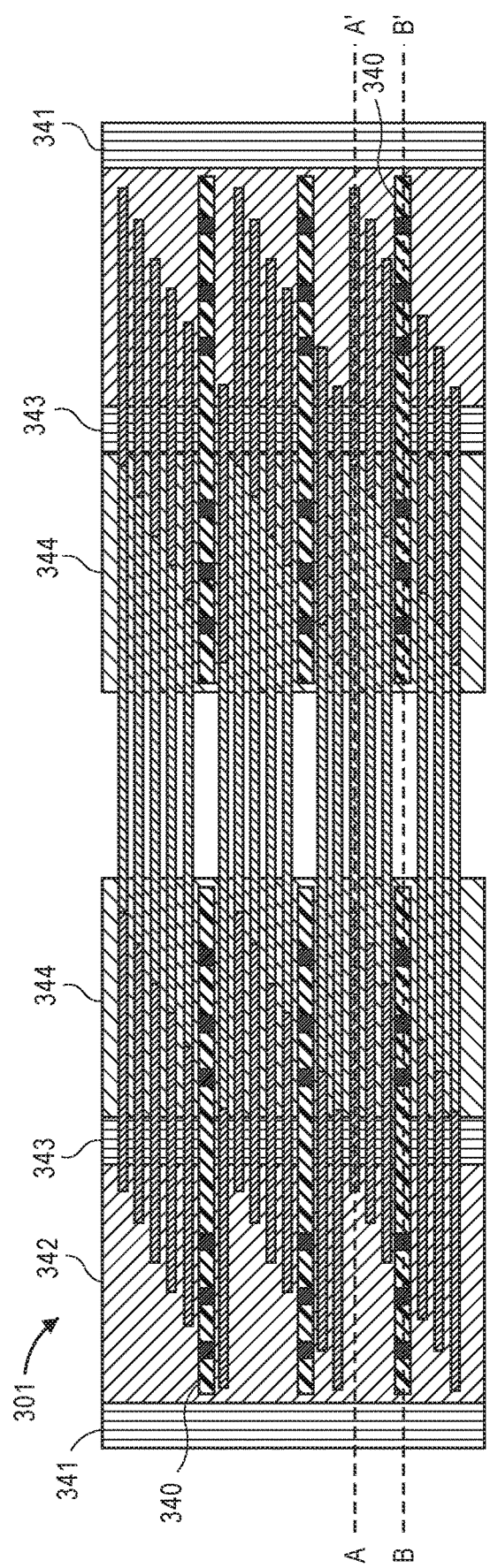
FIG. 3A is a plan view of a semiconductor package having interconnect package layers with one or more conductive traces with zero-misaligned vias, according to one embodiment.
Figure 3B:
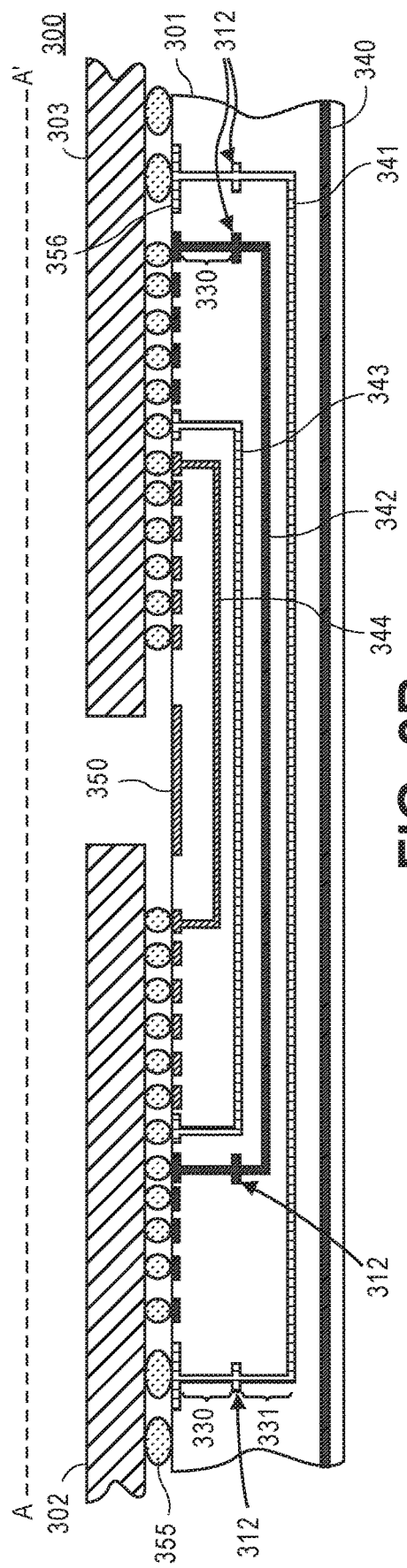
FIG. 3B is a corresponding projection view of a portion of a semiconductor package having interconnect package layers with one or more conductive traces with zero-misaligned vias, along the A-A' axis of FIG. 3A, according to one embodiment.
Figure 3C:
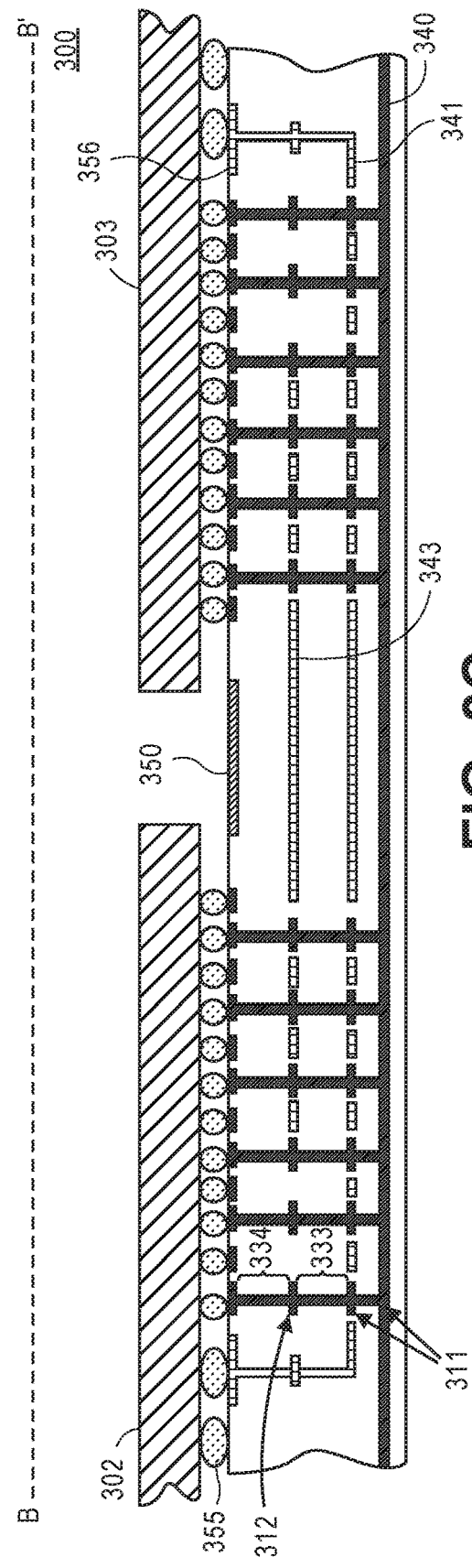
FIG. 3C is a corresponding projection view of a portion of a semiconductor package having interconnect package layers with one or more conductive traces with zero-misaligned vias, along the B-B' axis of FIG. 3A, according to one embodiment.

Also note that the semiconductor package 200, as shown in FIG. 2B, may include fewer or additional packaging components based on the desired packaging design. FIG. 3A is a top view of a package 301 with one or more interconnect layers 340-344, according to one embodiment. In addition, FIG. 3B is a corresponding cross-sectional view of a portion of a semiconductor device 300 with the package 301 on the A-A' axis, and FIG. 3C is a corresponding cross-sectional view of the semiconductor device 300 with the package 301 on the B-B' axis. FIGS. 3B and 3C provide cross-sectional views that may be useful in showing how the one or more layers of the ZM2VS vias and lines are formed in the package 301 (also referred to as a substrate).

FIG. 3A illustrates the package 301 and may omit one or more components for simplicity that may be illustrated in FIGS. 3B and 3C with projection views of a semiconductor device 300 with the package 301 on the A-A' axis and on the B-B' axis, respectively.

Referring now to FIG. 3A, the package 301 includes one or more interconnect layers 340-344. For one embodiment, the package 301 may include, but is not limited to, a substrate, a motherboard, and a printed circuit board (PCB). For one embodiment, the package 301 is a PCB. For one embodiment, the PCB is made of an FR-4 glass epoxy base with thin copper foil laminated on both sides (not shown). For certain embodiments, a multilayer PCB can be used, with pre-impregnated (pre-preg) and copper foil (not shown) used to make additional layers. For example, the multilayer PCB may include one or more dielectric layers, where each dielectric layer can be a photosensitive dielectric layer (not shown). For some embodiments, holes (not shown) may be drilled in the package 301. For one embodiment, the package 301 may also include conductive copper traces, metallic pads, and holes (not shown).

For one embodiment, the one or more interconnect layers 340-344 can be a package layer with at least one of an I/O layer, a power plane, and a ground plane. For example, the interconnect layers 340-344 may include a power plane (e.g., interconnect layer 340), a ground (GND) plane (e.g., interconnect layers 341 and 343), and I/O traces (e.g., interconnect layers 342 and 344) based on the desired architectural implementations.

As described herein, an "interconnect layer" may refer to a conductive layer used for electrical interconnection of circuit components on a substrate (e.g., an integrated circuit). The interconnect layer may include, but is not limited to, a package layer, a power plane, a ground plane, and/or a signal trace (or a conductive trace) on the substrate. For some embodiments, one or more of the interconnect layers on the substrate may be formed with ZM2VS conductive traces/vias (as illustrated in FIGS. 1-2), where the interconnect layer has the ZM2VS vias leading from the interconnect layer to a second interconnect layer above or below that interconnect layer.

The one or more interconnect layers 340-344 may include, but is not limited to, I/O traces, a power delivery routing, traces or planes, and a GND routing, traces or planes. For one embodiment, the interconnect layer 340 can be a power plane, but the interconnect layer 340 can also be one or more power tracks, power routing(s), or a conductive plane (e.g., a metal plane). The interconnect layer 340 may further include one or more vertical ZM2VS (e.g., ZM2VS 334-334 as shown in FIG. 3C) to deliver power within the package 301. For one embodiment, the interconnect layer 340 may be located below the other interconnect layers 341-344, and may include a plurality of power planes based on the desired packaging design, where the power planes may span the entirety of the package 301.

For some embodiments, the interconnect layers 341 and 343 may be one or more GND planes, and the interconnect layers 342 and 344 may be one or more I/O signal traces. For example, the interconnect layers 341 and 343 surround the interconnect layers 342 and 344 to shield the interconnect layers 342 and 344 from increased cross-talk. For one embodiment, each of the interconnect layers 340-344 may include one or more ZM2VS traces, vias, and/or pads (e.g., vias on pad 311-312 as shown in FIGS. 3B and 3C). Note that the pads of the interconnect layers 341-344 may be configured as ZM2VS or vias-on-pads (e.g., vias on pads 312 of FIG. 3B).

According to some embodiments, the ZM2VS of the interconnect layers 340-344 may be formed with two stacked vias (e.g., ZM2VS 330-331 of FIG. 3B and 333-334 of FIG. 3C) that are coupled in both directions (i.e., above and below the interconnect layers). For example, the ZM2VS of the interconnect layers 340-344 may be used to connect each of the interconnect layers to another conductive layer (e.g., a FLI layer).

Note that the interconnect layers of package 301 may be formed with one or more different process flows as described in further detail below (e.g., FIGS. 7-10). Also note that the package 301, as shown in FIG. 3A, may include fewer or additional packaging components based on the desired packaging design.

FIG. 3B is a corresponding projection view of a semiconductor package 300 with the package 301 on the A-A' axis, according to one embodiment. For one embodiment, the semiconductor package 300 may have dies 302-303 coupled to the package 301 using the one or more interconnect layers 340-344. The interconnect layer 340-344 may include one or more ZM2VS 330-331 to connect the respective interconnect layers in either one or more both directions in the package 301. Note that package 301 illustrates the interconnect layers 340-344, however the package 301 may have fewer or more interconnect layers based on the desired packaging design.

For one embodiment, the semiconductor package 300 includes one or more dies 302-303 disposed on the package 301 coupled by a plurality of solder balls 355 and a plurality of pads 356 (e.g., controlled collapse chip connection (C4) pad layer). Each of the dies 302-303 may include, but is not limited to, a semiconductor die, an integrated circuit, a central processing unit (CPU), a microprocessor, a platform controller hub (PCH), a memory, and a field programmable gate array (FPGA). In addition, the package 301 may include a conductive layer 350 which may have one or more metals structures (e.g., interconnects and/or routing on a pad layer). Note that the conductive layer 350 may be optional and thus may be added/omitted based on the desired packaging design.

For some embodiments, the semiconductor package 300 includes one or more interconnect layers 340-344 that may be sacrificed for (or implemented with) a vertical connection without necessitating a pad in the high-density layer of the semiconductor package 300—which significantly reduces the trace density of the respective interconnect layer. Furthermore, as shown in FIG. 3B, the one or more ZM2VS 330-331 facilitate vertical connections that couple one or more interconnect layers to the FLI pads 356 of the package 301 located above the high-density layers.

As shown in FIG. 3B, each of the interconnect layers 340-344 may have one or more ZM2VS. For example, the interconnect layer 341 may include the ZM2VS 330-331 formed within the package 301, where the first ZM2VS 330 is disposed above the second ZM2VS 331. Likewise, each of the interconnect layers 342-343 have at least one ZM2VS 330. For one embodiment, one or more of the first ZM2VS 330 may couple a via on pad 312 of a given interconnect layer to a pad 356 (e.g., a C4 pad layer).

Accordingly, one of the advantages of these embodiments of the semiconductor package 300 is that for a connection to be enabled between only a power plane (e.g., package layer 340) and the die (e.g., die 302), a single I/O conductive trace needs to be removed at minimum (min) line (or width) and space (also referred to as min line/space). For example, typically if in an 8 row deep I/O every 8$^{th}$ line is removed, the I/O density drops typically by only 12.5%. However, for one embodiment, when one or more ZM2VS vias 312 on pads are implemented on the package 301 for a min line/space of 2/2 μm, the reduction in I/O density of the package 301 may be roughly between 37.5-50% (or even higher) based on, for example, the exposure tool alignment capability. Accordingly, the reduction in I/O density of the semiconductor package 300 may necessitate an added/improved and unclear solution to return the total I/O count that is needed.

Note that the semiconductor package 300, as shown in FIG. 3B, may include fewer or additional packaging components based on the desired packaging design. FIG. 3C is a corresponding projection view of a semiconductor package 300 with the package 301 on the B-B' axis, according to one embodiment. For one embodiment, the semiconductor package 300 may have dies 302-303 coupled to the package 301 using the one or more interconnect layers (e.g., interconnect layers 340-341, and 343). The interconnect layers 340-341 and 343 may include one or more ZM2VS 333-334 to connect the respective interconnect layers in either one or more both directions in the package 301.

For one embodiment, the semiconductor package 300 includes one or more dies 302-303 disposed on the package 301 coupled by a plurality of solder balls 355 and a plurality of pads 356 (e.g., C4 pad layer). For some embodiments, the semiconductor package 300 includes the power interconnect layer 340 and the ground interconnect layers 341 and 343. Furthermore, as shown in FIG. 3C, the one or more ZM2VS 330-331 facilitate vertical connections that couple one or more interconnect layers to the FLI pads 356 of the package 301 located above the high-density layers.

As shown in FIG. 3C, each of the interconnect layers 340-341 and 343 may have one or more ZM2VS 333-334. For example, the interconnect layer 340 may include the ZM2VS 333-334 formed within the package 301, where the first ZM2VS 334 is disposed above the second ZM2VS 333. For one embodiment, one or more of the first ZM2VS 334 may couple a via on pad 312 of a given interconnect layer to a pad 356 (e.g., a C4 pad layer). Likewise, the second ZM2VS 333 may have a via on pad 311 of a given interconnect layer (e.g., interconnect layer 340) to, for example, a pad 312 on the GND layer. The interconnect layer 340 has ZM2VS 333-334 connecting the bottom power plane to the top layer (e.g., the C4 pad layer 356). Likewise, the interconnect layers 341 and 343 has ZM2VS 333-334 connecting both ground planes to the top layer (e.g., the C4 pad layer 356).

Note that the interconnect layers 340-344 of FIGS. 3A-3C may have directionality that is not restricted to one-specified direction as such the conductive traces can follow any directions, according to some embodiments. Also note that the semiconductor package 300, as shown in FIG. 3C, may include fewer or additional packaging components based on the desired packaging design.

Figure 4A:
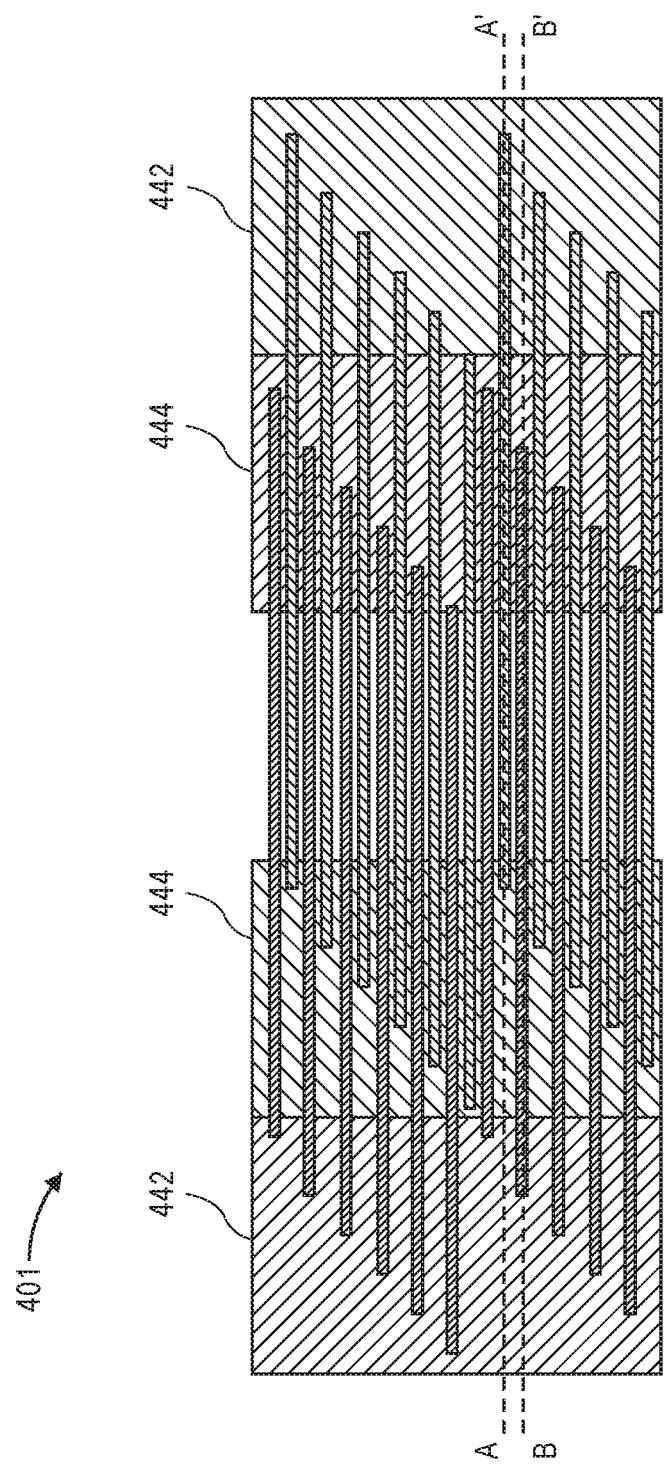
FIG. 4A is a plan view of a semiconductor package having interconnect package layers with one or more conductive traces with zero-misaligned vias, according to one embodiment.
Figure 4B:
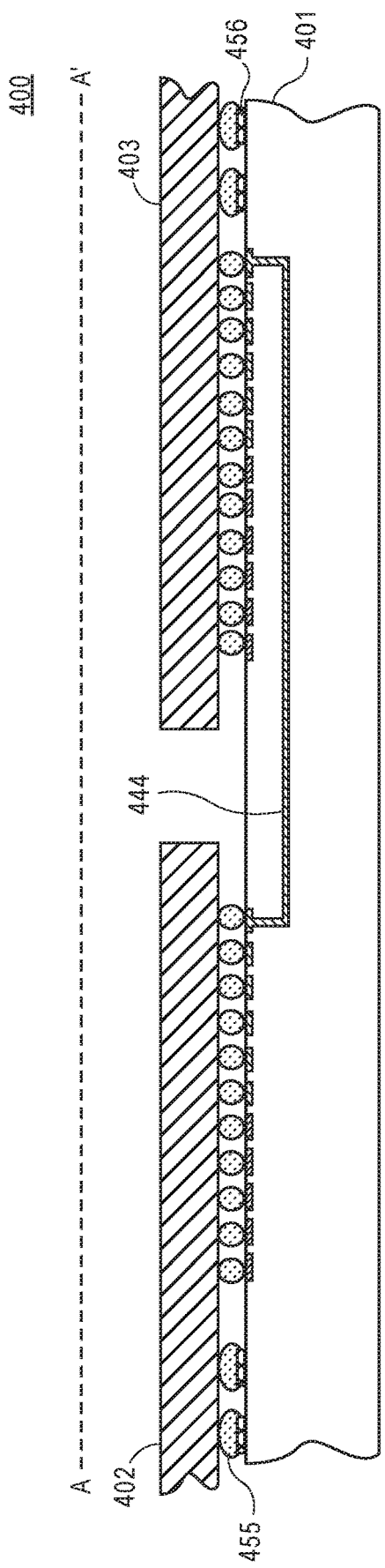
FIG. 4B is a corresponding projection view of a portion of a semiconductor package having interconnect package layers with one or more conductive traces with zero-misaligned vias, along the A-A' axis of FIG. 4A, according to one embodiment.
Figure 4C:
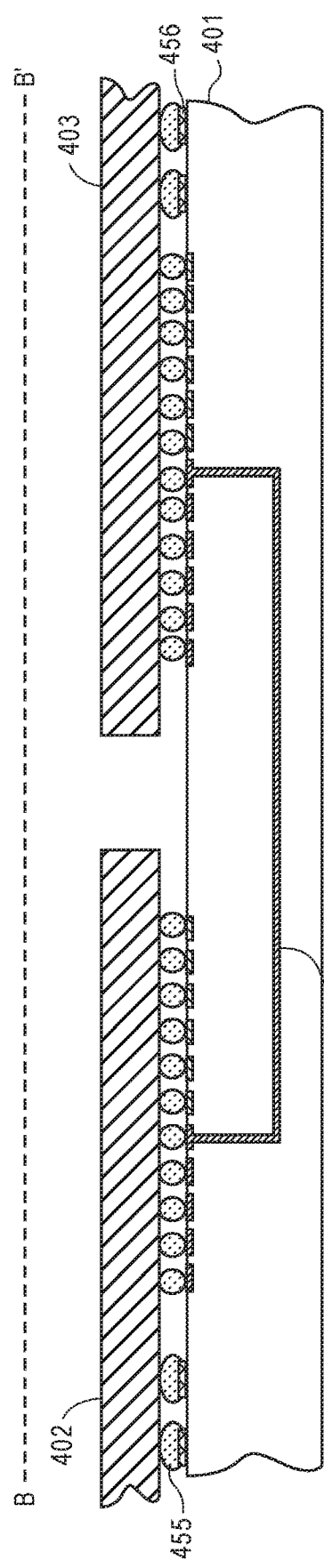
FIG. 4C is a corresponding projection view of a portion of a semiconductor package having interconnect package layers with one or more conductive traces with zero-misaligned vias, along the B-B' axis of FIG. 4A, according to one embodiment.

FIG. 4A is a top view of a package 401 with one or more interconnect layers 442 and 444, according to one embodiment. In addition, FIG. 4B is a corresponding cross-sectional view of a portion of a semiconductor device 400 with the package 401 on the A-A' axis, and FIG. 4C is a corresponding cross-sectional view of the semiconductor device 400 with the package 401 on the B-B' axis. FIGS. 4B and 4C provide cross-sectional views that may be useful in showing how the one or more layers of the ZM2VS vias and lines are formed in the package 401.

FIG. 4A illustrates the package 401 and may omit one or more components for simplicity that may be illustrated in FIGS. 4B and 4C with projection views of a portion of a semiconductor device 400 with the package 401. Furthermore, FIGS. 4A-4C show the package 401 that is similar to the package 301 of FIGS. 3A-3C.

Referring now to FIG. 4A, the package 401 includes one or more interconnect layers 442 and 444. For one embodiment, the package 401 may include, but is not limited to, a substrate, a motherboard, and a PCB. For one embodiment, the one or more interconnect layers 442 and 444 can be a package layer with at least one of an I/O layer, trace, and via. For example, the interconnect layer 444 may include a first signal layer and the interconnect layer 442 may include a second signal layer based on the desired architectural implementations. For one embodiments, the interconnect layer 442 on the package 401 may be formed with ZM2VS conductive traces/vias (as illustrated in FIGS. 1-3), where the interconnect layer 442 has the ZM2VS vias leading from the interconnect layer to a second interconnect layer above or below that interconnect layer. Meanwhile, the interconnect layer 444 may be formed with one or more ZMVs and/or zero-misaligned traces (ZMTs).

For some embodiments, the interconnect layers 442 and 444 are I/O signal traces that may be surrounded by one or more interconnect layers (i.e., GND planes) (not shown) to shield the interconnect layers 442 and 444 from increased cross-talk. For one embodiment, at least one of the interconnect layers 442 and 444 may include at least one or more of ZM2VS traces, vias, and pads. Note that the pads of the interconnect layers 442 and 444 may be configured as ZM2VS or vias-on-pads.

Note that the interconnect layers 442 and 444 of package 401 may be formed with one or more different process flows as described in further detail below (e.g., FIGS. 7-10). Also note that the package 401, as shown in FIG. 4A, may include fewer or additional packaging components based on the desired packaging design.

FIG. 4B is a corresponding projection view of a semiconductor package 400 with the package 401 on the A-A' axis, according to one embodiment. For one embodiment, the semiconductor package 400 may have dies 402-403 coupled to the package 401 using the one or more interconnect layers 442 and 444. The interconnect layer 444 may include one or more ZMVs (or ZMTs) to connect the interconnect layer 444 in either one or more both directions in the package 401. Note that package 401 illustrates the interconnect layer 444 (as shown in FIG. 4B), however the package 401 may have fewer or more interconnect layers based on the desired packaging design.

For one embodiment, the semiconductor package 400 includes one or more dies 402-403 disposed on the package 401 coupled by a plurality of solder balls 455 and a plurality of pads 456 Each of the dies 402-403 may include, but is not limited to, a semiconductor die, an integrated circuit, a central processing unit (CPU), a microprocessor, a platform controller hub (PCH), a memory, and a field programmable gate array (FPGA). As shown in FIG. 4B, the interconnect layer 444 may use one or more ZMVs and/or conductive traces to connect die 403 to 402 with the pads 456 and solder bumps 455.

In addition, the interconnect layer 444 may be similar to the ZMVs and conductive traces of FIGS. 1-3. The interconnect layers may be implemented for high-density I/O block assembly while maintaining equal length lines for one or more different I/O layers (e.g., as shown in FIGS. 4A-4C). Note that the interconnect layers (e.g., as shown in FIGS. 4A-4C) can entail a lateral growth of the I/O layer, but any possible timing issue(s) that may arise between I/O layers can be minimized. Also note that the semiconductor package 400, as shown in FIG. 4B, may include fewer or additional packaging components based on the desired packaging design.

FIG. 4C is a corresponding projection view of a semiconductor package 400 with the package 401 on the B-B' axis, according to one embodiment. For one embodiment, the interconnect layer 442 may include a ZM2VS (as described herein) to connect the respective interconnect layer 442 in either one or more both directions in the package 401. According to one embodiment, the interconnect layer 442 may be disposed (or formed) below the interconnect layer 444 (not shown). For one embodiment, the interconnect layer 442 has the ZM2VS connecting the bottom (second) signal layer to the top layer (e.g., the C4 pad layer 456). In addition, one of the advantages of these embodiments is that the interconnect layer 442 can connect through one layer with minimal change to the I/O density (e.g., the I/O density may drop by roughly a factor of 2).

Note that the interconnect layers 442 and 444 of FIGS. 4A-4C may have directionality that is not restricted to one-specified direction as such the conductive traces can follow any directions, according to some embodiments. Also note that the semiconductor package 400, as shown in FIG. 4C, may include fewer or additional packaging components based on the desired packaging design.

FIG. 5A is a perspective view of a conductive shield 500 with one or more conductive trace 510a-b with vias 511-512 (or ZM2VS vias), according to one embodiment. Note that, as described above and based on the package design of the conductive shield 500, the vias 511-512 may be used as (or to form) trench vias. FIGS. 5B and 5C are corresponding cross-sectional views of the conductive shield 500, according to some embodiments. Note that the conductive trace 510a-b may be similar to the conductive trace of FIGS. 1-4—in particular similar to the conductive trace of FIG. 2A—however the one or more conductive trace 510a-b may be implemented for improved cross-talk reduction and data-rate increase. For example, the conductive trace to via and/or ZM2VS as shown in FIG. 2A may be used to further convert the vias in at least one direction into vias (e.g., vias 511-512) that enable reduced cross-talk and increased data-rate.

Referring now to FIG. 5A, the conductive trace 510a-b may be formed as straight lines, but the conductive trace 510a-b can have one or more different shapes (e.g., coaxial, zig-zag, etc.). For one embodiment, the conductive trace 510a is a signal line and the one or more conductive trace 510b are ground lines. Using the one or more conductive trace 510a-b in parallel enables an improved ground shielding for high-speed signals and a high ground-to-signal ratios (e.g., up to 1:1). For example, a conductive trace 510a may be used as a signal line to connect a FLI layer (not shown) to a subsequent layer (not shown) in the conductive shield 500. For cross-talk minimization, the conductive trace 510a is surrounded by the ground lines 510b, where a ground reference plane(s) may be located either below the traces or both on top and below the traces. For example, the conductive shield 500 has the ground lines 510b connected to a top ground plane 531 with trench vias 511, where one of the ground lines 510b has a trench via 512 that may be used to connect to a bottom layer (not shown). In addition, the conductive shield 500 has the signal line 510a connected to a trench via 530 that extends upward to a top layer (not shown).

For some embodiments, each of the ground lines 510b is formed with one or more vias 511 (also referred to as trench vias) on at least one end of each ground lines 510b. The vias 511 may be coupled with the top ground plane 531. In addition, the ground lines 510b may also be formed with one or more vias 512 on the other end of the ground lines 510b. The vias 512 may be coupled with a bottom pad/layer (not shown). For one embodiment, the vias 511-512 are deposited on one or more of the ground lines 510b to extend upward on one end to a top GND layer 530 and to extend downward on the opposite end to a bottom layer (i.e., shown as a "L" junction where a top ZM2VS via and a trench ground line have a perpendicular junction to form a ZM2VS via to a line on one end, and the line to a bottom ZM2VS via on the other end). Note that the conductive traces 510a-b with the vias 511-512 and 530 may be formed with one or more different process flows as described in further detail below (e.g., FIGS. 7-10).

According to an additional embodiment, the use of trench vias to extend the thickness of conductive trace may also be utilized to form coaxial conductive trace within a package substrate. Such an embodiment is illustrated in FIGS. 5A-5C. FIGS. 5A-5C only illustrate the conductive features within the package, and the dielectric layers are omitted to not unnecessarily obscure particular embodiments.

Note that the conductive shield (and package) 500 may include fewer or additional packaging components based on the desired packaging design.

Referring now to FIGS. 5B and 5C. FIG. 5B is a corresponding cross-sectional view of the conductive shield 500 on the A-A' axis, and FIG. 5C is a corresponding cross-sectional view of the conductive shield 500 on the B-B' axis. FIGS. 5B and 5C provide cross-sectional views that may be useful in showing how the one or more layers of the ZM2VS vias and lines are formed around the conductive shield 500.

As illustrated in FIG. 5B, the one or more conductive traces 510a-b may be formed as zero-misalignment two via stacks using a PID (and/or a buildup film dielectric) and electrolytic plating (as the process flows of forming the ZM2VS lines/vias are described in further detail below in FIGS. 7-10). For one embodiment, the one or more ground lines 510b may be formed with a width that is substantially equal to the sidewalls (i.e., the ZM2VS vias 511 extending upward to the top ground plane 531) that are formed along opposite edges of the conductive shield 500. For another embodiment, the conductive trace 510a may be formed with a width that is substantially equal to the ZM2VS via 530.

For one embodiment, the ground conductive trace 510b are coupled with the trench vias 511 as the trench vias 511 extend upward connecting to the top GND plane 531 (i.e., forming a conductive shield 500 having two "T-shaped" grounding sidewalls surrounding the "I-shaped" signal conductive trace/via based on the A-A' axis). Meanwhile, as shown in FIG. 5C, the ground lines 510b are coupled with the trench vias 511 that connect upward to the top ground plane 531 (without a separation in the top GND plane as shown on FIG. 5B), which surrounds the signal conductive trace 510a (i.e., forming a conductive shield 500 having semi-coaxial shape with the ground lines/vias/plane that surround the conductive trace based on the B-B' axis).

For one embodiment, the conductive trace 510a-b may be separated from the top GND plane 531 by a single dielectric layer. However, it is to be appreciated that the top GND plane 531 may have more than one layer of dielectric material separating the plane 531 from the transmission/trench lines 510a-b. In such embodiments, the sidewalls and conductive trace 510a-b of the conductive shield 500 may have one or more ZM2VS vias deposited above and/or below the ZM2VS conductive trace/vias 510a-b, respectively.

According to an alternative embodiment, a plurality of conductive trace may be formed in a single conductive shield 500. For example, a twin-axial conductive trace may be formed within the conductive shield 500, where a first conductive trace and a second conductive trace may be surrounded by the ground conductive traces 510b. Such a device may be beneficial when a differential signal with low interference is needed. Furthermore, it is to be appreciated that other types of trace(s)/line(s) may be formed within a conductive shield. For example, entire byte groups or busses may be implemented within a coaxial configuration that is made possible with lithographically defined line vias, according to embodiments of the invention.

Also note, as described above in FIGS. 2A and 2B, one or more conductive traces are also not limited to passing a signal along a single layer of dielectric material (e.g., a PID material and/or a buildup film). For example, a conductive trace (e.g., conductive traces 510a-b) that includes one or more junctions with one or more ZM2VS vias that allow for the conductive trace to travel along the plane of the one or more dielectric layers (not shown) and pass through one or more dielectric layers (not shown) in one or both vertical directions (to a top and/or a bottom layer) with the ZM2VS via(s) (e.g., ZM2VS vias 511-512). At the junction(s) where the conductive trace transitions to being routed through dielectric layers in the vertical direction, embodiments of the invention may include one or more ZM2VS line vias and/or pads that also extend through the dielectric layers.

In addition, while the illustrated embodiment includes one line via for each conductive trace (in the vertical direction), it is to be appreciated that more line vias may be included if the conductive trace continues in the vertical direction (in both the upward and/or downward directions) through additional dielectric layers, or fewer line vias may be needed if the conductive trace passes through fewer dielectric layers.

Those skilled in the art may also recognize that the trench lines (or the intermediate wall lines) and pads that are formed on the same dielectric level may be formed as a single continuous feature that are connected to each other out of the plane, and therefore, may be referred to with the same reference numeral. According to another embodiment, the ZM2VS line vias that are formed through the same dielectric layers may also be one or more ZM2VS line vias that are connected out of the plane and may be formed as a single continuous feature.

Additionally, it is to be appreciated that as the ZM2VS line vias are formed with a zero-misalignment two via stack using PID (and/or a buildup stack) and electrolytic plating process, the one or more intermediate wall lines may be omitted. In addition to some embodiments that have a coaxial transmission line passing through multiple layers of the package substrate, other embodiments may also include a conductive trace that is surrounded by a conductive shield in some portions of the package and is a strip-line conductive trace without a conductive shield in other portions of the package. According to an embodiment, the vertical ZM2VS vias and sidewalls may have any desired shape, such as circular or elliptical, and are not limited to rectangular shapes.

FIG. 6A is a perspective view of a conductive shield 600 having a coaxial waveguide with flat walls using ZM2VS and trench vias 610a-b and one or more layers/planes 631 and 633, according to one embodiment. FIGS. 6B and 6C are corresponding cross-sectional views of the conductive shield 600, according to some embodiments. Note that the trench lines 610a-b may be similar to the conductive traces of FIGS. 1-5—in particular similar to the transmission/trench lines of FIGS. 2 and 5—however both the top and bottom ground connections (e.g., ground layers 631 and 633, respectively) have been extended to the trench vias 610b creating a near-perfect rectangular coaxial waveguide for minimal losses and maximal I/O bandwidth. These embodiment, as shown in FIGS. 6A-6C, provide several advantages as the walls have a near-perfect alignment needed to reach top bandwidths at minimal losses compared to the typical (or currently pursued) waveguides where the walls around the signal are not smooth and equidistant due to alignment requirements.

Referring now to FIG. 6A, the conductive traces 610a-b may be formed as straight lines, but the conductive traces 610a-b can have one or more different shapes. For one embodiment, the conductive trace 610a is a signal line and the one or more conductive traces 610b are ground lines. Using the one or more conductive traces 610a-b in parallel enables an improved ground shielding for high-speed signals and a high ground-to-signal ratios (e.g., up to 1:1). For example, the signal line 610a may be used with vias 630 and 632 to connect a top layer (not shown) in the conductive shield 600. For cross-talk minimization, the signal line 610a is surrounded by the ground lines 610b, where a top ground layer 631 is deposited above the trench lines/vias 610a-b and a bottom ground layer 633 is deposited below the trench lines/vias 610a-b. For example, the conductive shield 600 has the ground lines/vias 610b connected to both the top ground layer 631 and the bottom ground layer 633, forming a near-perfect rectangular coaxial waveguide (or intermediate walls) between both layers 631 and 633.

According to an additional embodiment, the use of trench vias to extend the thickness of transmission lines may also be utilized to form coaxial conductive traces within a package substrate. Such an embodiment is illustrated in FIGS. 6A-6C. FIGS. 6A-6C only illustrate the conductive features within the package, and the dielectric layers are omitted to not unnecessarily obscure particular embodiments.

A coaxial conductive trace is formed by surrounding a conductive trace 610a with a conductive shield 600. According to one embodiment, the conductive shield 600 include the lower layer 633 that is coupled to the top layer 631 by one or more layers of trench lines/vias 610b that serve as sidewalls for the conductive shield 600, where the shield 600 may be held at ground potential. Accordingly, the conductive trace 610a and vias 630 and 632 are formed within the conductive shield 600 to transmit data with cross-talk reduction and data-rate increase with neighboring lines outside of the conductive shield 600.

Note that the conductive shield (and package) 600 may include fewer or additional packaging components based on the desired packaging design.

Referring now to FIGS. 6B and 6C. FIG. 6B is a corresponding cross-sectional view of the conductive shield 600 on the A-A' axis, and FIG. 6C is a corresponding cross-sectional view of the conductive shield 600 on the B-B' axis. FIGS. 6B and 6C provide cross-sectional views that may be useful in showing how the one or more layers of the ZM2VS trench lines/vias 610a-b with the top and bottom layers 631 and 633 are deposited in the conductive shield 600. Note that the formation of the walls of the conductive shield 600 are similar to the walls described in detail above in FIGS. 5A-5C.

As illustrated in FIG. 6B, the one or more conductive traces 610a-b may be formed as zero-misalignment two via stacks using a PID (and/or a buildup film dielectric) and electrolytic plating (as the process flows of forming the ZM2VS lines/vias are described in further detail below in FIGS. 7-10). For one embodiment, the one or more ground trench line/via 610b may be formed with a width that is substantially equal to the sidewalls connecting to the top and bottom layers 631 and 633 that are formed along opposite edges of the conductive shield 600. For another embodiment, the conductive trace 610a may be formed with a width that is substantially equal to the ZM2VS vias 630 and 632 extending upwards along the opposite edges of the conductive trace 610a.

For one embodiment, the ground trench lines 610b are coupled with the sidewalls of the conductive shield 600 as the ground trench lines/vias 610b are connected to the top layer 631 and the bottom layer 633. Note, as shown on the A-A' axis, the top layer 631 has an opening for the transmission via 630 that is coupled to the conductive trace 610a. Meanwhile, as shown in FIG. 6C, the ground trench lines 610b are coupled with the sidewalls of the conductive shield 600 as the ground trench lines/vias 610b are connected to the top layer 631 and the bottom layer 633 (without a separation in either the top and bottom layers), which surrounds the signal conductive trace 610a (i.e., forming a conductive shield 500 having a coaxial waveguide with the ground lines/vias/plane surrounding the conductive trace based on the B-B' axis).

For one embodiment, the conductive traces 610a-b may be separated from the top layer 631 and the bottom layer 633 by a single dielectric layer. However, it is to be appreciated that the top layer 631 and the bottom layer 633 may have more than one layer of dielectric material separating the either layers 631 and 633 from the conductive traces 610a-b. In such embodiments, the sidewalls and conductive traces 610a-b of the conductive shield 600 may have one or more ZM2VS vias deposited above and below the ZM2VS conductive traces/vias 610a-b, respectively.

Additionally, it is to be appreciated that as the ZM2VS trench lines/vias are formed with a zero-misalignment two via stack using PID (and/or a buildup stack) and electrolytic plating process, the one or more intermediate wall lines may be omitted. In addition to some embodiments that have a coaxial conductive trace passing through multiple layers of the package substrate, other embodiments may also include a conductive trace that is surrounded by a conductive shield in some portions of the package and is a strip-line conductive trace without a conductive shield in other portions of the package. According to an embodiment, the vertical ZM2VS vias and sidewalls may have any desired shape, such as circular or elliptical, and are not limited to rectangular shapes.

FIGS. 7A-7H are a process flow illustrating a method of forming a conductive trace with zero-misaligned vias using a photoimageable dielectric (PID) film stack with electroless plating, according to some embodiments. These embodiments as shown with respect to FIGS. 7A-7H provide a pathway including a single exposure step to develop a ZM2VS that improves (and simplifies) the litho patterning processing for any desired packaging needs, including, but not limited to, I/O density reduction, routing density improvement, and increased packaging designs. The ZM2VS formed with the process flow of FIGS. 7A-7H is similar to (and may be used as) the ZM2VS conductive traces/vias illustrated in FIGS. 1-6 (e.g., when the packaging design needs a PID stack and electroless plating process).

One such embodiment is illustrated and described based on FIGS. 7A-7H, which illustrates cross-sectional views of a package layer used to form the ZM2VS. In the illustrated embodiments, the formation of the ZM2VS is shown, however it is to be appreciated that additional features, such as additional lines, vias, and/or pads, may be formed at the same time and with the same processing operations, according to the embodiments described herein.

Figure 7A:
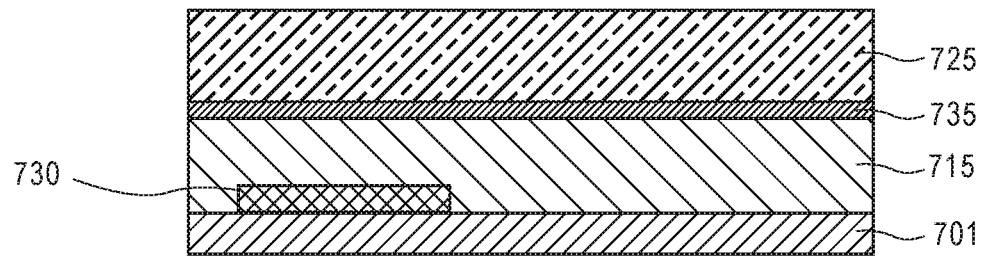
FIGS. 7A-7H are a process flow illustrating a method of forming a conductive trace with zero-misaligned vias using a photoimageable dielectric (PID) film stack with electroless plating, according to some embodiments.

Referring now to FIG. 7A, embodiments of the process flow include a conductive layer 730 (or an initial top metal layer) deposited (or disposed) on a substrate 701, where the conductive layer 730 has one or more pads (or traces) deposited on the substrate 701. For one embodiment, the package layer of FIG. 7A illustrates at least one interconnect layer that includes the conductive layer 730 and the substrate 701. According to one embodiment, the conductive layer 730 may include at least one of existing pads, vias, and lines/traces that are formed with at least one of an e-less metal seed layer and an electrolytic metal seed layer. For example, the conductive layer 730 may facilitate the foundation of the zero-misalignment two-via stack. In addition, the substrate 701 may include, but is not limited to, a package, a motherboard, and a printed circuit board (PCB).

According to some embodiments, a PID layer 715 (or a laminable PID layer) is disposed above and around the conductive layer 730 and the substrate 701, and then a seed layer 735 is deposited (e.g., sputtered) on the PID layer 715. For example, the PID layer 715 may be a high-dose sensitive, positive-tone PID. For one embodiment, the PID layer 715 may be deposited with a lamination, spray coating, spin coating, ink-jet printed, or other known deposition methods. Several of the advantages of using PID materials to form the dielectric layer(s) is the reduction of assembly steps (i.e., a single patterning step of a PID layer to form the ZM2VS as shown) and their ease of processing (i.e., exposure and subsequent develop to create any structure as defined by a mask). In contrast, using a buildup film (BF) as the dielectric layer may require reactive-ion etching (RIE) or other physical etching methods to be patterned/removed (i.e., processes/tools may not be readily available in current panel-level manufacturing).

For one embodiment, the seed layer 735 may not be transparent to any light, for example, from any light source of any lithography exposure tool. For example, the seed layer 735 may be an electroless $Pd^0$ metal catalyst layer. For alternative embodiments, the seed layer 735 can include an electrolytic metal seed layer and/or one or more different types of metal seed catalysts or metal-based coordinated complexes (i.e., self-assembled monolayers with coordinated or complexed seed catalysts), as long as the metal seed catalysts or complexes are transparent to exposure conditions. Note that, based on the process flow described in FIGS. 7A-7H, the seed layer 735 uses an electroless plating process to be deposited on the PID layer 715.

According to some embodiments, a resist layer 725 is deposited on the seed layer 735. For example, the resist layer 725 may be laminated when using a dry resist material or slit-coated when using a liquid resist material. For one embodiment, the resist layer 725 is a dose sensitive resist that can be chemically amplified. For additional embodiments, the resist layer 725 may be positive tone, but may also be negative tone, and/or negative-on-negative tone resists (i.e., stacked resists of the same polarity), and positive-on-positive tone resists. The resist layer 725 may be deposited with, but not limited to, a lamination, spray coating, spin coating, ink-jet printed, or other known deposition methods.

Figure 7B:
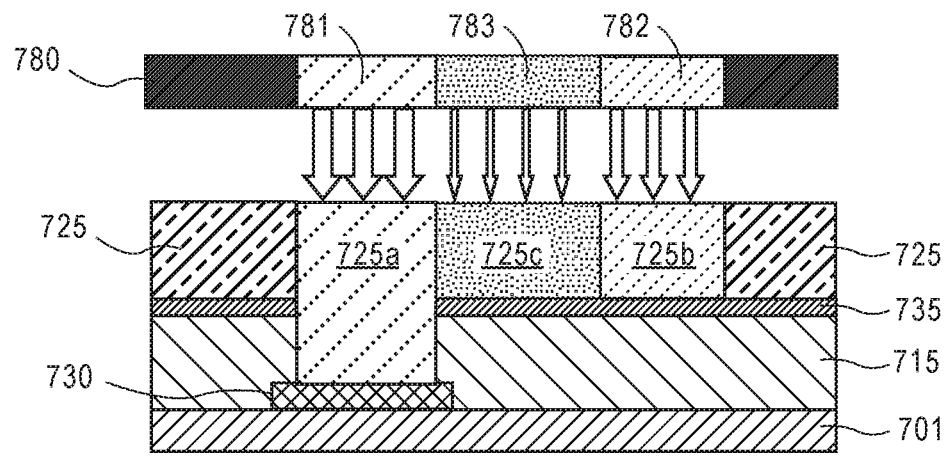

Referring now to FIG. 7B, the resist layer 725 may be developed and exposed with a mask 780 (e.g., a multi-tone mask) that has one or more intensity regions 781-783 (note that the mask can be implemented with a specified number intensity regions based on the desired packaging design and/or the desired patterning for a ZM2VS line/via).

For example, the one or more intensity regions 781-783 of the mask 780 may include four intensity regions, such as a dark region (shown as dark blocks on the mask 780), a light region 781, a first gray region 782, and a second gray region 783, where for example the second gray region 783 may be darker (and thus allows less light exposure) than the first gray region 782. Accordingly, exposing light through mask 780 (e.g., to a light source, a radiation source, a mercury arc, etc.) adequately transfers images onto resist layer 725 to produce one or more dose levels shown as 725a-c. Each of the dose levels 725a-c has an individual development-time requirement based on the level of exposure (e.g., the highest dose exposure usually has the fastest/shortest development time, and so on).

For one embodiment, the resist layer 725 is now imprinted with a first region 725a that has a highest dose and a faster/shorter development time, a second region 725b that has a medium dose and a slower development time, and a third region 725c that has a lowest dose and a slowest development time. Note that the unexposed regions of the resist layer are labelled 725, e.g., the unexposed regions are on opposite ends/edges of the resist layer 725 as shown in one embodiment. For other embodiments, a resist layer may have less than three or more than three dose levels printed on the resist layer. Also note that one or more features may have been omitted or simplified in order to not obscure the illustrative implementations.

For one embodiment, the first region 725a is printed to have a dose region that vertically extends through the resist layer 725 and the PID layer 715 to the top surface of the conductive layer 730. For example, since the selected PID layer 715 can only be patterned above a specified dose, the exposure dose of the first region 725a (i.e., the high dose region) may need to be above a minimum dose to pattern both the first region of 725a of the resist layer 725 and the PID layer 715 simultaneously. Meanwhile, the second and third dose regions 725b-c may be below the minimum exposure dose so that the underlining PID layer 715 is not affected at those respective regions.

Figure 7C:
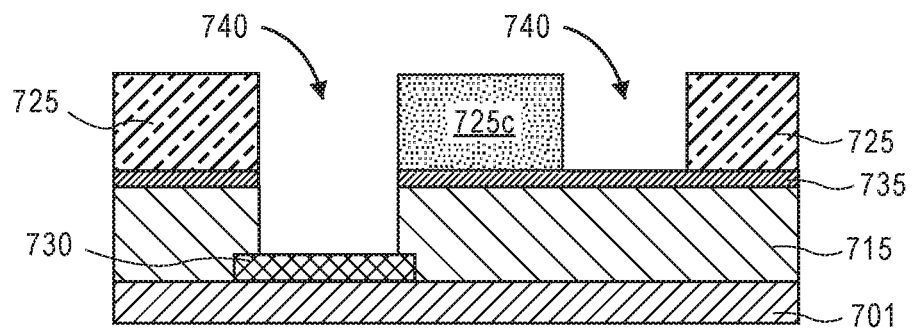
Figure 7D:
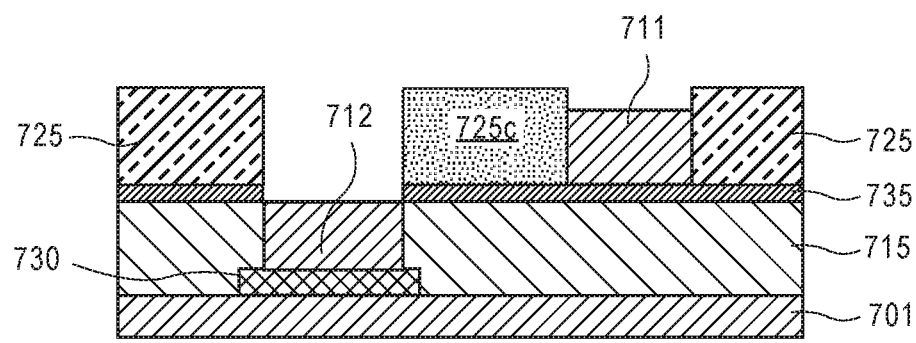

Referring now to FIG. 7C, for one embodiment, a first develop step removes only the resist region exposed with the highest and medium doses from the resist layer 725 and the PID layer 715. As such, after the first development on the resist layer 725 and the PID layer 715, the first region 725a (exposed with a broadband light) and the second dose region 725b are simultaneously developed from the resist layer 725 and the PID layer 715, where the resist layer 725 and the PID layer 715 are thus patterned to provide one or more via openings 740 to expose a portion of the seed layer 735 for the formation of a ZM2VS via (e.g., ZM2VS via 712 as shown in FIG. 7D) and the top surface of the conductive layer 730 for the formation of a ZM2VS via (e.g., ZM2VS via 711 as shown in FIG. 7D).

According to one embodiment, after the first development step, the first exposed region of the resist region 725 and PID layer 715 is developed to provide a via opening 740 for a bottom via that exposes the top surface of the conductive layer 730, while the second exposed region of the resist layer 725 is developed to provide a via opening 740 for a top via that exposes the portion of the seed layer 735.

Note that the first develop step may be implemented selectively in one or more development steps, as desired, to expose and develop the dose regions of the corresponding via openings 740. Also, it is to be understood that multiple exposure tools, especially in panel-level manufacturing, are equipped or can be upgraded to allow for exposure with one or more different wavelengths (e.g., between 365 nm and 403 nm).

For an alternative embodiment, a second seed layer (not shown) may be deposited on both of the via openings 740. For example, the second seed layer is deposited on the exposed top surface of the conductive layer 730 and the exposed portion of the seed layer 735. According to this one embodiment, the second seed layer is a Pd seed layer and/or any other catalytic metals/materials. Accordingly, a conductive material (e.g., Cu or the like) is deposited on the via openings 740 and above the second seed layers to form one or more ZM2VS vias. It should be noted that a second seed layer may not be needed to electrolessly/electrolytically plate metal simultaneously and directly on the conductive layers 730 and 735.

Referring now to FIG. 7D, a conductive material (e.g., Cu or the like) is deposited (or electrolessly/electrolytically grown) on the via openings 740 to form one or more ZM2VS vias 711 and 712 through an electrochemical reaction. For one embodiment, the ZM2VS vias 711-712 may be formed/plated with an electroless (e-less) plating process (or a combination of an e-less plating and an electrolytic plating process—or the like). Accordingly, the ZM2VS via 711 may be electrically coupled to the seed layer 735, and the ZM2VS 712 may be electrically coupled to the conductive layer 730. Note that the top surface of the bottom via 712 may be deposited above and/or below the seed layer 735 (or on the same level/layer as the seed layer 735).

Figure 7E:
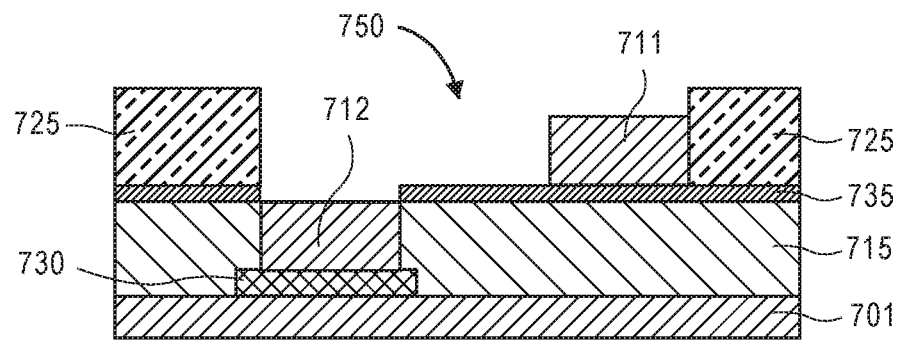
Figure 7F:
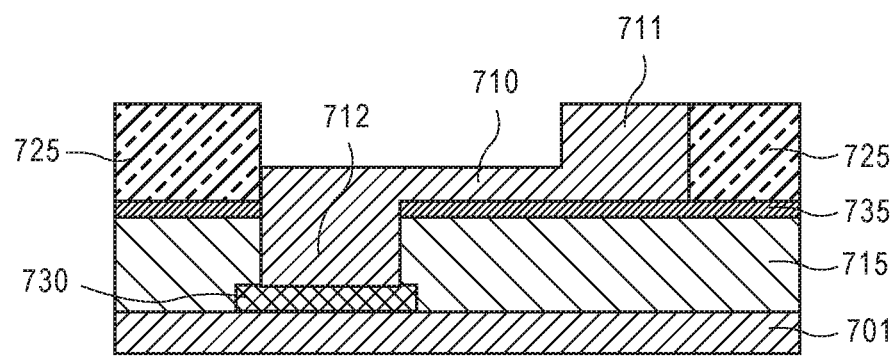

Referring now to FIG. 7E, a second develop step removes the resist region exposed with the lowest dose from the resist layer 725. As such, after the second development on the resist layer 725, the third region 725c is removed from the resist layer 725, and thus the resist layer 725 is patterned to provide a line opening 750 to expose a portion of the seed layer 735 for the formation of a ZM2VS line/trace (e.g., ZM2VS line 710 as shown in FIG. 7F). For example, after the e-less plating step of the ZM2VS vias 711-712 (or the combination of e-less and electrolytic plating step), the third region 725c is developed away (i.e., this resist region has the longest development time) to expose the ZM2VS vias 711-712 and the seed layer 735 for the formation of the ZM2VS line.

Referring now to FIG. 7F, the conductive material is deposited above and around the line opening 750, the seed layer 735, and the ZM2VS vias 711-712 to form the ZM2VS line 710. After depositing the conductive material, the ZM2VS top via 711 is now finalized and the ZM2VS line 710 is now formed above the exposed seed layer 735. For one embodiment, the ZM2VS line 710 may be formed using the e-less plating process (or at least one of the e-less plating process and the electrolytic plating process). Note that the top via 711 (or the bottom via) may have a slanted edge or a similar tapered shape (not shown) coupled to the line 710.

Figure 7G:
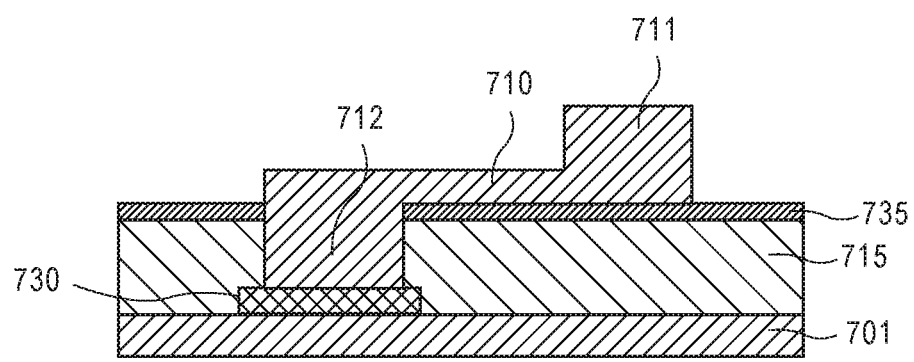
Figure 7H:
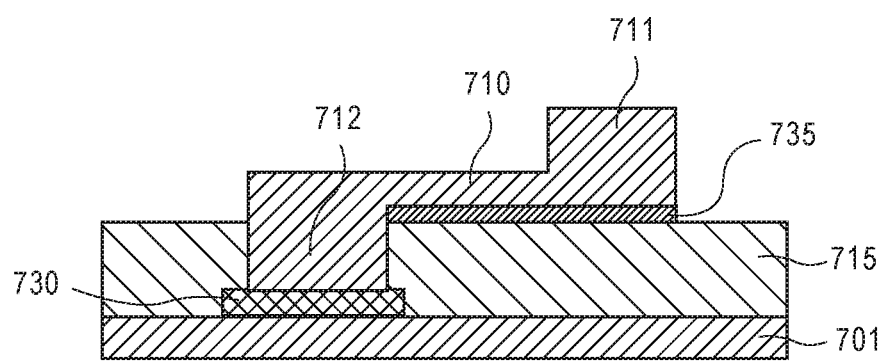

As shown in FIG. 7G, the resist layer 725 is stripped, and accordingly the remaining portions of the seed layer 735 are removed, as shown in FIG. 7H. According to one embodiment, the seed layer 735 may be removed with a seed etching process. For one embodiment, the ZM2VS line/vias 710-712 may be formed prior to the formation of a second dielectric layer (not shown) which may be deposited above the ZM2VS line/vias 710-712. This first formation of the ZM2VS line/vias 710-712 may be referred to as a line via first litho process.

As such, after the removal and etching, the package layer (or device package) has formed the ZM2VS line via using a PID stack and e-less plating, as described herein. For some embodiments, the ZM2VS line via includes a dielectric 715 (e.g., the PID layer) on a conductive pad 730 (or the conductive layer, trace, line/via); a first via 712 on a top surface of the conductive pad 730, where the first via 712 extends vertically through the dielectric 715; a conductive trace 710 on the dielectric 715; and a second via 711 on the dielectric 715, where the conductive trace 710 connects to the first via 712 and the second via 711, wherein the second via 711 connects to an edge of the conductive trace 710 that is opposite from the first via 712 (i.e., each of the vias are formed on opposite edges of the conductive trace). Accordingly, the conductive trace 710 may connect to both a top layer (not shown) with the top via 711 and a bottom layer (or the conductive pad 730) with the bottom via 712 without reducing the line density of the line/vias 710-712, where each of the line/vias have substantially the same (or equal) line densities (i.e., the conductive trace 710 can be connected to the zero-misaligned vias 711-712 in both directions (above and/or below the conductive trace 710)). Note that the vias may be formed in both directions, the same directions, one direction, etc. (e.g., as shown in FIG. 2A, the vias may be formed in one or more directions, including a "T" shaped line/vias coupled in both directions to a bottom and a top surface).

For an additional embodiment, a die (e.g., die 302 as shown in FIG. 3B) may be attached (or disposed) on a FLI pad (e.g., FLI package layer 345 as shown in FIG. 3B), wherein the FLI pad connects (or electrically coupled) to a second via (e.g., via 711 of FIG. 7H), while an interconnect package layer (e.g., interconnect package layer 340 of FIG. 3B) may be deposited on a SLI pad, wherein the SLI pad connects to a first via (e.g., via 712 of FIG. 7H).

Figure 9A:
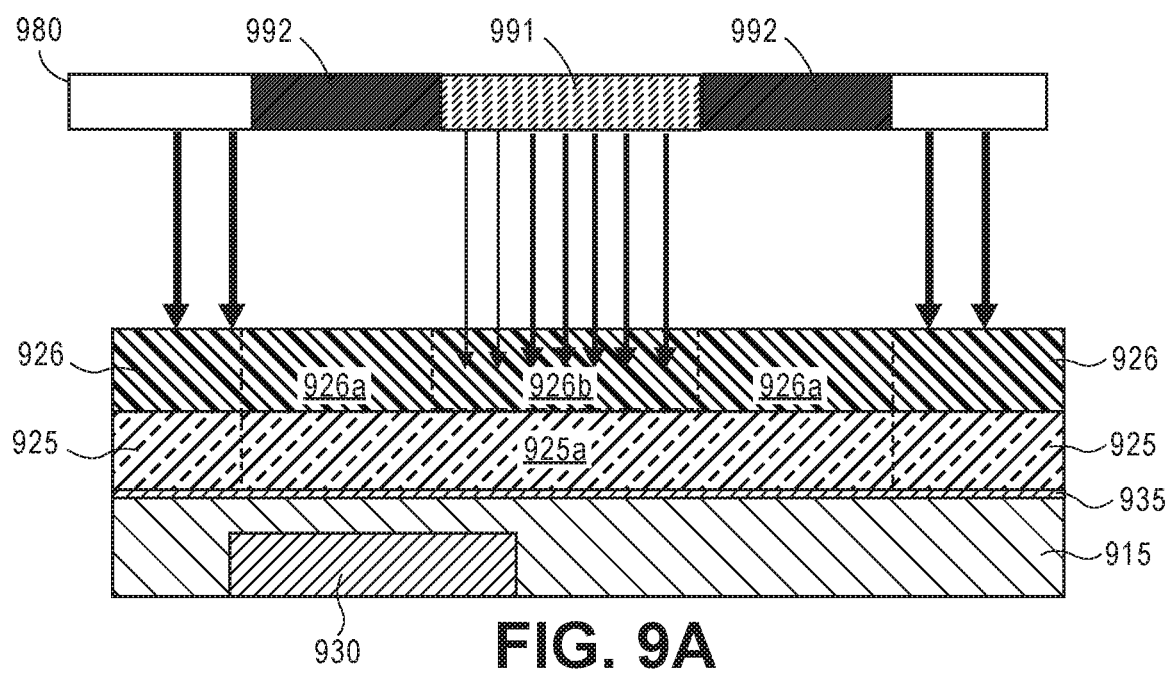
FIGS. 9A-9L are a process flow illustrating a method of forming a conductive trace with zero-misaligned vias using a buildup dielectric film stack and electroless plating, according to some embodiments.
Figure 9B:
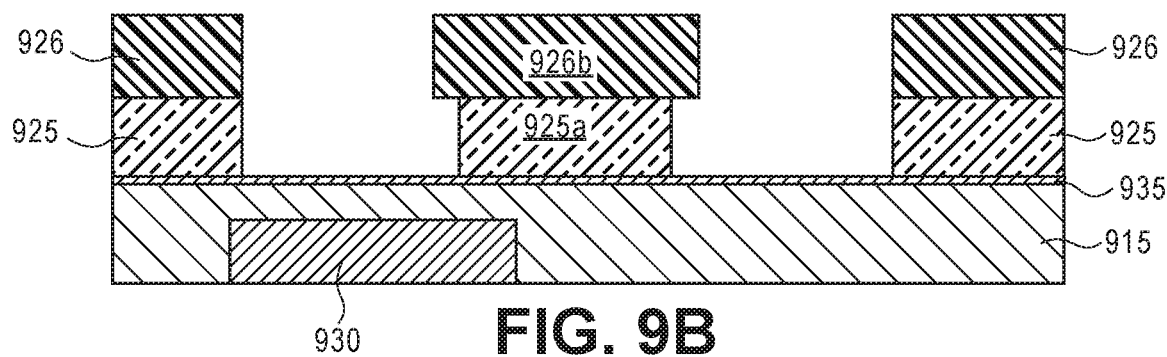
Figure 9C:
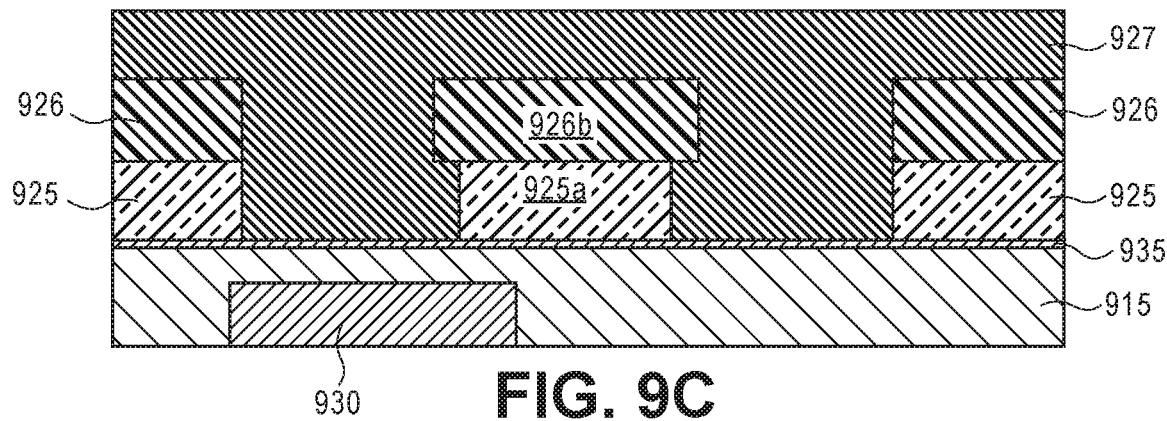
Figure 9D:
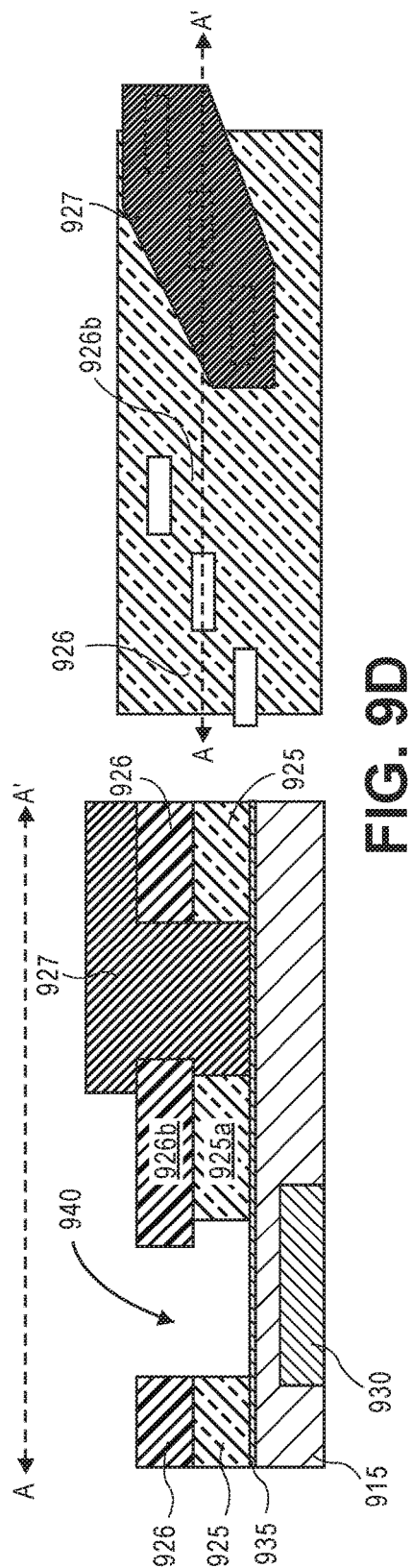
Figure 9E:
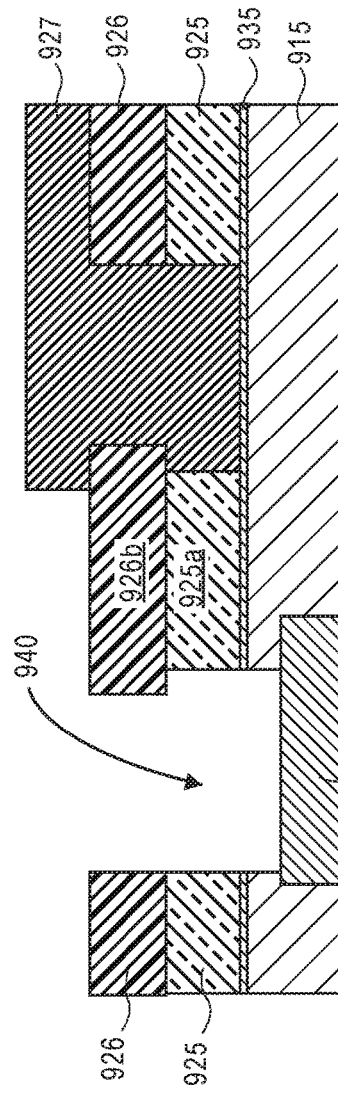
Figure 9F:
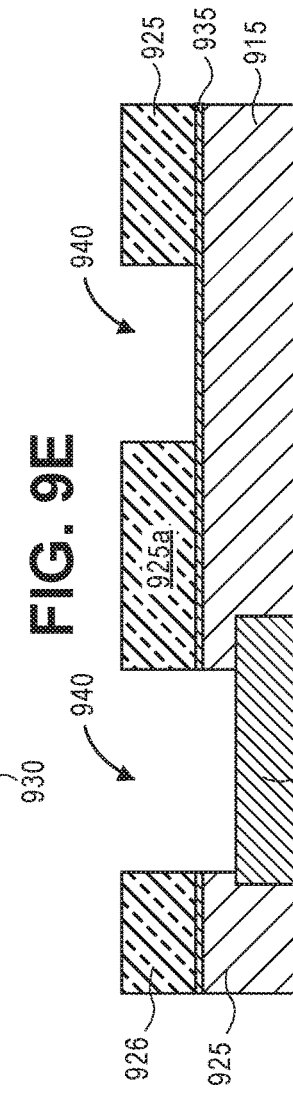
Figure 9G:
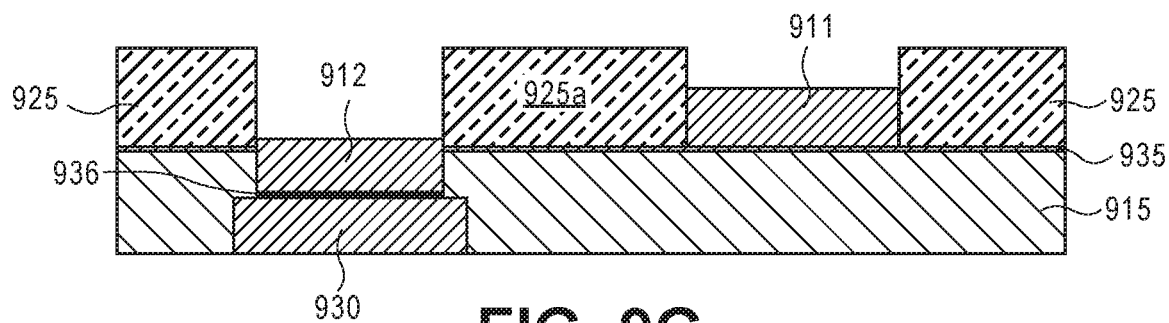
Figure 9H:
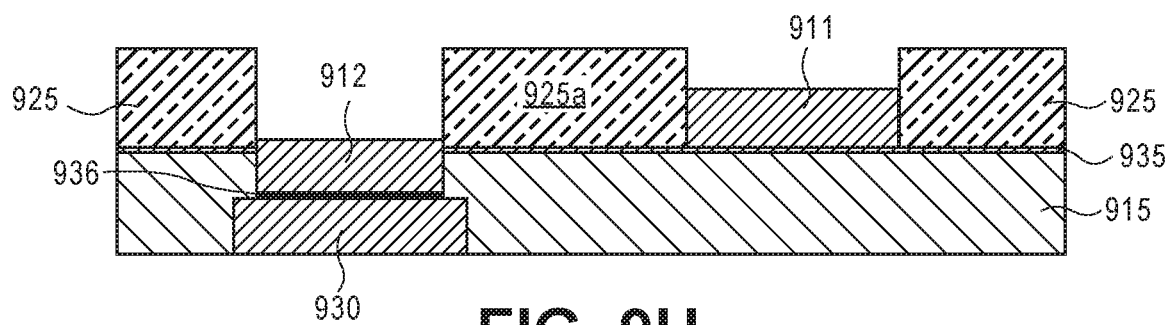
Figure 9I:
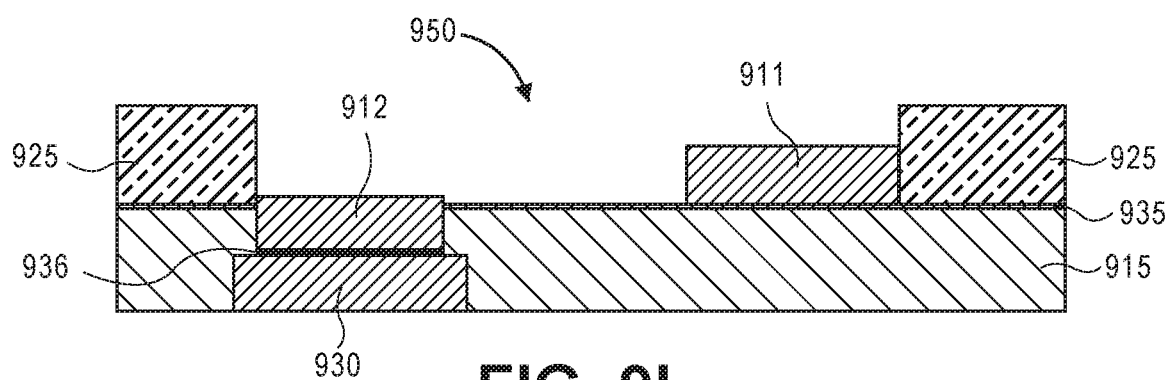
Figure 9J:
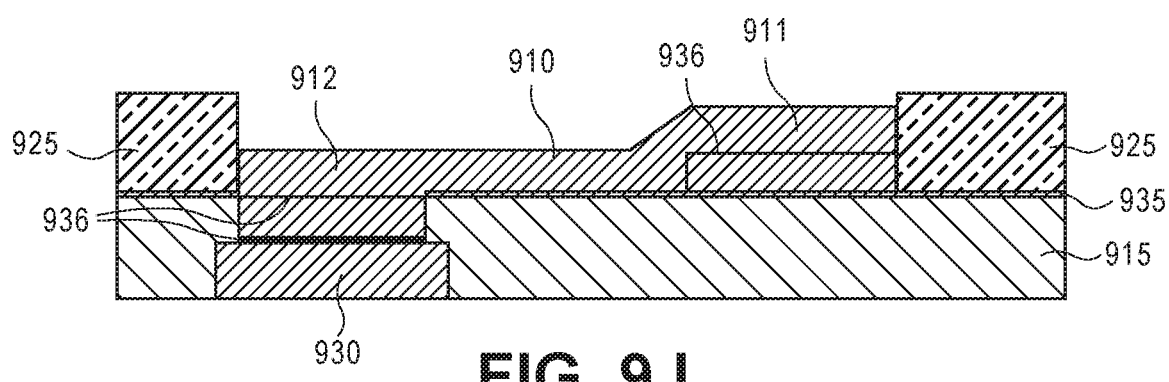

For an additional embodiment, prior to the formation of the conductive trace 710, the first via 712, and the second via 711, the ZM2VS line via may have a seed 735 (e.g., an e-less metal seed layer) on the dielectric 715, where the seed 735 electrically couples to the conductive trace 710; a first seed (not shown) (e.g., a first seed 936 as shown in FIG. 9G) on the top surface of the conductive pad 730, where the first via 712 is on the first seed; and a second seed (not shown) (e.g., a first seed 936 as shown in FIG. 9J) on a top surface of the first via 712, the second seed on one or more surfaces of the second via (i.e., the second seed may cover the top surface and at least one exposed edge of the initial second via—prior to the deposition of the conductive material forming the conductive trace), where the conductive trace 710 is on the second seed disposed on both the first and second vias 712 and 711, where the conductive trace 710 connects to the first via 712 and the second via 711, where the second via 711 connects to an edge of the conductive trace 710 that is opposite from the first via 712. According to this alternative embodiment, the second seed may be disposed (or sandwiched) between a top portion and a bottom portion of the second via 711 (e.g., as shown in FIG. 9J).

Note that the zero-misalignment two via stack formed with the process flow of FIGS. 7A-7H may include fewer or additional steps and/or packaging components based on the desired packaging design.

FIGS. 8A-8H are a process flow illustrating a method of forming a conductive trace with zero-misaligned vias using a negative-PID film stack with electroless plating, according to some embodiments. These embodiments as shown with respect to FIGS. 8A-8H provide a pathway including a single exposure step to develop a ZM2VS that improves (and simplifies) the litho patterning processing for any desired packaging needs, including, but not limited to, I/O density reduction, routing density improvement, and increased packaging designs. The ZM2VS formed with the process flow of FIGS. 8A-8H is similar to (and may be used as) the ZM2VS conductive traces/vias illustrated in FIGS. 1-6.

One such embodiment is illustrated and described based on FIGS. 8A-8H, which illustrates cross-sectional views of a package layer used to form the ZM2VS. In the illustrated embodiments, the formation of the ZM2VS is shown, however it is to be appreciated that additional features, such as additional lines, vias, and/or pads, may be formed at the same time and with the same processing operations, according to the embodiments described herein.

Figure 8A:
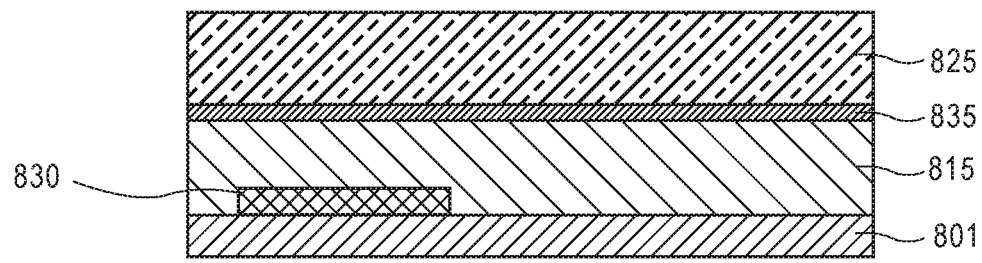
FIGS. 8A-8H are a process flow illustrating a method of forming a conductive trace with zero-misaligned vias using a negative-PID film stack with electroless plating, according to some embodiments.

Referring now to FIG. 8A, embodiments of the process flow include a conductive layer 830 deposited on a substrate 801, where the conductive layer 830 has one or more pads (or traces) deposited on the substrate 801. For one embodiment, the package layer of FIG. 8A illustrates at least one interconnect layer that includes the conductive layer 830 and the substrate 801. According to one embodiment, the conductive layer 830 may include at least one of existing pads, vias, and lines/traces that are formed with at least one of an e-less metal seed layer and an electrolytic metal seed layer. For example, the conductive layer 830 may facilitate the foundation of the zero-misalignment two via stack. In addition, the substrate 801 may include, but is not limited to, a package, a motherboard, and PCB.

According to some embodiments, a PID layer 815 is deposited above and around the conductive layer 830 and the substrate 801, and then a seed layer 835 is deposited on the PID layer 815. For one embodiment, the PID layer 815 may be a low-dose sensitive, negative-tone PID. For example, the PID layer 815 may have a low-dose sensitivity compared to a resist layer 825, so that a region (e.g., dose region 825a of FIG. 8B) may be developed through the resist layer 825 while also exposing and cross-linking the respective region of the PID layer 815 (i.e., the region below the dose region 825a of FIG. 8B).

For one embodiment, the seed layer 835 may not be transparent to any light, for example, from any light source of any lithography exposure tool. For example, the seed layer 835 may be an e-less $Pd^0$ metal catalyst layer. For alternative embodiments, the seed layer 835 can include an electrolytic metal seed layer and/or one or more different types of metal seed catalysts or metal-based coordinated complexes (i.e., self-assembled monolayers with coordinated or complexed seed catalysts), as long as the metal seed catalysts or complexes are transparent to exposure conditions. Note that, based on the process flow described in FIGS. 8A-8H, the seed layer 835 uses an e-less plating process to be deposited on the PID layer 815.

According to some embodiments, the resist layer 825 is deposited on the seed layer 835. For one embodiment, the resist layer 825 may be a dose sensitive resist that can be chemically amplified. For additional embodiments, the resist layer 825 is a negative-tone resist layer that is stacked on the seed layer 835 and the PID layer 815, respectively. The resist layer 825 may be deposited with, but not limited to, a lamination, spray coating, spin coating, ink-jet printed, or other known deposition methods.

Figure 8B:
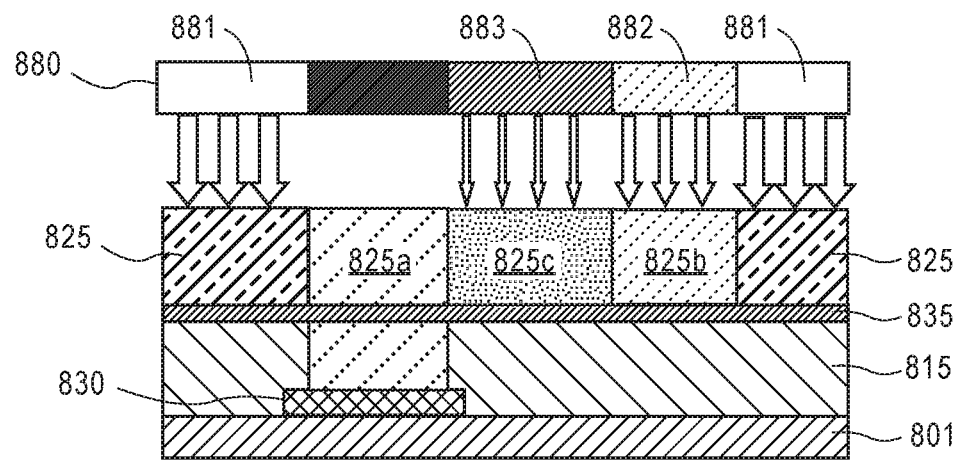

Referring now to FIG. 8B, the resist layer 825 may be developed and exposed with a mask 880 (e.g., a multi-tone mask) that has one or more intensity regions 881-883 (note that the mask can be implemented with a specified number intensity regions based on the desired packaging design and/or the desired patterning for a ZM2VS line/via).

For example, the one or more intensity regions 881-883 of the mask 880 may include four intensity regions, such as a dark region (shown as dark block on the mask 880), one or more light regions 881, a first gray region 882, and a second gray region 883, where for example the second gray region 883 may allow more light exposure than the first gray region 882. Accordingly, exposing light through mask 880 (e.g., to a light source, a radiation source, a mercury arc, etc.) adequately transfers images onto resist layer 825 to produce one or more dose levels shown as 825a-c. Each of the dose levels 825a-c has an individual development-time requirement based on the level of exposure.

For one embodiment, the resist layer 825 is now imprinted with a first region 825a that has an unexposed region, a second region 825b that has a medium dose, and a third region 825c that has a lowest dose. Note that the large arrows of FIG. 8A illustrate the highest dose regions (induce cross-linking) of the resist layer are labelled 825, e.g., the highest does regions are on opposite ends/edges of the resist layer 825 as shown in one embodiment, while the lowest dose region has no arrows as this region is unexposed with no light (shown as a dark block on the mask above the resist region 825a). Note that one or more features may have been omitted or simplified in order to not obscure the illustrative implementations. According to one embodiment, the first region 825a is printed to have an unexposed dose region that vertically extends through the resist layer 825 and the PID layer 815 to the top surface of the conductive layer 830.

Figure 8C:
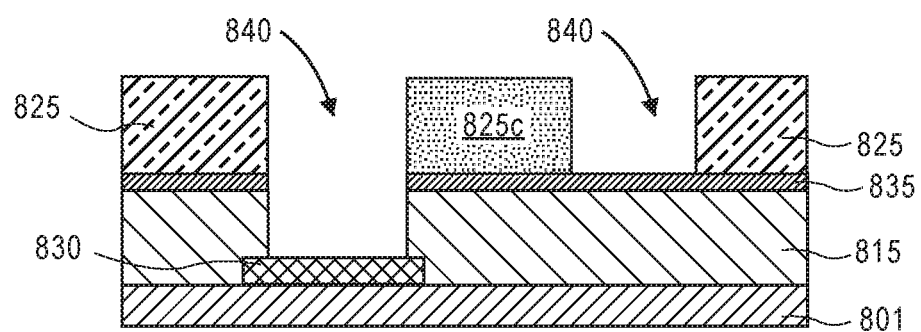

Referring now to FIG. 8C, for one embodiment, a first develop step removes only the resist regions exposed with the unexposed and lowest doses from the resist layer 825 and the PID layer 815. As such, after the first development on the resist layer 825 and the PID layer 815, the first region 825a and the second dose region 825b are simultaneously developed from the resist layer 825 and the PID layer 815, where the resist layer 825, the seed layer 835, and the PID layer 815 are thus patterned to provide one or more via openings 840 to expose a portion of the seed layer 835 for the formation of a ZM2VS via (e.g., ZM2VS via 812 as shown in FIG. 8D) and the top surface of the conductive layer 830 for the formation of a ZM2VS via (e.g., ZM2VS via 811 as shown in FIG. 8D).

According to one embodiment, after the first development step, the unexposed regions of the resist region 825 and PID layer 815 is developed to provide a via opening 840 for a bottom via that exposes the top surface of the conductive layer 830, while the lowest dose exposed region (825b of the resist layer 825 is developed to provide a via opening 840 for a top via that exposes the portion of the seed layer 835. Note that the first develop step may be implemented selectively in one or more development steps, as desired, to expose and develop the dose regions of the corresponding via openings 840.

For an alternative embodiment, a second seed layer (not shown) may be deposited on both of the via openings 840. For example, the second seed layer is deposited on the exposed top surface of the conductive layer 830 and the exposed portion of the seed layer 835. According to this one embodiment, the second seed layer is a Pd seed layer and/or any other catalytic metals/materials. Accordingly, a conductive material (e.g., Cu or the like) is deposited on the via openings 840 and above the second seed layers to form one or more ZM2VS vias. It should be noted that a second seed layer may not be needed to electrolessly/electrolytically plate metal simultaneously and directly on the conductive layers 830 and 835.

Figure 8D:
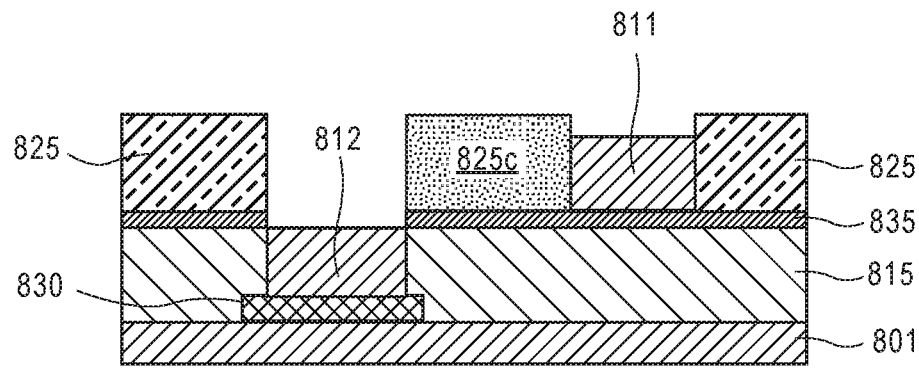

Referring now to FIG. 8D, a conductive material (e.g., Cu or the like) is deposited (or electrolessly/electrolytically grown) on the via openings 840 to form one or more ZM2VS vias 811 and 812 through an electrochemical reaction. For one embodiment, the ZM2VS vias 811-812 may be formed/plated with an e-less plating process (or a combination of an e-less plating and an electrolytic plating process—or the like). Accordingly, the ZM2VS via 811 may be electrically coupled to the seed layer 835, and the ZM2VS 812 may be electrically coupled to the conductive layer 830. Note that the top surface of the bottom via 812 may be deposited above and/or below the seed layer 835 (or on the same level/layer as the seed layer 835).

Figure 8E:
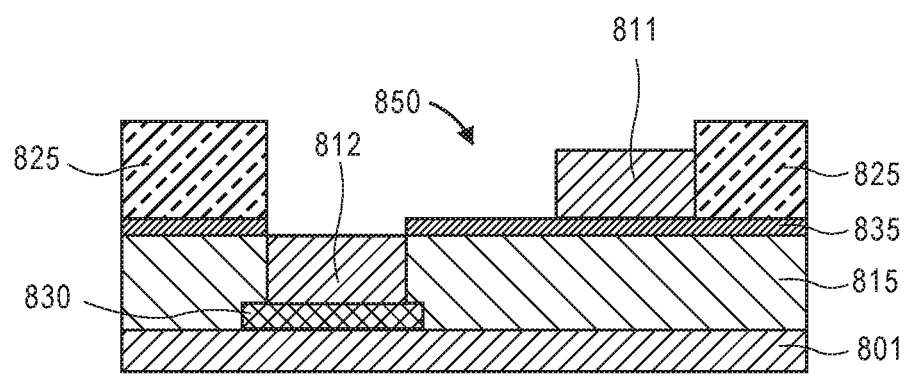
Figure 8F:
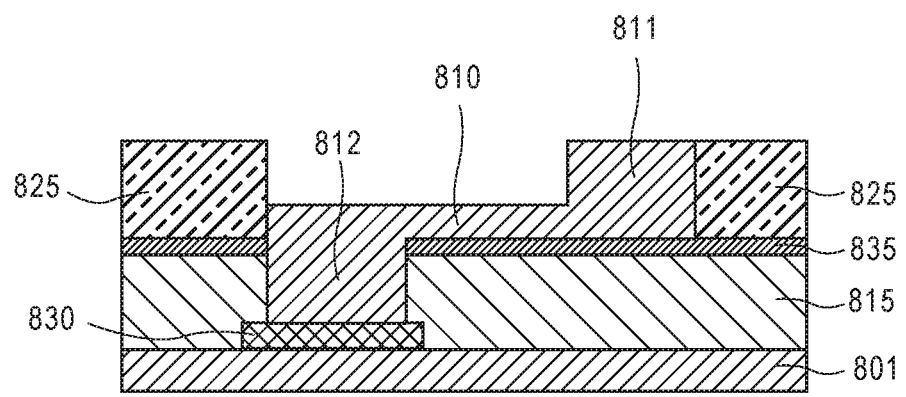

Referring now to FIG. 8E, a second develop step removes the resist region exposed with the lowest dose (i.e., the middle region) from the resist layer 825. As such, after the second development on the resist layer 825, the third region 825c is removed from the resist layer 825, and thus the resist layer 825 is patterned to provide a line opening 850 to expose a portion of the seed layer 835 for the formation of a ZM2VS line/trace (e.g., ZM2VS line 810 as shown in FIG. 8F). For example, after the e-less plating step of the ZM2VS vias 811-812 (or the combination of e-less and electrolytic plating step), the third region 825c is developed away (i.e., this resist region has the longest development time) to expose the ZM2VS vias 811-812 and the seed layer 835 for the formation of the ZM2VS line.

Referring now to FIG. 8F, the conductive material is deposited above and around the line opening 850, the seed layer 835, and the ZM2VS vias 811-812 to form the ZM2VS line 810. After depositing the conductive material, the ZM2VS top via 811 is now finalized and the ZM2VS line 810 is now formed above the exposed seed layer 835. For one embodiment, the ZM2VS line 810 may be formed using the e-less plating process (or at least one of the e-less plating process and the electrolytic plating process). Note that the top via 811 (or the bottom via) may have a slanted edge or a similar tapered shape (not shown) coupled to the line 810.

Figure 8G:
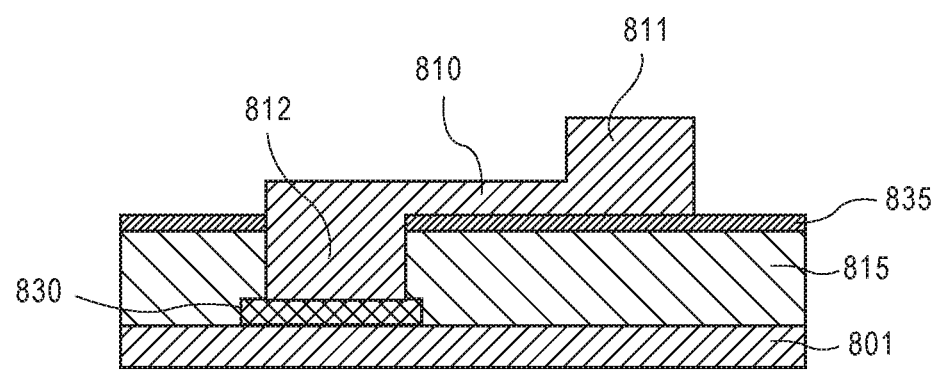
Figure 8H:
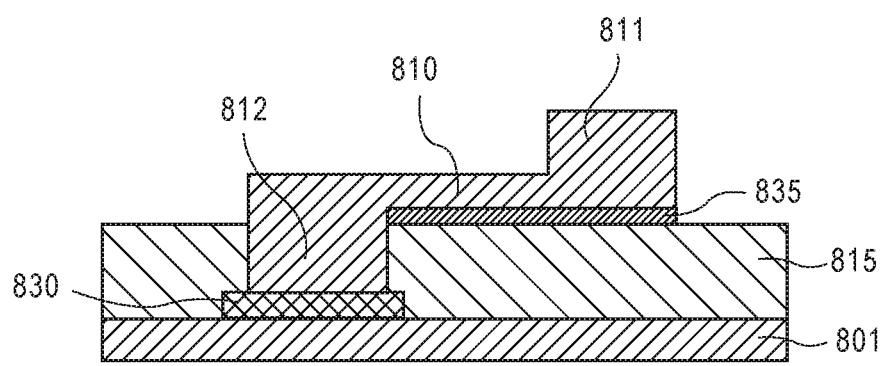

As shown in FIG. 8G, the resist layer 825 is stripped, and accordingly the remaining portions of the seed layer 835 are removed, as shown in FIG. 8H. According to one embodiment, the seed layer 835 may be removed with a seed etching process. For one embodiment, the ZM2VS line/vias 810-812 may be formed prior to the formation of a second dielectric layer (not shown) which may be deposited above the ZM2VS line/vias 810-812.

Note that the zero-misalignment two via stack formed with the process flow of FIGS. 8A-8H may include fewer or additional steps and/or packaging components based on the desired packaging design.

FIGS. 9A-9L are a process flow illustrating a method of forming a conductive trace with zero-misaligned vias using a buildup dielectric film stack and electroless plating, according to some embodiments. These embodiments as shown with respect to FIGS. 9A-9L provide an additional pathway including a single exposure step to develop a ZM2VS that improves (and simplifies) the litho patterning processing for any desired packaging needs, including, but not limited to, I/O density reduction, routing density improvement, and increased packaging designs. The ZM2VS formed with the process flow of FIGS. 9A-9L is similar to the ZM2VS conductive traces/vias illustrated in FIGS. 1-6 (e.g., when the packaging design needs a buildup stack and electroless plating process).

One such embodiment is illustrated and described based on FIGS. 9A-9L, which illustrates cross-sectional views (and a corresponding plan view as shown in FIG. 9D) of a package layer used to form the ZM2VS. In the illustrated embodiments, the formation of the ZM2VS is shown, however it is to be appreciated that additional features, such as additional lines, vias, and/or pads, may be formed at the same time and with the same processing operations, according to the embodiments described herein.

Referring now to FIG. 9A, embodiments of the process flow include a package layer that includes, but is not limited to, a conductive layer 930, a dielectric layer 915, a seed layer 935, a first resist layer 925, a second resist layer 926, and a mask 980. For one embodiment, the dielectric layer 915 is deposited above and around the conductive layer 930. For one embodiment, the package layer of FIG. 9A illustrates at least one interconnect layer that has the conductive layer 930 and the dielectric layer 915. According to one embodiment, the conductive layer 930 may include at least one of existing pads, vias, and lines/traces that are formed with at least one of an e-less metal seed layer and an electrolytic metal seed layer. In one embodiment, the dielectric layer 915 may be a BF layer.

According to some embodiments, several of the advantages of using a BF are its improved mechanical properties (e.g., as compared for example to a PID), which enable (i) a lower coefficient of thermal expansion (CTE) ranging, for example, from 3-30 ppm/° C., and (ii) a higher modulus than PID materials. In addition, BF materials facilitate a lowered total cost as compared to other dielectric materials. Meanwhile, the formation of a BF layer may require a physical removal method, such as RIE, inductively coupled plasma (ICP) RIE, or other plasma etch processes, which may be used on next-generation panel-level processing (or a panel process line).

For some embodiments, the dielectric layer 915 may be a polymer material, such as a polyimide, an epoxy, or a BF. In one embodiment, the dielectric layer 915 may be one layer in a stack that includes a plurality of dielectric layers used to form a build-up structure. As such, the dielectric layer 915 may be formed over another dielectric layer. Additional embodiments may include forming the dielectric layer 915 as the first dielectric layer over, for example, a core material on which the stack is formed.

According to some embodiments, the seed layer 935 is deposited on the dielectric layer 915. The seed layer 935 may not be transparent to any light, for example, from any light source of any lithography exposure tool. For example, the seed layer 935 may be an e-less $Pd^0$ metal catalyst layer. For alternative embodiments, the seed layer 935 can include one or more different types of metal seed catalysts or metal-based coordinated complexes (i.e., self-assembled monolayers with coordinated or complexed seed catalysts), as long as the metal seed catalysts or complexes are transparent to exposure conditions. Note that, based on the process flow described in FIGS. 9A-9L, the finalized package layer may have one or more Pd seed layers that are e-less plated on the conductive layer and the ZM2VS vias (e.g., as shown in FIG. 9J), where the one or more Pd seed layers may be less than a monolayer or one or more monolayers thick of Pd.

For one embodiment, the first resist layer 925 is deposited on the seed layer 935, while the second resist layer 926 is deposited/stacked above the first resist layer 925. For example, the first and second resist layers 925-926 may be laminated when using a dry resist material or slit-coated when using a liquid resist material. For one embodiment, the first and second resist layers 925-926 may include negative-tone dry film resist materials. In addition, the first and second resist layers 925-926 may be deposited in liquid form (and then dry-baked), and the resist layers 925-926 may also be positive-tone. Note, however, that both the first and second resist layers 925-926 may need to be of the same tone.

According to one embodiment, the second resist layer 926 is thinner (or has a smaller z-height) than the first resist layer 925 (i.e., the second resist layer 926 aims to be as thin as possible), while the first resist layer 925 has a thickness that allows for plating of trace and via thickness and accommodates plating variation (e.g., based on the desired design/application the thickness may be as low as 4 um and as high as 50 um). For another embodiment, when using negative-tone resists, the second resist layer 926 has a low dose sensitivity (e.g., a dose sensitivity of 10 $mJ/cm^2$-150 $mJ/cm^2$), and the first resist layer 925 has a high dose sensitivity (e.g., a dose sensitivity of 20 mJ/cm$^2$-450 mJ/cm$^2$). As such, based on this embodiment, the second resist layer 926 has a lower dose sensitivity than the first resist layer 925. Note that, when using positive-tone resists, the resist layers may have the opposite dose sensitivity configuration (as compared to the negative-tone resist layers). Also note, this is an example and doses are not limited to a specified dose or range, but may illustrate the need for a difference in doses between the resist layers 925 and 926.

According to some embodiments, each of the first and seconds resist layers 925-926 has a dose sensitive resist that can be chemically amplified. Furthermore, the stacked resist layers 925-926 are exposed using the mask 980 that has one or more intensity regions 981-982 (note that the mask can be implemented with a specified number intensity regions based on the desired packaging design and/or the desired patterning for a ZM2VS line/via).

For example, the one or more intensity regions 981-982 of the mask 980 may include one or more regions, such as a gray region 981, and one or more dark regions 982 (shown as dark blocks on the mask 980), where for example the one or more regions may be used to expose and develop resists layers to have one or more different dose sensitives (e.g., developable, not developable, etc.). Accordingly, after the mask 980 is exposed onto the first and second resist layer 925-926, one or more dose levels 925a and 926a-b may be printed (or developed) on the first resist layer 925 and the second resist layer 926, respectively, where each of the dose levels 925a and 926a-b may have an individual development-time requirement based on the level of exposure. After the exposure of the mask 980 on the resist layers 925-926, the resist layer 925 may be imprinted (or printed) with a first region 925a, where the first region 925a may have a slower development time as compared to the regions of resist layer 925 that are adjacent to the region 925a, which may have been exposed to the intensity regions 982 of the mask 980. Meanwhile, the resist layer 926 may be printed with one or more first regions 926a, where the first regions 926a may have a faster development time as compared to the second region 925b (e.g., region 926b may be selected as a non-developable region).

Referring now to FIG. 9B, a first develop step may be exposed on the first and second resist layers 925-926 to remove only the resist regions that are developable (e.g., regions 926a and regions below those respective regions). As such, after the first development on the first and second resist layers 925-926, the one or more developable resist regions are removed/developed from the first and second resist layers 925-926, and thus the resist layers 925-926 are patterned to provide one or more openings to expose one or more portions of the seed layer 935.

For one embodiment, after development, the one or more different dose sensitivities (as indicated in FIG. 9B of the negative-tone resists layers 925-926) of the resist regions 925a and 926a-b may assure a specified profile and structure of the first and second resist layers 925-926 (i.e., as shown with the openings/structures developed on the resist layers). Note that this development can be a single step when both resists use the same developer, or a two-step when the resists use different development chemistries. Also note that the resist region 925a of the first resist layer 925 may be developed, for example, but may not be developed on the portion where the conductive trace (e.g., trace 910) will be disposed.

Referring now to FIG. 9C, a third resist layer 927 is deposited above and around the one or more openings of the first and second resist layers 925-926. The third resist layer 927 is further exposed and developed (as illustrated in FIG. 9D). For one embodiment, the third resist layer 927 covers the one or more openings (e.g., via openings 940 of FIGS. 9D and 9E) that may be used to form the ZM2VS vias to connect to the layer(s) above the conductive layer 930 and the seed layer 935. The third resist layer 927 can be at least one of a positive-tone resist and a negative-tone resist.

According to one embodiment, the third resist layer 927 may have a sensitivity to a different wavelength (i.e., a different sensitivity than the sensitivities of the first and second resist layers). For example, the first and second resist layers 925-926 may typically be i-line sensitive (or sensitive to the lowest wavelength that may be available by the exposure tool/mask), while the third resist layer 927 may be sensitive to a longer wavelength such as H-line or G-line. Note that a majority of the panel-level exposure tools are capable of, or can be upgraded to, expose using different wavelengths from their light source (e.g., usually mercury arc).

Referring now to FIG. 9D, a cross-section view of the package layer on the A-A' axis and a corresponding top view of the package layer are shown. As illustrated by the cross-sectional view (on the left), the third resist layer 927 has been exposed and developed to form an opening 940 on both of the first and second resist layer 925-926 that exposes a portion of the seed layer 935. Meanwhile, as illustrated by the top-view (on the right), the third resist layer 927 has been exposed and develop to expose the opening 940 and the resist layer 926 (e.g., a varying portion of the resist region 926a may be exposed or may remain covered based on the desired design), where the third resist layer 927 is now only covering one of the via openings.

Referring now to FIG. 9E, the exposed portion of the seed layer 935 in the opening 940 is then etched. According to one embodiment, the exposed portion of the seed layer 935 may be removed with a seed etching process. Furthermore, after the exposed seed layer 935 is etched, the via opening 940 is etched into the dielectric layer 915 with RIE or other physical etching methods to expose the top surface of the conductive layer 930.

Referring now to FIG. 9F, the third resist layer 927 is exposed and developed to pattern via opening 940 and expose a portion of the seed layer 935. For one embodiment, the third resist layer 927 is removed with a resist stripping chemistry (or other removal processes). As such, after the third resist layer 927 is removed, the resist region 926b and the remaining second resist layer 926 are also removed accordingly, the previously patterned first resist layer 925 is also removed to provide one or more via openings 940 for the formation of one or more ZM2VS vias (e.g., ZM2VS vias 911-912 as shown in FIG. 9G). In one embodiment, the second resist layer 926 may be removed at the same time as the third resist layer 927 (i.e., both resist layers removed in one step), as shown in FIG. 9F. For an alternative embodiment, as shown in FIG. 9H, the second resist layer 926 may be removed with an additional wet or dry-ash removal process/step after the third resist layer 927 was removed and the ZM2VS vias 911-912 are deposited.

Referring now to FIG. 9G, a second seed layer 936 may be deposited on at least one of the via openings 940. For example, the second seed layer 936 is deposited on the exposed top surface of the conductive layer 930. For one embodiment, the second seed layer 936 is a Pd seed layer and/or any other catalytic metal(s) that may be similar to a Pd material(s). Note that the seed layer 935 (or the first seed layer) and the second seed layer 936 may include the same materials/layer or one or more different materials/layers.

Accordingly, a conductive material (e.g., Cu or the like) is grown (or deposited) on above via opening 940 and the second seed layer 936, and above the other via opening 940 and the exposed portion of the seed layer 935, forming one or more ZM2VS vias 912 and 911, respectively. For one embodiment, the ZM2VS vias 911-912 may be formed with an e-less plating process or the like and electrically coupled to the exposed seed layer 935 and the first seed layer 936, respectively. It should be noted that a second seed layer may not be needed to electrolytically plate metal simultaneously and directly on both conductive layers 930 and 935.

Referring now to FIG. 9I, a second develop step is exposed on the first resist layer 925 to remove the resist region 925a. As such, after the second development of the first resist layer 825, the resist region 925a is developed out from the resist layer 925, leaving a line opening 950 to expose a portion of the seed layer 935 (or the first seed layer) for the formation of a ZM2VS line/trace (e.g., ZM2VS line 910 as shown in FIG. 9J).

Referring now to FIG. 9J, the second seed layer 936 may be deposited above the ZM2VS vias 911-912. For example, the second seed layer 936 is deposited on the top surface of the ZM2VS via 912, and the top surface and exposed edge of the ZM2VS via 911. Note that, during this formation of the second seed layer, the second seed layer 936 may also be deposited on/above the dielectric layer 915. Accordingly, the conductive material is then deposited above and around the line opening 950, the first and second seed layers 935-936, and the ZM2VS vias 911-912 to form the ZM2VS line/vias 910-912. As shown with FIG. 9J, the ZM2VS vias 911-912 may include one or more layers of the seed layers 935 and 936. For one embodiment, the ZM2VS line 910 is plated with the e-less plating process (or at least one of the e-less plating process and the electrolytic plating process) on the seed layers 935-936 and/or the dielectric layer 915. After disposing the conductive material, the ZM2VS top via 911 is now finalized and the ZM2VS line 910 is now formed above the exposed seed layer 935. Note that the top via 911 (or the bottom via) may have a slanted edge (or similar tapered shape) coupled to the line 910.

Figure 9K:
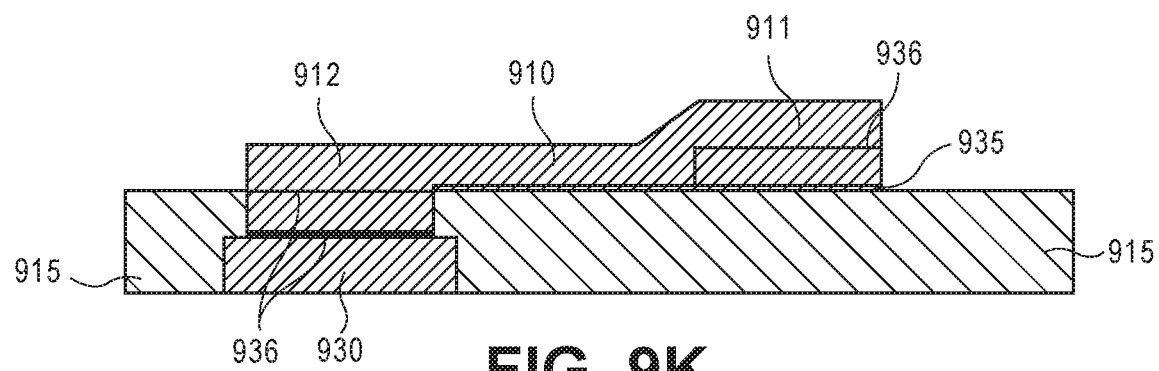

Referring now to FIG. 9K, the first resist layer 925 is removed and then the exposed portions of the seed layer 935 are etched (note that this may be an optional embodiment). According to one embodiment, the seed layer 935 may be removed with a seed etching process. For one embodiment, the ZM2VS line/vias 910-912 are formed prior to the formation of a second dielectric layer.

As such, after the removal, the package layer has formed the ZM2VS line via using electroless plating and a buildup stack with a grayscale mask, as described herein. For some embodiments, the ZM2VS line via includes a dielectric 915 (e.g., the BF layer) on a conductive pad 930; a seed 935 on the dielectric 915; a first seed 936 (e.g., a Pd seed layer deposited on the exposed conductive pad) on a top surface of the conductive pad 930 (as shown in FIG. 9G); a first via 912 on the first seed 936, where the first via 912 extends through the dielectric 915; a second via 911 on the seed 935; a second seed 936 (e.g., the Pd seed layer, which may be deposited after the first seed but may include the same material as the first seed) on a top surface of the first via 912, the second seed 936 on one or more surfaces of the second via 911; and a conductive trace 910 on the seed 935, the conductive trace 935 on the second seed 936 on the first and second vias 912 and 911, where the conductive trace 910 connects to the first via 912 and the second via 911, and where the second via 911 connects to an edge of the conductive trace 910 that is opposite from the first via 912.

Accordingly, the conductive trace 910 may connect to both a top layer (not shown) with the top via 911 and a bottom layer (or the conductive pad 930) with the bottom via 912 without reducing the line density of the line/vias 910-912 (i.e., the conductive trace 910 can be connected to the zero-misaligned vias 911-912 in both directions (above and/or below the conductive trace 910)).

Figure 9L:
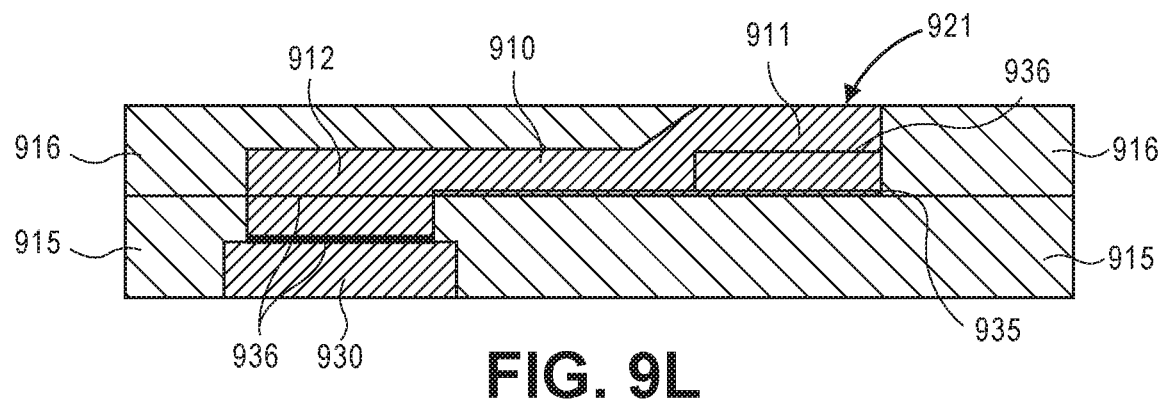

Referring now to FIG. 9L, a second dielectric layer 916 is deposited over the exposed ZM2VS vias 911-912 and ZM2VS conductive trace 910. For one embodiment, the second dielectric layer 916 (e.g., a BF layer) may be formed with any suitable process, such as lamination, spray or spin coating and curing. For one embodiment, the second dielectric layer 916 is formed to a thickness that may entirely cover a top surface 921 of the ZM2VS via 911. For example, as opposed to layer formation on crystalline structures (e.g., silicon substrates), each of the dielectric layers may not be highly uniform. Accordingly, the second dielectric layer 916 may be formed to a thickness that is greater than the ZM2VS via 911 to ensure that the proper thickness is reached across the entire substrate. When the second dielectric layer 916 is formed above the ZM2VS via 911, a via reveal process (or a controlled etching process) may be used to expose the top surface 921 of the via 911, as illustrated in FIG. 9L. The via reveal process may include mechanical or chemical-mechanical polishing/removing.

In one embodiment, the dielectric removal process may include a wet etch, a dry etch (e.g., a plasma etch), a wet blast, or a laser ablation (e.g., by using excimer laser). According to one additional embodiment, the depth controlled dielectric removal process may be performed only proximate to the ZM2VS via 911. For example, laser ablation of the second dielectric layer 916 may be localized proximate to the location of the via 911. In some embodiments, the thickness of the second dielectric layer 916 may be minimized in order to reduce the etching time required to expose the via 911. In alternative embodiments, when the thickness of the dielectric can be well controlled, the via 911 may extend above the top surface of the second dielectric layer 916 and the controlled dielectric removal process may be omitted.

Note that the zero-misalignment two via stack formed with the process flow of FIGS. 9A-9L may include fewer or additional steps and/or packaging components based on the desired packaging design.

Figure 10A:
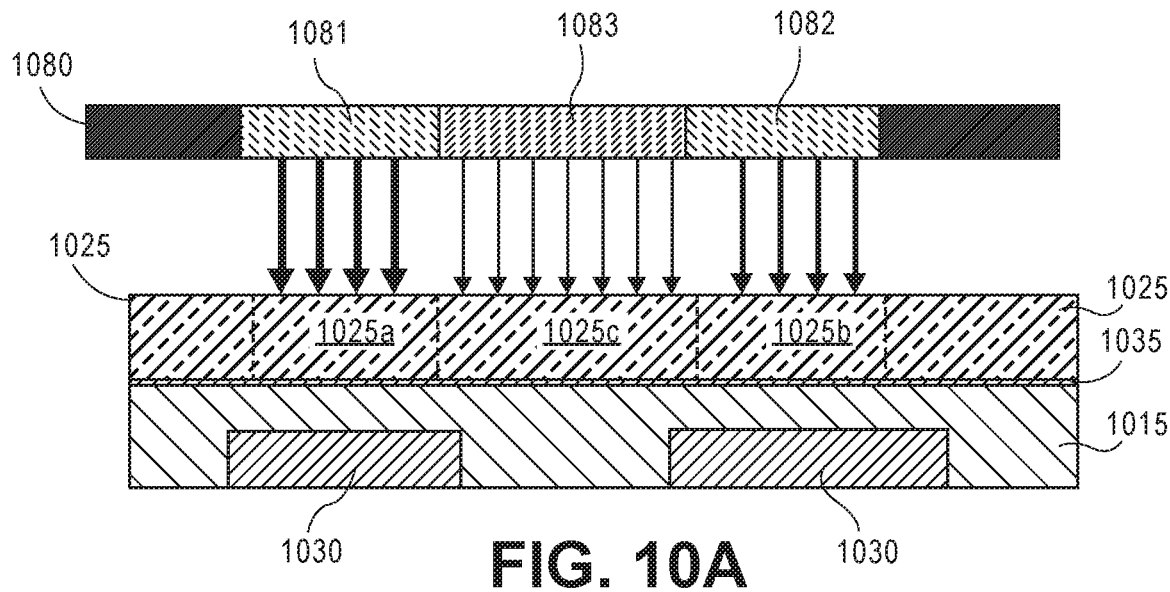
FIGS. 10A-10J are a process flow illustrating a method of forming a conductive trace with zero-misaligned vias using a dose selective resist, a multi-tone mask, and electroless plating, according to some embodiments.

FIGS. 10A-10J are a process flow illustrating a method of forming a conductive trace with zero-misaligned vias using a dose selective resist, a multi-tone mask, and electroless plating, according to some embodiments. These embodiments as shown with respect to FIGS. 10A-10J provide an additional process flow that implements dose selective resist and multiple development passes with a multi-tone mask (e.g., mask 1080 as shown in FIG. 10A). One of the advantages of this process flow is that it simplifies the manufacturing process by using a dose sensitive resist that can be chemically amplified and is typically positive-tone (note that the resist may also be a negative-tone). This allows for less assembly steps, including a single exposure, a single development, and a resist removal chemistry.

These embodiments as shown with respect to FIGS. 10A-10H provide an additional patterning step to develop a ZM2VS stack, as described herein. The ZM2VS formed with the process flow of FIGS. 10A-10J is similar to the ZM2VS conductive traces/vias illustrated in FIGS. 1-6. One such embodiment is illustrated and described based on FIGS. 10A-10J, which illustrates cross-sectional views of a package layer used to form the ZM2VS. In the illustrated embodiments, the formation of the ZM2VS is shown, however it is to be appreciated that additional features, such as additional lines, vias, and/or pads, may be formed at the same time and with the same processing operations, according to the embodiments described herein.

Referring now to FIG. 10A, embodiments of the process flow include a dielectric layer 1015 is deposited on a conductive layer 1030, where the conductive layer 1030 has one or more pads surrounded by the dielectric layer 1015. According to one embodiment, the conductive layer 1030 may include at least one of existing pads, vias, and lines/traces that are formed with at least one of an e-less metal seed layer and an electrolytic metal seed layer. In one embodiment, the dielectric layer 1015 may be a BF layer. For one embodiment, the dielectric layer 1015 may be one layer in a stack that includes a plurality of dielectric layers used to form a build-up structure. As such, the dielectric layer 1015 may be formed over another dielectric layer. Additional embodiments may include forming the dielectric layer 1015 as the first dielectric layer over, for example, a core material on which the stack is formed.

According to some embodiments, a seed layer 1035 is deposited on the dielectric layer 1015. For one embodiment, the seed layer 1035 may not be transparent to any light, for example, from any light source of any lithography exposure tool. For one embodiment, the seed layer 1035 may be a Pd seed layer using an e-less plating process to be deposited on the dielectric layer 1015.

For some embodiments, a resist layer 1025 is deposited on the seed layer 1035. For example, the resist layer 1025 may be laminated when using a dry resist material or slit-coated when using a liquid resist material. For one embodiment, the resist layer 1025 is a dose sensitive resist that can be chemically amplified. For additional embodiments, the resist layer 1025 may be positive tone, but may also be negative tone. As such, the resist layer 1025 may be exposed with a mask 1080 (e.g., a multi-tone mask with four regions) that has one or more intensity regions 1081-1083.

For example, the one or more intensity regions 1081-1083 of the mask 1080 may include four intensity regions, such as a dark region (shown as dark blocks on the mask 1080), a light region 1081, a first gray region 1082, and a second gray region 1083, where for example the second gray region 1083 may be darker (and thus allows less light exposure) than the first gray region 1082. Accordingly, exposing light through mask 1080 (e.g., to a light source, a radiation source, a mercury arc, etc.) adequately transfers images onto resist layer 1025 to produce one or more dose levels shown as 1025a-c. Each of the dose levels 1025a-c has an individual development-time requirement based on the level of exposure. After the exposure of the mask 1080 on the resist layer 1025, the resist layer 1025 is now imprinted with a first region 1025a that has a highest dose and a faster/shorter development time, a second region 1025b that has a medium dose and a slower development time, and a third region 1025c that has a lowest dose and a slowest development time. Note that the unexposed regions of the resist layer are labelled 1025, e.g., the unexposed regions are on opposite ends/edges of the resist layer 1025 as shown in one embodiment.

Figure 10B:
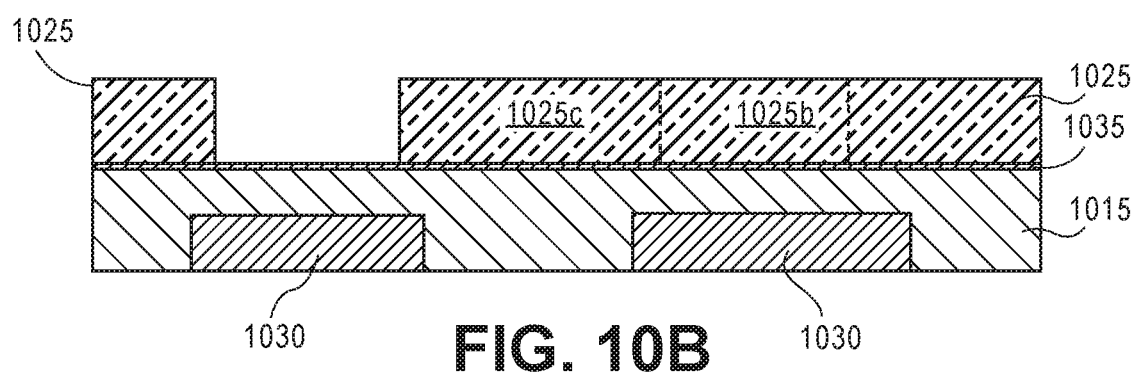

Referring now to FIG. 10B, for one embodiment, a first develop step removes only the resist region exposed with the highest dose from the resist layer 1025. As such, after the first develop exposure on the resist layer 1025, the first region 1025a is removed from the resist layer 1025, where the resist layer 1025 is thus patterned to provide an opening to expose a portion of the seed layer 1035 for the formation of a ZM2VS via (e.g., ZM2VS via 1012 as shown in FIG. 10E).

Figure 10C:
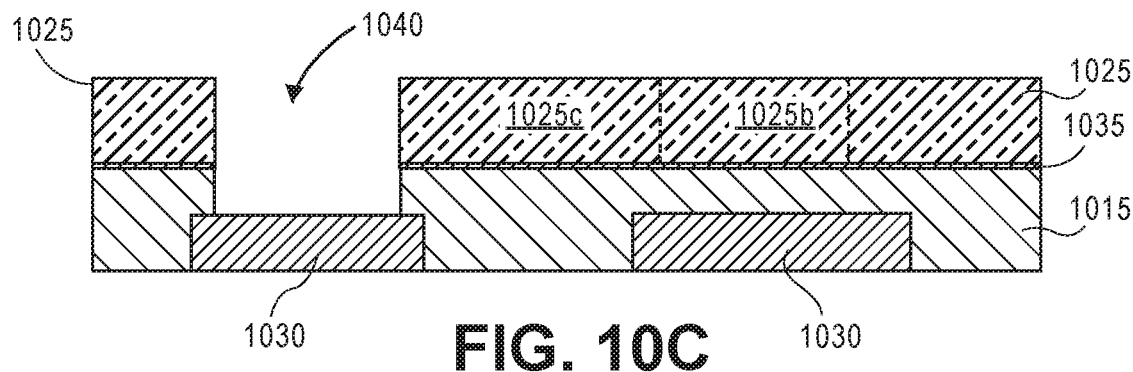

Referring now to FIG. 10C, the exposed portion of the seed layer 1035 is then etched and thus subsequently exposing a portion of the dielectric layer 1015. According to one embodiment, the exposed portion of the seed layer 1035 is removed with a seed etching process, and then the dielectric layer 1015 is removed with RIE (or a similar removal process). Accordingly, after the removal of the seed layer 1035, the exposed region of the dielectric layer 1015 is removed and patterned to provide a via opening 1040 that exposes a top surface of the conductive layer 1030. For one embodiment, the dielectric layer 1015 forms the bottom via opening 1040 to the existing conductive layer 1030.

Figure 10D:
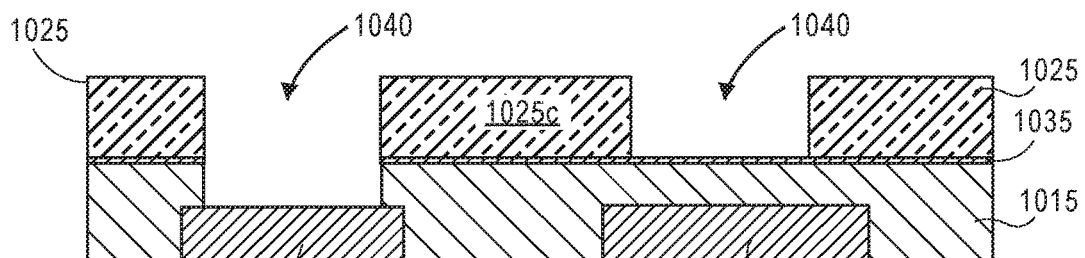

Referring now to FIG. 10D, a second develop step is exposed on the resist layer 1025 to remove only the resist region exposed with the medium dose. As such, after the second development on the resist layer 1025, the first region 1025b is removed from the resist layer 1025, where the resist layer 1025 is thus patterned to provide an opening to expose a portion of the seed layer 1035 for the formation of a ZM2VS via (e.g., ZM2VS via 1011 as shown in FIG. 10E).

Figure 10E:
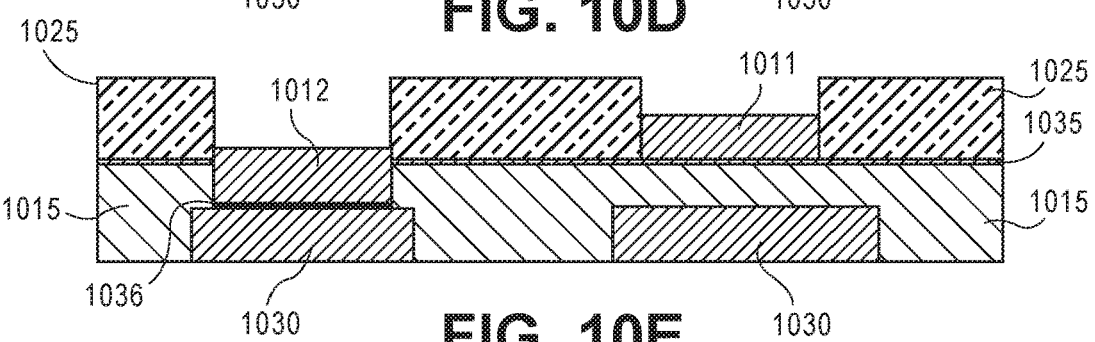

Referring now to FIG. 10E, a second seed layer 1036 may be deposited on at least one of the via openings 1040. For example, the second seed layer 1036 is deposited on the exposed top surface of the conductive layer 1030. For one embodiment, the second seed layer 1036 is a Pd seed layer and/or any other catalytic metal(s) that may be similar to a Pd material(s). Note that the seed layer 1035 (or the first seed layer) and the second seed layer 1036 may include the same materials/layer or one or more different materials/layers. Accordingly, a conductive material (e.g., Cu or the like) is deposited above via opening 1040 and the second seed layer 1036, and above the other via opening 1040 and the exposed portion of the seed layer 1035, forming one or more ZM2VS vias 1012 and 1011, respectively. For one embodiment, the ZM2VS vias 1011-1012 may be formed with an e-less plating process (or the like) and electrically coupled to the exposed seed layer 1035 and the first seed layer 1036, respectively. Note that the top surface of the bottom via 1012 may be deposited above and/or below the seed layer 1035 (or on the same level/layer as the seed layer 1035). It should be noted that a second seed layer may not be needed to electrolytically plate metal simultaneously and directly on both conductive layers 1030 and 1035.

Figure 10F:
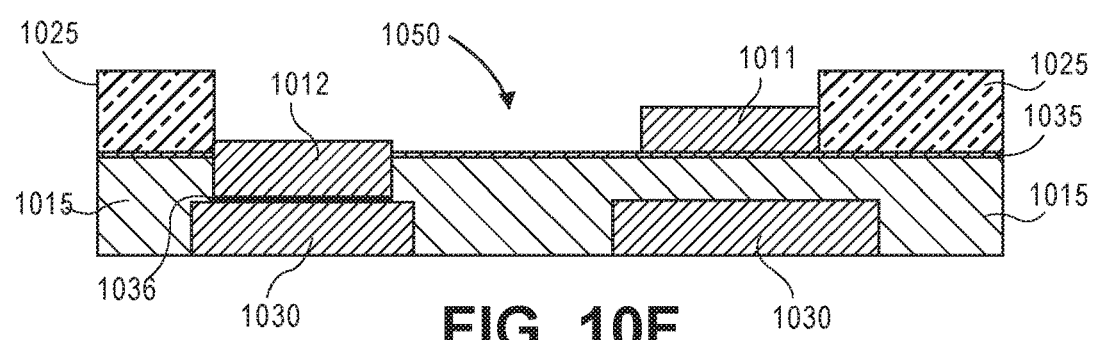
Figure 10G:
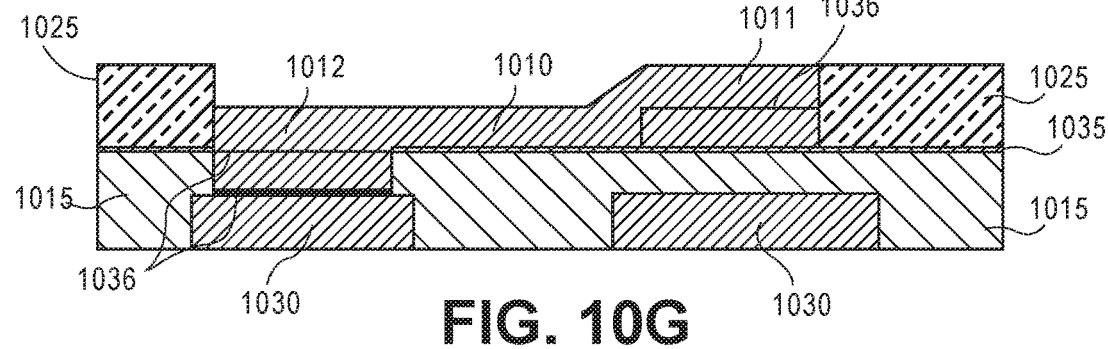

Referring now to FIG. 10F, a third develop step is exposed on the resist layer 1025 to remove the resist region exposed with the lowest dose. As such, after the third development on the resist layer 1025, the third region 1025c is removed from the resist layer 1025, and thus the resist layer 1025 is patterned to provide a line opening 1050 to expose a portion of the seed layer 1035 for the formation of a ZM2VS line/trace (e.g., ZM2VS line 1010 as shown in FIG. 10G). For example, after the e-less plating step of the ZM2VS vias 1011-1012, the third region 1025c is developed away (i.e., this resist region has the longest development time) to expose the ZM2VS vias 1011-1012 and the seed layer 1035.

Referring now to FIG. 10G, the second seed layer 1036 may be deposited above the ZM2VS vias 1011-1012. For example, the second seed layer 1036 is deposited on the top surface of the ZM2VS via 1012, and the top surface and exposed edge of the ZM2VS via 1011. Note that, during this formation of the second seed layer, the second seed layer 1036 may also be deposited on/above the dielectric layer 1015. Accordingly, the conductive material is then deposited above and around the line opening 1050, the first and second seed layers 1035-1036, and the ZM2VS vias 1011-1012 to form the ZM2VS line/vias 1010-1012. As shown with FIG. 10G, the ZM2VS vias 1011-1012 may include one or more layers of the seed layers 1035 and 1036. For one embodiment, the ZM2VS line 1010 is plated with the e-less plating process on the seed layers 1035-1036 and/or the dielectric layer 1015. After disposing the conductive material, the ZM2VS top via 1011 is now finalized and the ZM2VS line 1010 is now formed above the exposed seed layer 1035. Note that the top via 1011 (or the bottom via) may have a slanted edge (or similar tapered shape) coupled to the line 1010.

Figure 10H:
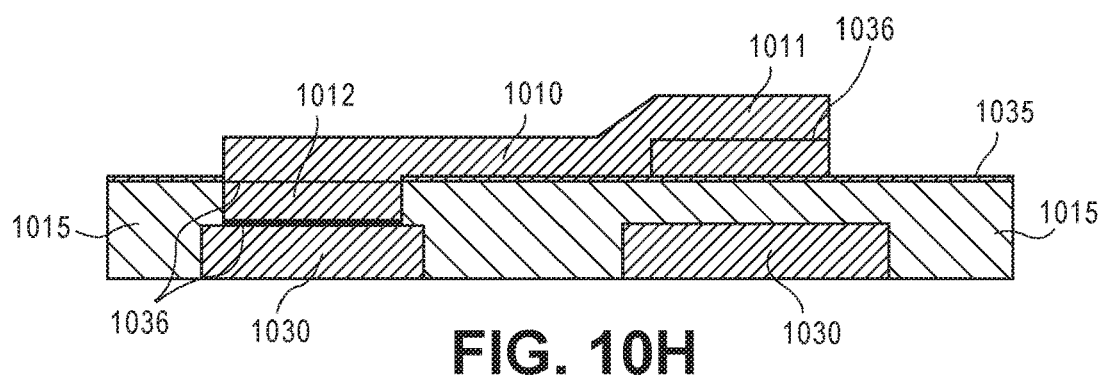
Figure 10I:
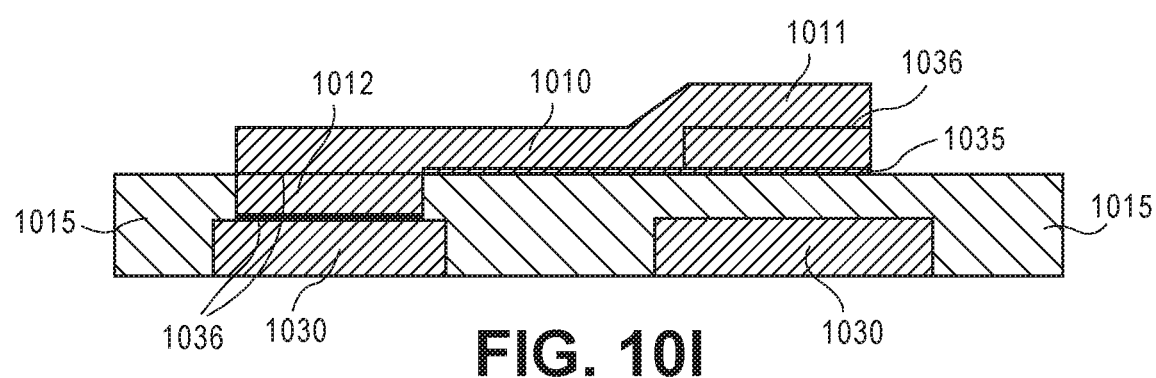

As shown in FIG. 10H, the resist layer 1025 is removed, and then the exposed portions of the seed layer 1035 are etched/removed as shown in FIG. 10I. According to one embodiment, the seed layer 1035 may be removed with a seed etching process.

Figure 10J:
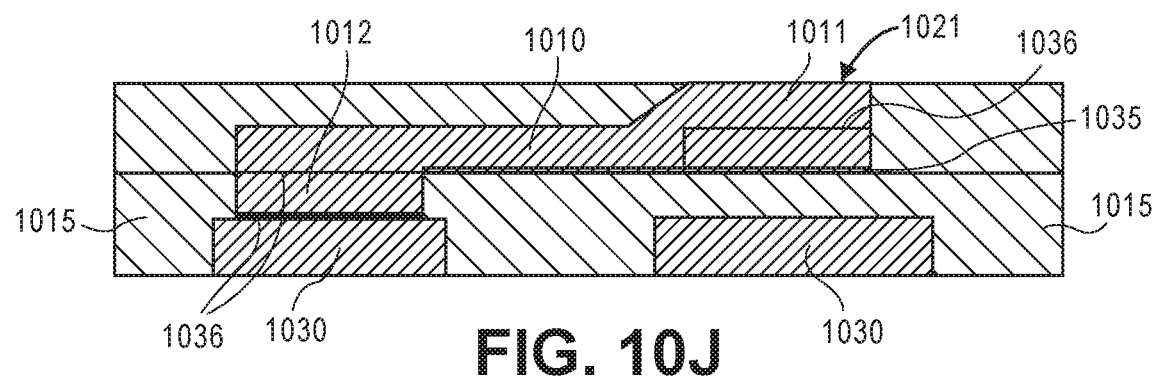

Referring now to FIG. 10J, a second dielectric layer 1016 is deposited over the exposed ZM2VS vias 1011-1012 and ZM2VS conductive trace 1010. For one embodiment, the second dielectric layer 1016 (e.g., a BF layer) may be formed with any suitable process, such as lamination, spray or spin coating and curing. For one embodiment, the second dielectric layer 1016 is formed to a thickness that may entirely cover a top surface 1021 of the ZM2VS via 1011. Accordingly, the second dielectric layer 1016 may be formed to a thickness that is greater than the ZM2VS via 1011 to ensure that the proper thickness is reached across the entire substrate. When the second dielectric layer 1016 is formed above the ZM2VS via 1011, a via reveal process (or a controlled etching process) may be used to expose the top surface 1021 of the via 1011, as illustrated in FIG. 10J. As such, after the removal, the package layer has formed the ZM2VS line via using electroless plating and a buildup stack with a grayscale mask, as described herein.

Note that the zero-misalignment two via stack formed with the process flow of FIGS. 10A-10J may include fewer or additional steps and/or packaging components based on the desired packaging design.

FIGS. 11A-11I are a process flow illustrating a method of forming a conductive trace with zero-misaligned vias using a PID film stack with electroless plating on a substrate, according to some embodiments. These embodiments as shown with respect to FIGS. 11A-11I provide an e-less process to form a free standing ZM2VS that may use a positive-tone resist and dielectric combination on a carrier substrate, such as a transparent substrate (e.g., a glass carrier, a polyethylene terephthalate (PET), a dielectric film/layer, an organic transparent material, and/or any other transparent material).

Figure 11A:
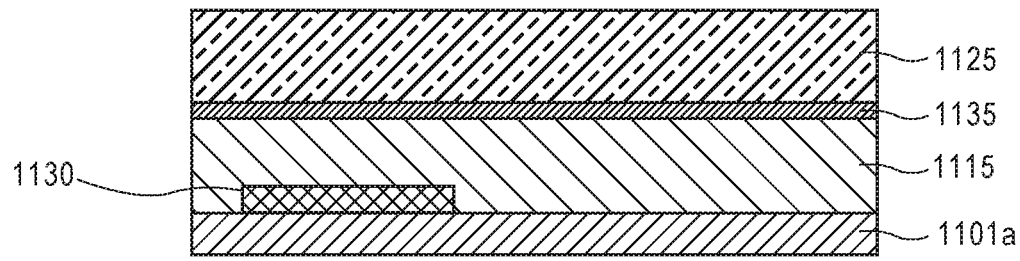
FIGS. 11A-11I are a process flow illustrating a method of forming a conductive trace with zero-misaligned vias using a PID film stack with electroless plating on a substrate, according to some embodiments.
Figure 11B:
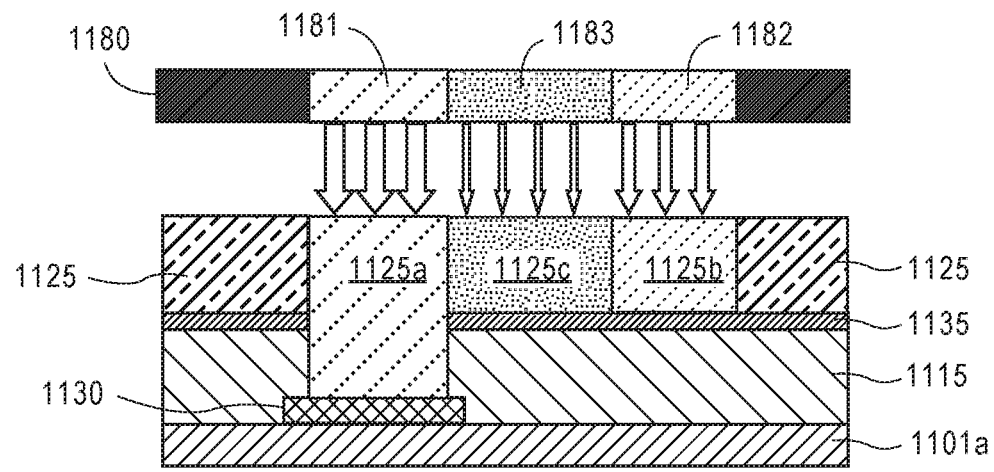

FIGS. 11A-11I illustrate an additional process flow that implements a dose sensitive resist and multiple development passes with a multi-tone mask (e.g., mask 1180 as shown in FIG. 11B). Some of the advantages of this process flow is that it enables a single lithographic exposure step along with several development and plating steps. In particular, these embodiments are compatible with transparent carriers/substrates which allows the implemented/assembled ZM2VS stack to be fully laminated (or transferred) onto any substrate. As such, these embodiments (i) enable a process flow of a zero-misalignment to via stack using a single lithography exposure step (e.g., using a single exposure step with a well-designed grayscale mask), but also further enable (ii) the process flow to be compatible as a free standing stack (or film) that is compatible with transparent carriers, substrates, and/or flexible materials. The ZM2VS formed with the process flow of FIGS. 11A-11I is similar to the ZM2VS conductive traces/vias illustrated in FIGS. 1-6.

One such embodiment is illustrated and described based on FIGS. 11A-11I, which illustrates cross-sectional views of a package layer used to form the ZM2VS. In the illustrated embodiments, the formation of the ZM2VS is shown, however it is to be appreciated that additional features, such as additional lines, vias, and/or pads, may be formed at the same time and with the same processing operations, according to the embodiments described herein.

Referring now to FIG. 11A, according to some embodiments, a conductive layer 1130 is deposited on a substrate 1101a. For one embodiment, the substrate 1101a (or a bottom substrate) may include, but is not limited to, a carrier substrate, a transparent substrate, a glass carrier, a PET, a polydimethylsiloxane (PDMS), a dielectric layer, an organic transparent material, and/or any other transparent material.

Additionally, for one embodiment, a PID layer 1115 is deposited above and around the conductive layer 1130, and then a seed layer 1135 is deposited on the PID layer 1115. For one embodiment, the PID layer 1115 may be deposited with a lamination, spray coating, spin coating, or other known deposition methods. The conductive layer 1130 may include one or more pads (or vias/lines) surrounded by the PID layer 1115. In addition, according to one embodiment, the conductive layer 1130 may include at least one of existing pads, vias, and lines/traces that are formed with at least one of an e-less metal seed layer and an electrolytic metal seed layer.

For one embodiment, the seed layer 1135 may not be transparent to any light, for example, from any light source of any lithography exposure tool. The seed layer 1135 may include a metal catalytic seed layer(s). For one embodiment, the metal catalytic e-less seed layer 1135 includes, but is not limited to, a non-continuous randomly distributed $Pd^0$ metal (e.g., Ag, Au, Ni, etc.) that use an electroless plating process to be deposited on the PID layer 1115, and/or may be deposited on the PID layer 1115 using standard deposition methods. This may ensure that the light exposure through both resist layer 1125 and PID layer 1115 has minimum light dispersive effects from the $Pd^0$ seed metal, but still provides enough coverage to ensure e-less metal growth.

For some embodiments, the resist layer 1125 is deposited on the seed layer 1135. For example, the resist layer 1125 may be laminated when using a dry resist material or slit-coated when using a liquid resist material. For one embodiment, the resist layer 1125 is a dose sensitive resist that can be chemically amplified. For additional embodiments, the resist layer 1125 may be positive tone, but may also be negative tone. For other embodiments, a top substrate (not shown) may be deposited (or laminated/disposed) on the resist layer 1125, where the top substrate may include, but is not limited to, a carrier substrate, a transparent substrate, a glass carrier, a PET, a PDMS, a dielectric layer, an organic transparent material, and/or any other transparent material.

Referring now to FIG. 11B, the resist layer 1125 may be exposed with a mask 1180 (e.g., a multi-tone mask with four regions) that has one or more intensity regions 1181-1183. For example, the one or more intensity regions 1181-1183 of the mask 1180 may include four intensity regions, such as a dark region (shown as dark blocks on the mask 1180), a light region 1181, a first gray region 1182, and a second gray region 1183, where for example the second gray region 1183 may be darker (and thus allows less light exposure) than the first gray region 1182. Accordingly, exposing light through mask 1180 adequately transfers images onto resist layer 1125 to produce one or more dose levels shown as 1125a-c. Each of the dose levels 125a-c has an individual development-time requirement based on the level of exposure.

After the simultaneous, selective exposure of the mask 1180 on the resist layer 1125, the resist layer 1125 is now imprinted with a first region 1125a that has a highest dose and a faster/shorter development time, a second region 1125b that has a medium dose and a slower development time, and a third region 1125c that has a lowest dose and a slowest development time. Note that the unexposed regions of the resist layer are labelled 1125, e.g., the unexposed regions are on opposite ends/edges of the resist layer 1125 as shown in one embodiment.

For one embodiment, the first region 1125a is printed to have a dose region that vertically extends through the resist layer 1125 and the PID layer 1115 to the top surface of the conductive layer 1130. For example, since the selected PID layer 1115 can only be patterned above a specified dose, the exposure dose of the first region 1125a (i.e., the high dose region) may need to be above a minimum dose to pattern both the first region of 1125a of the resist layer 1125 and the PID layer 115 simultaneously. Meanwhile, the second and third dose regions 1125b-c may be below the minimum exposure dose so that the underlining PID layer 1115 is not affected at those respective regions.

Figure 11C:
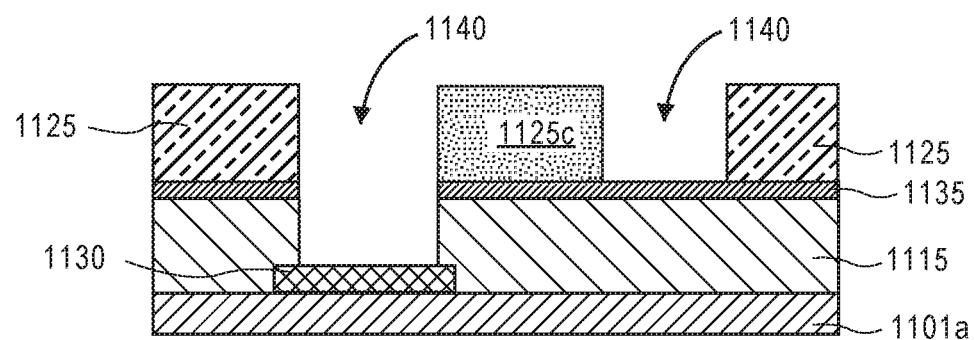

Referring now to FIG. 11C, for one embodiment, a first develop step removes only the resist region exposed with the highest and medium doses from the resist layer 1125 and the PID layer 1115. As such, after the first development on the resist layer 1125 and the PID layer 1115, the first region 1125a and the second dose region 1125b are simultaneously developed from the resist layer 1125 and the PID layer 1115, where the resist layer 1125 and the PID layer 1115 are thus patterned to provide one or more via openings 1140 to expose a portion of the seed layer 1135 for the formation of a ZM2VS via (e.g., ZM2VS via 1112 as shown in FIG. 11D) and the top surface of the conductive layer 1130 for the formation of a ZM2VS via (e.g., ZM2VS via 1111 as shown in FIG. 11D).

According to one embodiment, after the first development step, the first exposed region of the resist region 1125 and PID layer 1115 is developed to provide a via opening 1140 for a bottom via that exposes the top surface of the conductive layer 1130, while the second exposed region of the resist layer 1125 is developed to provide a via opening 1140 for a top via that exposes the portion of the seed layer 1135. Note that the first develop step may be implemented selectively in one or more development steps, as desired, to expose and develop the dose regions of the corresponding via openings 1140.

For alternative embodiments, the substrate 1101a may be laminated and disposed below the PID layer 1115—omitting the conductive layer. As such, the first region 1125a may extend vertically through the resist layer 1125, the seed layer 1135, and the PID layer 1115 onto the substrate 1101a (rather than onto the top surface of the conductive layer). Thereafter, the substrate 1101a may be removed, and then the stacked package layer of the resist layer 1125, the seed layer 1135, and the PID layer 1115 may be laminated (or deposited) on a carrier substrate (not shown) (e.g., although FIGS. 11A-11I may illustrate the final stacked package layer as being laminated post Pd⁰ seed etch, in alternative embodiments, the stack may be laminated onto one or more various substrates). For example, the carrier substrate may be a motherboard or a PCB.

Figure 11D:
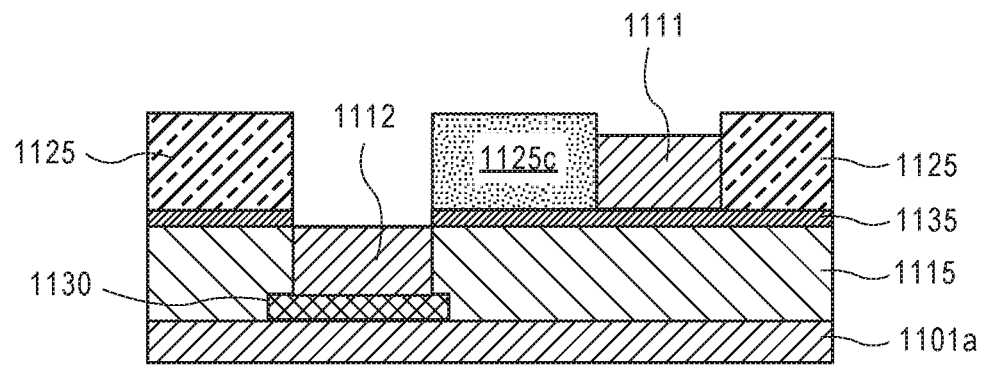
Figure 11E:
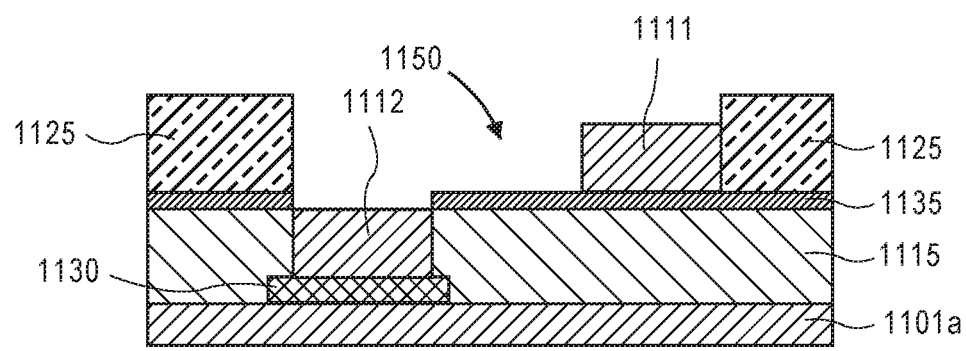

Accordingly, once the dose regions are developed for the via openings (as shown in FIG. 11D), the conductive material used to form the bottom via (as shown in FIG. 11E) may be deposited directly on the carrier substrate (rather than on the conductive layer), thus coupling the bottom ZM2VS via to the carrier substrate. Note that these alternative embodiments can be potentially applied to both a positive-tone and/or a negative tone resist/metal seed/PID stack, as long as the underlining PID is able to be selectively triggered through dose, wavelength, or other means. For example, a positive-tone resist/metal seed/PID stack could be design so that the PID is only exposed when a minimum dose is achieve, hence the medium or low dose exposure regions would not affect the PID. Likewise, the opposite may be applied for a negative tone resist/metal seed/PID stack, where the PID may be triggered under specified conditions, in this scenario the PID layer would be more sensitive than the top resist layer.

For alternative embodiments, a second seed layer (not shown) may be deposited on both of the via openings 1140. For example, the second seed layer is deposited on the exposed top surface of the conductive layer 1130 and the exposed portion of the seed layer 1135. According to this one embodiment, the second seed layer is a Pd seed layer and/or any other catalytic metals/materials. Accordingly, a conductive material (e.g., Cu or the like) is deposited on the via openings 1040 and above the second seed layers to form one or more ZM2VS vias. It should be noted that a second seed layer may not be needed to electrolessly/electrolytically plate metal simultaneously and directly on the conductive layers 1030 and 1035.

Referring back to FIG. 11D, a conductive material (e.g., Cu or the like) is deposited (or electrolessly/electrolytically grown) on the via openings 1140 to form one or more ZM2VS vias 1111 and 1112 through an electrochemical reaction. For one embodiment, the ZM2VS vias 1111-1112 may be formed/plated with e-less plating process. Accordingly, the ZM2VS via 1111 may be electrically coupled to the seed layer 1135, and the ZM2VS 1112 may be electrically coupled to the conductive layer 1130. Note that the top surface of the bottom via 1112 may be deposited above and/or below the seed layer 1135 (or on the same level/layer as the seed layer 1135).

Figure 11F:
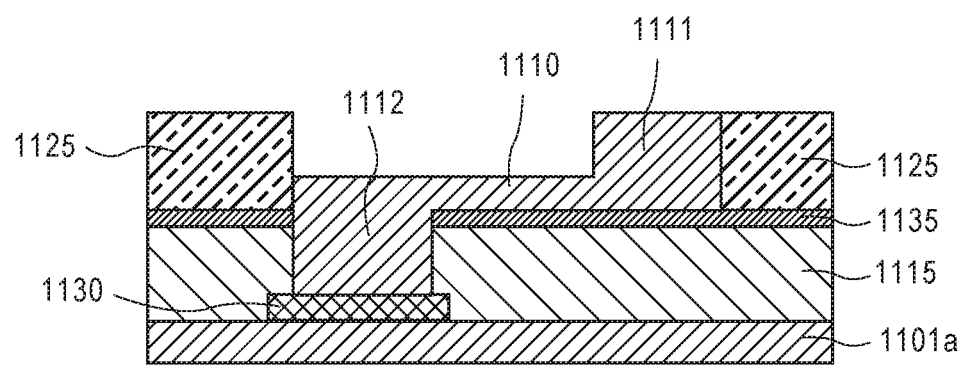

Referring now to FIG. 11E, a second develop step removes the resist region exposed with the lowest dose from the resist layer 1125. As such, after the second development on the resist layer 1125, the third region 1125c is removed from the resist layer 1125, and thus the resist layer 1125 is patterned to provide a line opening 1150 to expose a portion of the seed layer 1135 for the formation of a ZM2VS line/trace (e.g., ZM2VS line 1110 as shown in FIG. 11F). For example, after the e-less plating step of the ZM2VS vias 1111-1112 (or the combination of e-less and electrolytic plating step), the third region 1125c is developed away (i.e., this resist region has the longest development time) to expose the ZM2VS vias 1111-1112 and the seed layer 1135 for the formation of the ZM2VS line.

Referring now to FIG. 11F, the conductive material is deposited above and around the line opening 1150, the seed layer 1135, and the ZM2VS vias 1111-1112 to form the ZM2VS line 1110. After depositing the conductive material, the ZM2VS top via 1111 is now finalized and the ZM2VS line 1110 is now formed above the exposed seed layer 1135. For one embodiment, the ZM2VS line 1110 may be formed using the e-less plating process. Note that the top via 1111 (or the bottom via) may have a slanted edge or a similar tapered shape (not shown) coupled to the line 1110.

Figure 11G:
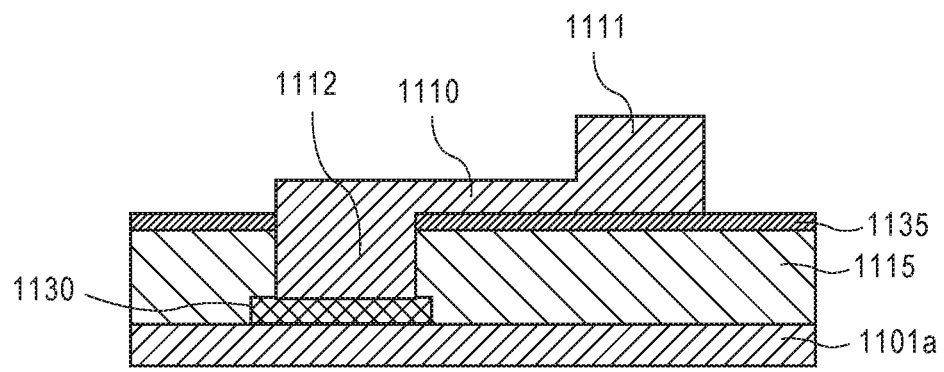
Figure 11H:
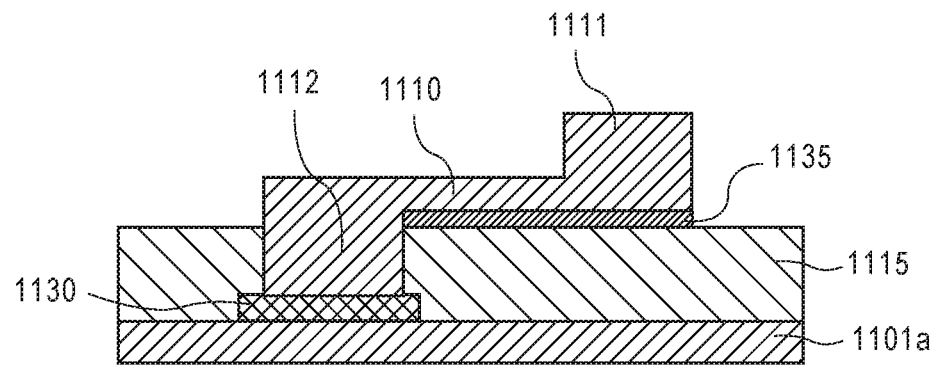

As shown in FIG. 11G, the resist layer 1125 is stripped, and accordingly the remaining portions of the seed layer 1135 are removed, as shown in FIG. 11H. According to one embodiment, the seed layer 1135 may be removed with a seed etching process. For one embodiment, the ZM2VS line/vias 1110-1112 may be formed prior to the formation of a second dielectric layer (not shown) which may be deposited above the ZM2VS line/vias 1110-1112.

Figure 11I:
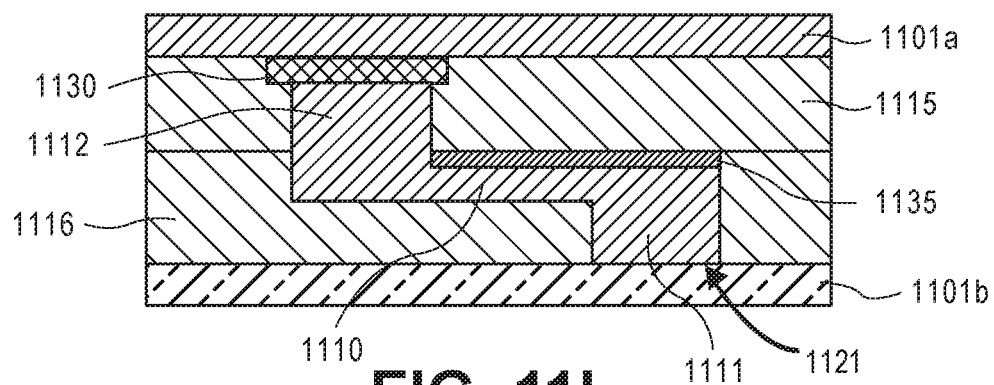

Referring now to FIG. 11I, a second dielectric layer 1116 may be deposited over the exposed ZM2VS vias 1111-1112 and ZM2VS conductive trace 1110. For the additional embodiments, when the second dielectric layer 1116 is formed above the ZM2VS via 1111, a via reveal process (or a controlled etching process) may be used to expose a top surface 1121 of the via 1111. For another embodiment, the package layer shown with FIG. 11I may be transferred onto a second substrate 1101b, where the exposed top surface 1121 of the ZM2VS via 1111 is electrically coupled to the second substrate 1101b. For example, the second substrate 1101b may include one or more various substrates that may be deposited (or attached/disposed) via lamination or other known methods based on the desired packaging design. For example, the second substrate 1101b may include patterned BFs, silicon, fabric, PCBs, flexible electronics, and any other desired substrate. Although, not shown here, 1101a can be removed post-transferring onto a desired substrate, such that further processing (i.e., patterning, soldering, chip attach, etc.) can ensue on 1130 metal pads and 1115 PID film. Thus, this process can be processed on any substrate or pre-patterned electronics.

Some of the advantages of the process flow of FIGS. 11A-11I is that a single step exposure and patterning process is illustrated that combines a dose sensitive patternable resist (or PR layer), a metal seed, a dielectric layer, and a transparent carrier to build a via-trace-via with zero-misalignment between line and vias. As such, the illustrated process flow may eliminate litho tool-to-tool misalignment and further simplify overall litho process. In addition, the process improves overall cost-efficiency by achieving zero-misalignment to via stack. Likewise, the process flow enables incorporation into a number of packaging needs, including, but not limited to, increasing I/O density, improving redistribution layers, and incorporation into a variety of packaging designs.

Note that the zero-misalignment two via stack formed with the process flow of FIGS. 11A-11I may include fewer or additional steps and/or packaging components based on the desired packaging design.

Figure 12:
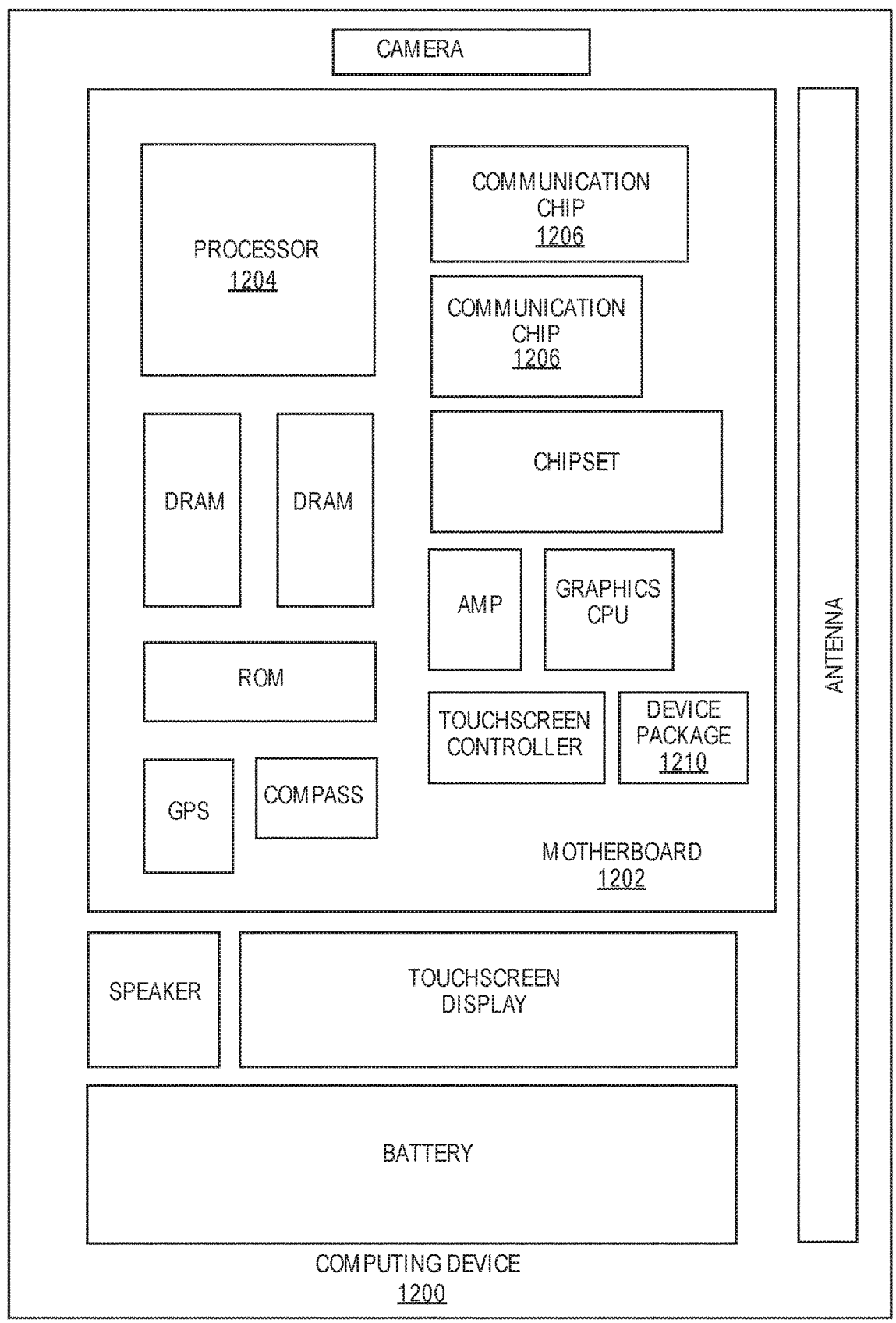
FIG. 12 is a schematic block diagram illustrating a computer system that utilizes a device package with conductive trace with zero-misaligned vias, according to one embodiment.

FIG. 12 is a schematic block diagram illustrating a computer system that utilizes a device package with conductive traces with zero-misaligned transmission vias, as described herein. FIG. 12 illustrates an example of computing device 1200. Computing device 1200 houses motherboard 1202. Motherboard 1202 may include a number of components, including but not limited to processor 1204, device package 1210, and at least one communication chip 1206. Processor 1204 is physically and electrically coupled to motherboard 1202. For some embodiments, at least one communication chip 1206 is also physically and electrically coupled to motherboard 1202. For other embodiments, at least one communication chip 1206 is part of processor 1204.

Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 1206 enables wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

Processor 1204 of computing device 1200 includes an integrated circuit die packaged within processor 1204. Device package 1210 may be, but is not limited to, a packaging substrate and/or a printed circuit board. Device package 1210 may include one or more ZM2VS lines/vias (as illustrated in FIGS. 1-11) of the computing device 1200.

Note that device package 1210 may be a single component, a subset of components, and/or an entire system, as the ZM2VS lines/vias may be limited to device package 1210 and/or any other component that requires ZM2VS in the computing device 1200.

For some embodiments, the integrated circuit die may be packaged with one or more devices on device package 1210 that include a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 1206 also includes an integrated circuit die packaged within the communication chip 1206. For some embodiments, the integrated circuit die of the communication chip may be packaged with one or more devices on the device package 1210, as described herein.

The following examples pertain to further embodiments. The various features of the different embodiments may be variously combined with some features included and others excluded to suit a variety of different applications.

The following examples pertain to further embodiments:

Example 1 is a device package, comprising a dielectric on a conductive pad and a first via on a top surface of the conductive pad. The first via extends through the dielectric; a conductive trace on the dielectric; and a second via on the dielectric. The conductive trace connects to the first via and the second via, wherein the second via connects to an edge of the conductive trace that is opposite from the first via.

In example 2, the subject matter of example 1 can optionally include prior to the formation of the conductive trace, the first via, and the second via, further comprising a seed on the dielectric. The seed electrically couples to the conductive trace and a first seed on the top surface of the conductive pad. The first via is on the first seed and a second seed on a top surface of the first via, the second seed on one or more surfaces of the second via. The conductive trace is on the second seed disposed on both the first and second vias. The conductive trace connects to the first via and the second via. The second via connects to an edge of the conductive trace that is opposite from the first via.

In example 3, the subject matter of any of examples 1-2 can optionally include the conductive trace electrically coupling to the first via and the second via.

In example 4, the subject matter of any of examples 1-3 can optionally include further comprising a second dielectric on the dielectric, the conductive trace, and the first and second vias. The second dielectric exposes a top surface of the second via.

In example 5, the subject matter of any of examples 1-4 can optionally include the dielectric which includes a photoimageable dielectric (PID) film. The PID film includes at least one of a positive-tone PID film and a negative-tone PID film. The negative-tone PID film has a low-dose sensitivity, and the positive-tone PID film has a high-dose sensitivity.

In example 6, the subject matter of any of examples 1-5 can optionally include prior to the formation of the conductive trace, the first via, and the second via, further comprising a selective resist on the seed. The selective resist includes at least one of a positive-tone dry film resist material, a negative-tone dry film resist material, a negative-on-negative tone dry resists material, and a positive-on-positive tone dry resists material; and a mask with one or more intensity regions. The mask prints one or more dose regions on the selective resist based on the one or more intensity regions of the mask.

In example 7, the subject matter of any of examples 1-6 can optionally include one or more dose regions on the selective resist having one or more different development times that pattern the selective resist for the conductive trace, the first via, and the second via.

In example 8, the subject matter of any of examples 1-7 can optionally include one or more different development times of the selective resist including at least one of a first development time on a first dose region, a second development time on a second dose region, and a third development time on a third dose region.

In example 9, the subject matter of any of examples 1-8 can optionally include the first dose region and the second dose region are developed simultaneously. The first dose region is patterned to form the first via, the second dose region is patterned to form the second via, and the third dose region is patterned to form the conductive trace.

In example 10, the subject matter of any of examples 1-9 can optionally include that the conductive trace, the first via, and the second via are electrolessly plated.

In example 11, the subject matter of any of examples 1-10 can optionally include the conductive pad is on at least one of a substrate and a transparent substrate. The substrate includes a package, a printed circuit board (PCB), and a motherboard.

In example 12, the subject matter of any of examples 1-11 can optionally include the conductive trace having a line density that is substantially equal to a line density of the first via and a line density of the second via.

In example 13, the subject matter of any of examples 1-12 can optionally include the seed layer as an electroless metal seed layer.

In example 14, the subject matter of any of examples 1-13 can optionally include the conductive pad which includes at least one of an electroless metal seed layer and an electrolytic metal seed layer.

In example 15, the subject matter of any of examples 1-14 can optionally include the first via directly disposed on the substrate without the conductive pad.

In example 16, the subject matter of any of examples 1-15 can optionally include the conductive pad on the transparent substrate transferred and electrically coupled to a second substrate.

Example 17 is a device package, comprising a dielectric on a conductive pad; a seed on the dielectric; a first seed on a top surface of the conductive pad; and a first via on the first seed. The first via extends through the dielectric; a second via on the seed; a second seed on a top surface of the first via, the second seed on one or more surfaces of the second via; and a conductive trace on the seed, and the conductive trace on the second seed on the first and second vias. The conductive trace connects to the first via and the second via. The second via connects to an edge of the conductive trace that is opposite from the first via.

In example 18, the subject matter of example 17 can optionally include the conductive trace electrically coupling to the seed and the second seed.

In example 19, the subject matter of any of examples 17-18 can optionally include prior to the formation of the conductive trace, the first via, and the second via, further comprising a first selective resist and a second selective resist on the seed. The second selective resist is on the first selective resist. The first and second selective resist include same dry resist materials. The same dry resist materials include at least one of negative-tone dry resist materials, positive-tone dry resist materials, negative-on-negative tone dry resist materials, and positive-on-positive tone dry resist materials; and a mask with one or more intensity regions. The mask prints one or more dose regions on the first and second selective resists based on the one or more intensity regions of the mask.

In example 20, the subject matter of any of examples 17-19 can optionally include the stacked first and second selective resists are patterned to form one or more openings on the seed. A third resist is disposed on the one or more openings and the second selective resist.

In example 21, the subject matter of any of examples 17-20 can optionally include the second selective resist and the third resist are removed and patterned to form one or more via openings for the first and second vias.

In example 22, the subject matter of any of examples 17-21 can optionally include the conductive trace electrically coupling to the first via and the second via.

In example 23, the subject matter of any of examples 17-22 can optionally include further comprising a second dielectric on the dielectric, the conductive trace, and the first and second vias. The second dielectric exposes a top surface of the second via.

In example 24, the subject matter of any of examples 17-23 can optionally include the dielectric which includes a photoimageable dielectric (PID) film. The PID film includes at least one of a positive-tone PID film and a negative-tone PID film. The negative-tone PID film has a low-dose sensitivity, and the positive-tone PID film has a high-dose sensitivity.

In example 25, the subject matter of any of examples 17-24 can optionally include one or more dose regions on the first and second selective resists which have one or more different development times that pattern the first and second selective resists for the conductive trace, the first via, and the second via.

In example 26, the subject matter of any of examples 17-25 can optionally include the conductive trace, the first via, and the second via electrolessly plated.

In example 27, the subject matter of any of examples 17-26 can optionally include the conductive pad is on at least one of a substrate and a transparent substrate. The substrate includes a package, a PCB, and a motherboard.

In example 28, the subject matter of any of examples 17-27 can optionally include the conductive trace having a line density that is substantially equal to a line density of the first via and a line density of the second via.

In example 29, the subject matter of any of examples 17-28 can optionally include the seed layer as an electroless metal seed layer.

In example 30, the subject matter of any of examples 17-29 can optionally include the conductive pad which includes at least one of an electroless metal seed layer and an electrolytic metal seed layer.

In example 31, the subject matter of any of examples 17-30 can optionally include the first via directly disposed on the substrate without the conductive pad.

In example 32, the subject matter of any of examples 17-31 can optionally include the conductive pad on the transparent substrate is transferred and electrically coupled to a second substrate.

Example 33 is a method of forming a device package, comprising disposing a dielectric on a conductive pad; and disposing a first via on a top surface of the conductive pad. The first via extends through the dielectric; disposing a conductive trace on the dielectric; and disposing a second via on the dielectric. The conductive trace connects to the first via and the second via, wherein the second via connects to an edge of the conductive trace that is opposite from the first via.

In example 34, the subject matter of example 33 can optionally include prior to disposing the conductive trace, the first via, and the second via, further comprising disposing a seed on the dielectric. The seed electrically couples to the conductive trace; and disposing a first seed on the top surface of the conductive pad. The first via is on the first seed; and disposing a second seed on a top surface of the first via, and the second seed on one or more surfaces of the second via. The conductive trace is on the second seed disposed on both the first and second vias. The conductive trace connects to the first via and the second via. The second via connects to an edge of the conductive trace that is opposite from the first via.

In example 35, the subject matter of any of examples 33-34 can optionally include the conductive trace electrically couples to the first via and the second via.

In example 36, the subject matter of any of examples 33-35 can optionally include further comprising a second dielectric on the dielectric, the conductive trace, and the first and second vias. The second dielectric exposes a top surface of the second via.

In example 37, the subject matter of any of examples 33-36 can optionally include the dielectric which includes a PID film. The PID film includes at least one of a positive-tone PID film and a negative-tone PID film. The negative-tone PID film has a low-dose sensitivity, and the positive-tone PID film has a high-dose sensitivity.

In example 38, the subject matter of any of examples 33-37 can optionally include prior to disposing the conductive trace, the first via, and the second via, and further comprising disposing a selective resist on the seed. The selective resist includes at least one of a positive-tone dry film resist material, a negative-tone dry film resist material, a negative-on-negative tone dry resists material, and a positive-on-positive tone dry resists material; and applying a mask with one or more intensity regions on the selective resist. The mask prints one or more dose regions on the selective resist based on the one or more intensity regions of the mask.

In example 39, the subject matter of any of examples 33-37 can optionally include one or more dose regions on the selective resist have one or more different development times that pattern the selective resist for the conductive trace, the first via, and the second via.

In example 40, the subject matter of any of examples 33-39 can optionally include one or more different development times of the selective resist including at least one of a first development time on a first dose region, a second development time on a second dose region, and a third development time on a third dose region.

In example 41, the subject matter of any of examples 33-40 can optionally include the first dose region and the second dose region are developed simultaneously. The first dose region is patterned to form the first via, the second dose region is patterned to form the second via, and the third dose region is patterned to form the conductive trace.

In example 42, the subject matter of any of examples 33-41 can optionally include the conductive trace, the first via, and the second via are electrolessly plated.

In example 43, the subject matter of any of examples 33-42 can optionally include the conductive pad is on at least one of a substrate and a transparent substrate. The substrate includes a package, a PCB, and a motherboard.

In example 44, the subject matter of any of examples 33-43 can optionally include the conductive trace having a line density that is substantially equal to a line density of the first via and a line density of the second via.

In example 45, the subject matter of any of examples 33-44 can optionally include the seed layer as an electroless metal seed layer.

In example 46, the subject matter of any of examples 33-45 can optionally include the conductive pad which includes at least one of an electroless metal seed layer and an electrolytic metal seed layer.

In example 47, the subject matter of any of examples 33-46 can optionally include the first via as directly disposed on the substrate without the conductive pad.

In example 48, the subject matter of any of examples 33-47 can optionally include the conductive pad on the transparent substrate is transferred and electrically coupled to a second substrate.

Example 49 is a device package, comprising a dielectric on a conductive pad and a first via on a top surface of the conductive pad. The first via extends through the dielectric; a conductive trace on the dielectric; and a second via on the dielectric. The conductive trace connects to the first via and the second via. The second via connects to an edge of the conductive trace that is opposite from the first via; and a die on a first-level interconnect (FLI) pad. The FLI pad connects to the second via; and an interconnect package layer on a second-level interconnect (SLI) pad. The SLI pad connects to the first via.

In example 50, the subject matter of example 49 can optionally include further comprising one or more conductive traces having one or more first vias and one or more second vias, and the interconnect package layer having one or more interconnect package layers stacked on each other. The one or more package layers connect to the one or more conductive traces, first vias, and second vias.

In example 51, the subject matter of any of examples 49-50 can optionally include prior to the formation of the conductive trace, the first via, and the second via, further comprising a seed on the dielectric. The seed electrically couples to the conductive trace; a first seed on the top surface of the conductive pad, wherein the first via is on the first seed; and a second seed on a top surface of the first via, and the second seed on one or more surfaces of the second via. The conductive trace is on the second seed disposed on both the first and second vias. The conductive trace connects to the first via and the second via. The second via connects to an edge of the conductive trace that is opposite from the first via.

In example 52, the subject matter of any of examples 49-51 can optionally include the conductive trace electrically coupling to the first via and the second via.

In example 53, the subject matter of any of examples 49-52 can optionally include further comprising a second dielectric on the dielectric, the conductive trace, and the first and second vias. The second dielectric exposes a top surface of the second via that is electrically coupled to the FLI pad.

In example 54, the subject matter of any of examples 49-53 can optionally include the dielectric which includes a PID film. The PID film includes at least one of a positive-tone PID film and a negative-tone PID film. The negative-tone PID film has a low-dose sensitivity, and the positive-tone PID film has a high-dose sensitivity.

In example 55, the subject matter of any of examples 49-54 can optionally include prior to the formation of the conductive trace, the first via, and the second via, further comprising a selective resist on the seed. The selective resist includes at least one of a positive-tone dry film resist material, a negative-tone dry film resist material, a negative-on-negative tone dry resists material, and a positive-on-positive tone dry resists material; and a mask with one or more intensity regions. The mask prints one or more dose regions on the selective resist based on the one or more intensity regions of the mask.

In example 56, the subject matter of any of examples 49-55 can optionally include the one or more dose regions on the selective resist having one or more different development times that pattern the selective resist for the conductive trace, the first via, and the second via.

In example 57, the subject matter of any of examples 49-56 can optionally include the one or more different development times of the selective resist which include at least one of a first development time on a first dose region, a second development time on a second dose region, and a third development time on a third dose region.

In example 58, the subject matter of any of examples 49-57 can optionally include the first dose region and the second dose region are developed simultaneously. The first dose region is patterned to form the first via, the second dose region is patterned to form the second via, and the third dose region is patterned to form the conductive trace.

In example 59, the subject matter of any of examples 49-58 can optionally include the conductive trace, the first via, and the second via electrolessly plated.

In example 60, the subject matter of any of examples 49-59 can optionally include the conductive pad is on at least one of a substrate and a transparent substrate. The substrate includes a package, a PCB, and a motherboard.

In example 61, the subject matter of any of examples 49-60 can optionally include the conductive trace having a line density that is substantially equal to a line density of the first via and a line density of the second via.

In example 62, the subject matter of any of examples 49-61 can optionally include the seed layer as an electroless metal seed layer.

In example 63, the subject matter of any of examples 49-62 can optionally include the conductive pad which includes at least one of an electroless metal seed layer and an electrolytic metal seed layer.

In example 64, the subject matter of any of examples 49-63 can optionally include the first via directly disposed on the substrate without the conductive pad.

In example 65, the subject matter of any of examples 49-64 can optionally include the conductive pad on the transparent substrate is transferred and electrically coupled to a second substrate.

In the foregoing specification, embodiments have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A device package, comprising:
   a dielectric on a conductive pad;
   a first via on a top surface of the conductive pad, wherein the first via extends through the dielectric;
   a conductive trace over the dielectric;
   a second via on the dielectric, the second via spaced apart from the first via along a lateral direction, wherein the conductive trace connects to the first via and the second via along the lateral direction, wherein the second via connects to an edge of the conductive trace that is opposite from the first via; and
   a second dielectric on the dielectric, on the conductive trace, and on the first via, wherein the second dielectric exposes a top surface of the second via, and wherein the second dielectric has an uppermost surface co-planar with the top surface of the second via.

2. The device package of claim 1, further comprising: a seed on the dielectric, wherein the seed electrically couples to the conductive trace; a first seed on the top surface of the conductive pad, wherein the first via is on the first seed; and a second seed on a top surface of the first via, the second seed on one or more surfaces of the second via, wherein the conductive trace is on the second seed disposed on both the first and second vias, wherein the conductive trace connects to the first via and the second via, wherein the second via connects to an edge of the conductive trace that is opposite from the first via.

3. The device package of claim 2, further comprising:
   a selective resist on the seed, wherein the selective resist includes at least one of a positive-tone dry film resist material, a negative-tone dry film resist material, a negative-on-negative tone dry resists material, and a positive-on-positive tone dry resists material; and
   a mask with one or more intensity regions, wherein the mask prints one or more dose regions on the selective resist based on the one or more intensity regions of the mask.

4. The device package of claim 3, wherein the one or more dose regions on the selective resist have one or more different development times that pattern the selective resist for the conductive trace, the first via, and the second via.

5. The device package of claim 4, wherein the one or more different development times of the selective resist include at least one of a first development time on a first dose region, a second development time on a second dose region, and a third development time on a third dose region.

6. The device package of claim 5, wherein the first dose region and the second dose region are developed simultaneously, and wherein the first dose region is patterned to form the first via, the second dose region is patterned to form the second via, and the third dose region is patterned to form the conductive trace.

7. The device package of claim 2, wherein the seed layer is an electroless metal seed layer.

8. The device package of claim 1, wherein the conductive trace electrically couples to the first via and the second via.

9. The device package of claim 1, wherein the dielectric includes a photoimageable dielectric (PID) film, wherein the PID film includes at least one of a positive-tone PID film and a negative-tone PID film, and wherein the negative-tone PID film has a low-dose sensitivity, and the positive-tone PID film has a high-dose sensitivity.

10. The device package of claim 1, wherein the conductive trace, the first via, and the second via are electrolessly plated.

11. The device package of claim 1, wherein the conductive pad is on at least one of a substrate and a transparent substrate, wherein the substrate includes a package, a printed circuit board (PCB), and a motherboard.

12. The device package of claim 11, wherein the conductive pad on the transparent substrate is transferred and electrically coupled to a second substrate.

13. The device package of claim 1, wherein the conductive trace has a line density that is substantially equal to a line density of the first via and a line density of the second via.

14. The device package of claim 1, wherein the conductive pad includes at least one of an electroless metal seed layer and an electrolytic metal seed layer.

15. A device package, comprising:
a dielectric on a conductive pad;
a seed on the dielectric;
a first seed on a top surface of the conductive pad;
a first via on the first seed, wherein the first via extends through the dielectric;
a second via on the seed, the second via spaced apart from the first via along a lateral direction;
a second seed on a top surface of the first via, the second seed on one or more surfaces of the second via;
a conductive trace on the seed and over the dielectric, the conductive trace on the second seed on the first and second vias, wherein the conductive trace connects to the first via and the second via along the lateral direction, wherein the second via connects to an edge of the conductive trace that is opposite from the first via; and
a second dielectric on the dielectric, on the conductive trace, and on the first via, wherein the second dielectric exposes a top surface of the second via, and wherein the second dielectric has an uppermost surface co-planar with the top surface of the second via.

16. The device package of claim 15, wherein the conductive trace electrically couples to the seed and the second seed.

17. The device package of claim 15, further comprising:
a first selective resist and a second selective resist on the seed, wherein the second selective resist is on the first selective resist, wherein the first and second selective resist include same dry resist materials, and wherein the same dry resist materials include at least one of negative-tone dry resist materials, positive-tone dry resist materials, negative-on-negative tone dry resist materials, and positive-on-positive tone dry resist materials; and
a mask with one or more intensity regions, wherein the mask prints one or more dose regions on the first and second selective resists based on the one or more intensity regions of the mask.

18. The device package of claim 17, wherein the stacked first and second selective resists are patterned to form one or more openings on the seed, and wherein a third resist is disposed on the one or more openings and the second selective resist.

19. The device package of claim 18, wherein the second selective resist and the third resist are removed and patterned to form one or more via openings for the first and second vias.

20. The device package of claim 18, wherein the one or more dose regions on the first and second selective resists have one or more different development times that pattern the first and second selective resists for the conductive trace, the first via, and the second via.

21. The device package of claim 15, wherein the conductive trace electrically couples to the first via and the second via.

22. The device package of claim 15, wherein the dielectric includes a photoimageable dielectric (PID) film, wherein the PID film includes at least one of a positive-tone PID film and a negative-tone PID film, and wherein the negative-tone PID film has a low-dose sensitivity, and the positive-tone PID film has a high-dose sensitivity.

* * * * *